(12) United States Patent
Katoh et al.

(10) Patent No.: US 8,531,869 B2
(45) Date of Patent: Sep. 10, 2013

(54) NONVOLATILE MEMORY DEVICE AND METHOD OF WRITING DATA TO NONVOLATILE MEMORY DEVICE

(71) Applicant: Panasonic Corporation, Osaka (JP)

(72) Inventors: Yoshikazu Katoh, Osaka (JP); Shunsaku Muraoka, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/774,816

(22) Filed: Feb. 22, 2013

(65) Prior Publication Data
US 2013/0208531 A1  Aug. 15, 2013

Related U.S. Application Data

(63) Continuation of application No. 13/056,925, filed as application No. PCT/JP2010/003264 on May 14, 2010, now Pat. No. 8,406,035.

(30) Foreign Application Priority Data

May 14, 2009  (JP) ................................. 2009-117976

(51) Int. Cl.
*G11C 11/00*  (2006.01)
(52) U.S. Cl.
USPC ................................... 365/148; 365/189.011
(58) Field of Classification Search
USPC .......................................... 365/148, 189.011
See application file for complete search history.

(56) References Cited

U.S. PATENT DOCUMENTS 7,508,695 B2   3/2009 Sugita
7,518,929 B2 *  4/2009 Fujisawa et al. ......... 365/185.22

(Continued)

FOREIGN PATENT DOCUMENTS

JP   2004-185756 A   7/2004
JP   2005-025914 A   1/2005

(Continued)

OTHER PUBLICATIONS

Tsutsumi Takashi et al., "Analytic delay Model Equations for CMOS Inverter Based on Velocity Saturation Effect," The Institute of Electronics Information and Communication Engineers, Technical Report of IEICE, VLD2003-136, pp. 1-5, 2004.

*Primary Examiner* — Son Dinh
*Assistant Examiner* — Nam Nguyen
(74) *Attorney, Agent, or Firm* — McDermott Will & Emery LLP

(57) ABSTRACT

A resistance variable layer changes: to a second resistance state in such a manner that its resistance value stops decreasing when an interelectrode voltage reaches a negative first voltage; to a first resistance state in such a manner that its resistance value starts increasing when the interelectrode voltage reaches a positive second voltage which is equal in absolute value to the first voltage; to the first resistance state in such a manner that the resistance variable layer flows an interelectrode current such that the interelectrode voltage is maintained at a third voltage higher than the second voltage, when the interelectrode voltage reaches the third voltage; and to the first resistance state in such a manner that its resistance value stops increasing when the interelectrode current reaches a first current in a state where the interelectrode voltage is not lower than the second voltage and lower than the third voltage.

11 Claims, 39 Drawing Sheets

(56) References Cited

U.S. PATENT DOCUMENTS

| | | |
|---|---|---|
| 2004/0114429 A1 | 6/2004 | Ehiro et al. |
| 2004/0264244 A1 | 12/2004 | Morimoto |
| 2005/0174854 A1 | 8/2005 | Tsushima et al. |
| 2006/0109316 A1 | 5/2006 | Nagao et al. |
| 2007/0165442 A1 | 7/2007 | Hosoi et al. |
| 2008/0123393 A1 | 5/2008 | Kinoshita |
| 2009/0283736 A1 | 11/2009 | Kanzawa et al. |

FOREIGN PATENT DOCUMENTS

| | | |
|---|---|---|
| JP | 2005-216387 A | 8/2005 |
| JP | 2006-114087 A | 4/2006 |
| JP | 2007-188603 A | 7/2007 |
| JP | 2010-009662 A | 1/2010 |
| WO | WO-2006/137111 A1 | 12/2006 |
| WO | WO-2008/149484 A1 | 12/2008 |

\* cited by examiner (a)

(b)

(c)

NONVOLATILE MEMORY DEVICE AND METHOD OF WRITING DATA TO NONVOLATILE MEMORY DEVICE

RELATED APPLICATIONS

This application is the Continuation of U.S. application Ser. No. 13/056,925, filed on Jan. 31, 2011, now U.S. Pat. No. 8,406,035, which is the U.S. National Phase under 35 U.S.C. §371 of International Application No. PCT/JP2010/003264, filed on May 14, 2010, which in turn claims the benefit of Japanese Application No. 2009-117976, filed on May 14, 2009, the disclosures of which Applications are incorporated by reference herein.

TECHNICAL FIELD

The present invention relates to a nonvolatile memory device and a method of writing data to the nonvolatile memory device. More particularly, the present invention relates to a nonvolatile memory device including a resistance variable element and a method of writing data to the nonvolatile memory device.

BACKGROUND ART

A nonvolatile memory device is widely used to be incorporated into portable hardware such as cellular phones and digital cameras and its use has spread at a high pace. In recent years, audio data and image data have been handled in many occasions and there have been strong demands for a nonvolatile memory device which has a larger capacity and is operative at a higher speed. Besides, in a field of the nonvolatile memory device for use with the portable hardware, a demand for lower electric power consumption has been increasing.

These days, a major nonvolatile memory device is a flash memory. The flash memory is configured to control electric charges accumulated on a floating gate to store data. It has been pointed out that since the flash memory has a structure for storing the electric charges on the floating gate in a high electric field, there is a limitation on reduction of its size and it is difficult to implement microfabrication required to achieve a larger capacity. In addition, the flash memory is required to erase specified blocks all at once for rewriting. Because of such characteristics, the flash memory requires a very long time for rewriting and has a limitation on achievement of a higher speed.

As a nonvolatile memory device in next generation which has a potential to solve these problems, there is a nonvolatile memory device including a resistance variable element configured to store data by changing its electric resistances. At present, MRAM (Magnetic RAM), PRAM (Phase-Change RAM), ReRAM (Resistive RAM), etc. have been proposed as nonvolatile memories using the resistance variable element.

Patent literature 1 discloses an exemplary control method of a bipolar ReRAM element including a perovskite structure oxide.

The bipolar ReRAM element refers to an element which changes to a high-resistance state in response to a voltage pulse with one of different polarities and changes to a low-resistance state in response to a voltage pulse with an opposite polarity. The ReRAM element refers to an element which is changeable reversibly at least between a first resistance state (high-resistance state, RH state or RH in a simple expression) and a second resistance state (low-resistance state, RL state or RL in a simple expression) in which a resistance value of the ReRAM element is lower than a resistance value of the ReRAM element in the first resistance state by application of electric stresses, and a nonvolatile memory configured to store data according to resistance values.

Hereinafter, the control method of the ReRAM element will be described with reference to the drawings.

FIGS. 36 to 38 show a control method of a memory cell disclosed in Patent literature 1. A memory cell 9 includes a resistance variable element 1 and a select transistor 2. One of two terminals of the resistance variable element 1 is electrically connected to one of two main terminals (drain or source) of the select transistor 2. The other main terminal (source or drain) of the select transistor 2 is electrically connected to a source line terminal 3 via a source line 6. The other terminal of the resistance variable element 1 is electrically connected to a bit line terminal 5 via a bit line 8. A gate of the select transistor 2 is electrically connected to a word line terminal 4 via a word line 7. In any of a case where data is written (when "1" is written, data "1" is allocated to RH (high-resistance state) of the ReRAM element), a case where data is erased (when "0" is written, data "0" is allocated to RL (low-resistance state) of the ReRAM element), and a case where data is read, a high-level threshold voltage (voltage for placing the transistor in an electrically conductive state) is applied to a word line terminal 4 of a selected memory cell, causing the select transistor 2 to be placed in an electrically conductive state.

FIG. 36 is a view showing an application state of a voltage pulse in a case where a write operation is performed in the memory cell of Patent literature 1. The source line 6 is set to 0 V (electrically grounded), a write pulse with a positive polarity and a predetermined write voltage amplitude is applied to the bit line 8, and desired data is written to the resistance variable element 1. When multi-valued data is written to the resistance variable element 1, the voltage amplitude of the write pulse is set to a level according to a value of data to be written. For example, in a case where four-valued data is written to one resistance variable element 1, one voltage amplitude is selected from among predetermined four voltage amplitudes determined according to respective values of write data and a write operation is performed. As the write pulse width, a proper width according to the element is selected. In other words, to change the resistance variable element 1 to a specified resistance state, there are one voltage amplitude level and one pulse width corresponding to the resistance state.

FIG. 37 is a view showing an application state of a voltage pulse in a case where an erase operation is performed in the memory cell of Patent literature 1. The bit line is set to 0V (electrically grounded), and an erase pulse with a positive polarity and a predetermined erase voltage amplitude is applied to the source line. By application of the erase pulse, the resistance variable element 1 is caused to have an electric resistance of a minimum value. Patent literature 1 discloses that by application of the erase pulse to a specified source line in a state where a plurality of bit lines are set to 0V, a plurality of memory cells connected to the plurality of bit lines and to the source line are erased all at once.

FIG. 38 is a view showing an application state of a voltage pulse in a case where a read operation is performed in the memory cell of Patent literature 1. When data stored in the resistance variable element 1 is read, the source line 6 is set to 0V (electrically grounded), a predetermined read voltage is applied to a selected bit line 8 by way of a read circuit. Upon application of the read voltage, a comparator and determiner circuit compares a level of the bit line 8 to a reference level for reading, and the stored data is read.

Patent literature 2 discloses a ReRAM configured to perform a unipolar operation in which the element is changeable to RH (high-resistance state) in response to a voltage Vb with one polarity and to RL (low-resistance state) in response to a voltage Va with the same polarity. It is recited that in particular, the unipolar ReRAM having a symmetric characteristic at positive and negative sides may be bipolar-drivable such that the element changes to the RL (low-resistance state) using Va with one polarity and changes to the RH (high-resistance state) using Vb with an opposite polarity. It is proposed that to change the resistance of the resistance variable element, a load resistor is connected in series with the resistance variable element, a resistance changing operation of the resistance variable element is stabilized by making a load resistance characteristic different between a case where the resistance variable element changes from RH to RL and a case where the resistance variable element changes from RL to RH as shown in FIG. 39. It is recited that, as conditions which are to be met by the respective load resistance characteristics, a resistance of a voltage-current characteristic of a load resistor (including a non-linear load such as a transistor) is set higher in the case where the element changes from RH to RL than in the case where the element changes from RL to RH, as shown in FIG. 39(A). Thereby, a current and a voltage at point T4 to which a current and a voltage at point Tb change are automatically lower than those at point Ta, and a current and a voltage at point T3 to which the current and the voltage at point Ta change are automatically lower than those at point Tb. Thus, a stable operation is implemented.

It should be noted that, to allow the unipolar ReRAM to be bipolar-drivable as described above, VB must be lower than VA in absolute value. On the other hand, a problem will not arise in an operation of a complete bipolar ReRAM, even if VB is higher than VA. Nonetheless, the bipolar ReRAM is favorably driven using the relation shown in FIG. 39, because it is necessary to change the element to RH with a current drivability for flowing a current more in amount than a current flowing just after the element has changed to RL.

CITATION LIST

Patent Literature

Patent literature 1: Japanese Laid-Open Patent Application Publication No. 2004-185756
Patent literature 2: Japanese Laid-Open Patent Application Publication No. 2007-188603

Non-Patent Literature

Non-patent literature 1: Tsutsumi Takashi, Akino Toshiro "Analytic delay model formula of CMOS inverter based on a velocity saturation effect" "Shingakugihou, Syadanhojin, Electronic information communication committee, TECHNICAL REPORT OF IEICE VLD2003-136 pp 1-5, 2004

SUMMARY OF INVENTION

Technical Problem

A primary object of the present invention is to provide higher stability and higher reliability of an operation in a nonvolatile memory device which devises a bipolar ReRAM than a conventional nonvolatile memory device.

Solution to Problem

The inventors intensively studied to improve stability and reliability of an operation in the nonvolatile memory device which devises the ReRAM. In the course of the study, the inventors found a problem that in the conventional driving method, when the ReRAM element changes from RL (low-resistance state) to RH (high-resistance state), the element shifts to a super-high resistance state in which, under an equal voltage, a resistance value of the element is by far higher than a resistance value of the element in desired RH (high-resistance state), and cannot be returned to RL (low-resistance state).

It is easily presumed that when data is stored according to changed resistance values, the first resistance state and the second resistance state are identifiable more easily if a difference between the resistance value corresponding to the first resistance state and the resistance value corresponding to the second resistance state is larger. In other words, as a changing magnitude of the resistance values is larger, the respective resistance values can be detected more easily, a margin for a variation among memory cells and design flexibility increase, and data misreading is suppressed. As a result, a highly reliable nonvolatile memory device is provided. This leads to a high yield of products in manufacturing processes in factories, and effectively reduces cost of the products.

Under the circumstances in which there exist the above mentioned demands, the inventors discovered that the above problem can possibly be solved by using a resistance variable element including oxygen-deficient tantalum oxide as a resistance variable layer. In addition, the inventors discovered that a resistance variable element including a resistance variable layer having a stacked structure of a first tantalum oxide layer with lower oxygen content and a second tantalum oxide layer with higher oxygen content stacked on the first tantalum oxide layer, has a capability of significantly improving a changing magnitude of resistance values which are read in response to a read voltage and a magnitude of the resistance value corresponding to the RH (high-resistance state) which is read in response to a read voltage, by devising the oxygen content and thickness of the second tantalum oxide layer.

However, if the driving method of the prior art is used, in which the load resistor is connected in series with the resistance variable element, and the resistance variable element is driven under the state in which the load resistance characteristic of the load resistor has a relatively soft current compliance when the resistance variable element changes from RL to RH (attains high-resistance state) than when the resistance variable element changes from RH to RL (attains low-resistance state), the resistance variable element shifts to a superhigh resistance state in which a resistance value of the resistance variable element is by far higher than a desired value corresponding to RH (high-resistance state), and cannot change to RL (low-resistance state) again (see Experiment example 2).

As a result of further study, the inventors discovered that such a phenomenon can be suppressed by properly setting a current compliance when the resistance variable element changes to the high-resistance state.

To achieve the above objective, a nonvolatile memory device of the present invention comprises; a series path including a resistance variable element and a load resistor connected in series with the resistance variable element; and an electric pulse application device configured to selectively apply to the series path either an electric pulse of a first application voltage with a first polarity or an electric pulse of a second application voltage with a second polarity which is different from the first polarity; the resistance variable element including: a first electrode; a second electrode; and a resistance variable layer provided between the first electrode and the second electrode; the resistance variable layer having a characteristic in which: when a voltage generated between the first electrode and the second electrode is an interelectrode voltage and a current flowing between the first electrode and the second electrode is an interelectrode current, the resistance variable layer changes from a first resistance state to a second resistance state in which a resistance value of the resistance variable layer is lower than a resistance value of the resistance variable layer in the first resistance state, in response to the electric pulse of the first application voltage which is applied from the electric pulse application device to the series path; the resistance variable layer changes from the second resistance state to the first resistance state, in response to the electric pulse of the second application voltage which is applied from the electric pulse application device to the series path; the resistance variable layer generates the interelectrode voltage with the first polarity based on the first application voltage which is applied from the electric pulse application device to the series path; the resistance variable layer generates the interelectrode voltage with the second polarity based on the second application voltage which is applied from the electric pulse application device to the series path; the resistance variable layer changes from the first resistance state to the second resistance state in such a manner that its resistance value stops decreasing when the interelectrode voltage decreases in absolute value and reaches a first voltage according to a resistance ratio relationship between the series path and the resistance variable element; the resistance variable layer changes from the second resistance state to the first resistance state in such a manner that: its resistance value starts increasing when the interelectrode voltage reaches a second voltage which is equal in absolute value to the first voltage and is different in polarity from the first voltage; the resistance variable layer flows the interelectrode current such that the interelectrode voltage is maintained at a third voltage when the interelectrode voltage increases in absolute value and reaches the third voltage according to the resistance ratio relationship between the series path and the resistance variable element, the third voltage being higher in absolute value than the second voltage and being identical in polarity to the second voltage; and its resistance value stops increasing when the interelectrode current reaches a first current value or lower in a state where the interelectrode voltage is not lower than the second voltage and lower than the third voltage; the load resistor having a characteristic in which when the electric pulse application device outputs the electric pulse of the second application voltage, a current flowing by applying to the load resistor a voltage obtained by subtracting the third voltage from the second application voltage, is not higher than the first current value.

In accordance with this configuration, it is possible to provide higher stability and reliability of the operation of the nonvolatile memory device including a bipolar ReRAM than the conventional nonvolatile memory device.

In the nonvolatile memory device, the load resistor may have a characteristic in which when the electric pulse application device outputs the electric pulse of the second application voltage, a current flowing by applying to the load resistor a voltage obtained by subtracting the second voltage from the second application voltage is not lower in absolute value than a current flowing by applying to the load resistor a voltage obtained by subtracting the first application voltage from the first voltage.

The nonvolatile memory device may further comprise a load resistance switch configured to switch a characteristic of the load resistor between a case where the electric pulse application device outputs the electric pulse of the first application voltage and a case where the electric pulse application device outputs the electric pulse of the second application voltage.

In the nonvolatile memory device, the load resistor may be a transistor including two main terminals and one control terminal; and the load resistance switch may be configured to switch a voltage applied to the control terminal to switch the characteristic of the load resistor.

In the nonvolatile memory device, the load resistor may include a transistor and a diode which are connected in parallel.

The nonvolatile memory device may comprise: a plurality of first wires formed to extend in parallel with each other in a first direction within a first plane; a plurality of second wires formed to extend in parallel with each other in a second direction within a second plane parallel to the first plane and three-dimensionally cross the first wires, respectively; and memory cells provided to respectively correspond to three-dimensional cross-points of the first wires and the second wires; each of the memory cells may include the series path; each of the first wires may be connected to the control terminal of the transistor included in associated one of the memory cells; and each of the second wires may be connected to one end of the series path included in associated one of the memory cells.

A nonvolatile memory device of the present invention comprises; a series path including the resistance variable element and a load resistor connected in series with the resistance variable element; and an electric pulse application device configured to selectively output either an electric pulse of a first application voltage with a first polarity, an electric pulse of a second application voltage with a second polarity which is different from the polarity of the first application voltage, or an electric pulse of a third application voltage with the second polarity which is different from the polarity of the first application voltage; the resistance variable element including: a first electrode; a second electrode; and a resistance variable layer provided between the first electrode and the second electrode; the resistance variable layer having a characteristic in which: when a voltage generated between the first electrode and the second electrode is an interelectrode voltage and a current flowing between the first electrode and the second electrode is an interelectrode current, the resistance variable layer changes from a first resistance state to a second resistance state in which a resistance value of the resistance variable layer is lower than a resistance value of the resistance variable layer in the first resistance state, in response to the electric pulse of the first application voltage which is applied from the electric pulse application device to the series path; the resistance variable layer changes from the second resistance state to a third resistance state in which a resistance value of the resistance variable layer is lower than the resistance value of the resistance variable layer in the first resistance state and is higher than the resistance value of the resistance variable layer in the second resistance state, in response to the electric pulse of the second application voltage which is applied from the electric pulse application device to the series path; the resistance variable layer changes from the third resistance state to the first resistance state, in response to the electric pulse of the third application voltage which is applied from the electric pulse application device to the series path; the resistance variable layer generates the interelectrode voltage with the first polarity, based on the first application voltage which is applied from the electric pulse application device to the series path; the resistance variable layer generates the interelectrode voltage with the second polarity, based on the second application voltage which is applied from the electric pulse application device to the series path; the resistance variable layer changes from the first resistance state to the second resistance state in such a manner that its resistance value stops decreasing when the interelectrode voltage decreases in absolute value and reaches a first voltage according to a resistance ratio relationship between the series path and the resistance variable element; the resistance variable layer changes from the second resistance state to the third resistance state in such a manner that its resistance value starts increasing when the interelectrode voltage reaches a second voltage which is equal in absolute value to the first voltage and is different in polarity from the first voltage; the resistance variable layer changes from the third resistance state to the first resistance state in such a manner that the resistance variable layer flows the interelectrode current such that the interelectrode voltage is maintained at a third voltage when the interelectrode voltage increases in absolute value and reaches the third voltage according to the resistance ratio relationship between the series path and the resistance variable element, the third voltage being higher in absolute value than the second voltage and being identical in polarity to the second voltage; and the resistance variable layer changes from the second resistance state to the third resistance state in such a manner that its resistance value stops increasing when the interelectrode current reaches a first current value or lower in a state where the interelectrode voltage is not lower than the second voltage and lower than the third voltage; the load resistor having a characteristic in which when the electric pulse application device outputs the electric pulse of the second application voltage, a current flowing by applying to the load resistor a voltage obtained by subtracting the second voltage from the second application voltage is not lower than a current flowing by applying to the load resistor a voltage obtained by subtracting the first voltage from the first application voltage; and when the electric pulse application device outputs the electric pulse of the third application voltage, a current flowing by applying to the load resistor a voltage obtained by subtracting the third voltage from the third application voltage, is not higher than the first current value.

The nonvolatile memory device may further comprise a load resistance switch configured to switch a characteristic of the load resistor among a case where the electric pulse application device outputs the electric pulse of the first application voltage, a case where the electric pulse application device outputs the electric pulse of the second application voltage, and a case where the electric pulse application device outputs the electric pulse of the third application voltage.

In the nonvolatile memory device, the load resistor may be a transistor including two main terminals and one control terminal; and the load resistance switch may be configured to switch a voltage applied to the control terminal to switch the characteristic of the load resistor.

In the nonvolatile memory device, the resistance variable layer may be a resistance variable element including at least a layered structure in which a first tantalum-containing layer having a composition expressed as $TaO_x$ ($0<x<2.5$) and a second tantalum-containing layer having a composition expressed as $TaO_y$ ($x<y<2.5$) are stacked together.

In the nonvolatile memory device, wherein the $TaO_x$ may satisfy $0.8 \leq x \leq 1.9$, the $TaO_y$ may satisfy $2.1 \leq y < 2.5$, and the second tantalum-containing layer may have a thickness which is not less than 1 nm and not more than 8 nm.

A method of writing data to a nonvolatile memory device of the present invention, the nonvolatile memory device including: a series path including a resistance variable element and a load resistor connected in series with the resistance variable element; the resistance variable element including: a first electrode; a second electrode; and a resistance variable layer provided between the first electrode and the second electrode; the resistance variable layer having a characteristic in which: when a voltage generated between the first electrode and the second electrode is an interelectrode voltage and a current flowing between the first electrode and the second electrode is an interelectrode current, the resistance variable layer changes from a first resistance state to a second resistance state in which a resistance value of the resistance variable layer is lower than a resistance value of the resistance variable layer in the first resistance state, in response to an electric pulse of a first application voltage with a first polarity which is applied to the series path; the resistance variable layer changes from the second resistance state to the first resistance state, in response to an electric pulse of a second application voltage with a second polarity different from the polarity of the first application voltage, the second application voltage being applied to the series path; the resistance variable layer generates the interelectrode voltage with the first polarity based on the first application voltage which is applied to the series path; the resistance variable layer generates the interelectrode voltage with the second polarity based on the second application voltage which is applied to the series path; the resistance variable layer changes from the first resistance state to the second resistance state in such a manner that its resistance value stops decreasing when the interelectrode voltage decreases in absolute value and reaches a first voltage according to a resistance ratio relationship between the series path and the resistance variable element; the resistance variable layer changes from the second resistance state to the first resistance state in such a manner that: its resistance value starts increasing when the interelectrode voltage reaches a second voltage which is equal in absolute value to the first voltage and is different in polarity from the first voltage; the resistance variable layer flows the interelectrode current such that the interelectrode voltage is maintained at a third voltage when the interelectrode voltage increases in absolute value and reaches the third voltage according to the resistance ratio relationship between the series path and the resistance variable element, the third voltage being higher in absolute value than the second voltage and being identical in polarity to the second voltage; and its resistance value stops increasing when the interelectrode current reaches a first current value or lower in a state where the interelectrode voltage is not lower than the second voltage and lower than the third voltage; the method comprising: controlling a characteristic of the load resistor such that a current flowing through the series path including the resistance variable element and the load resistor is restricted to the first current value or lower, after the resistance variable element has changed to the first resistance state, in response to the electric pulse of the second application voltage which is fed to the series path.

A method of writing data to a nonvolatile memory device of the present invention, the nonvolatile memory device including: a series path including a resistance variable element and a load resistor connected in series with the resistance variable element; the resistance variable element including: a first electrode; a second electrode; and a resistance variable layer provided between the first electrode and the second electrode; the resistance variable layer having a characteristic in which: when a voltage generated between the first electrode and the second electrode is an interelectrode voltage and a current flowing between the first electrode and the second electrode is an interelectrode current, the resistance variable layer changes from a first resistance state to a second resistance state in which a resistance value of the resistance variable layer is lower than a resistance value of the resistance variable layer in the first resistance state, in response to an electric pulse of a first application voltage with a first polarity which is applied to the series path; the resistance variable layer changes from the second resistance state to a third resistance state in which a resistance value of the resistance variable layer is lower than the resistance value of the resistance variable layer in the first resistance state and is higher than the resistance value of the resistance variable layer in the second resistance state, in response to an electric pulse of a second application voltage with a second polarity different from the polarity of the first application voltage, the second application voltage being applied to the series path; the resistance variable layer changes from the third resistance state to the first resistance state, in response to an electric pulse of a third application voltage with the second polarity which is applied to the series path; the resistance variable layer generates the interelectrode voltage with the first polarity, based on the first application voltage which is applied to the series path; the resistance variable layer generates the interelectrode voltage with the second polarity, based on the second application voltage which is applied to the series path; the resistance variable layer changes from the first resistance state to the second resistance state in such a manner that its resistance value stops decreasing when the interelectrode voltage decreases in absolute value and reaches a first voltage according to a resistance ratio relationship between the series path and the resistance variable element; the resistance variable layer changes from the second resistance state to the third resistance state in such a manner that its resistance value starts increasing when the interelectrode voltage reaches a second voltage which is equal in absolute value to the first voltage and is different in polarity from the first voltage; the resistance variable layer changes from the third resistance state to the first resistance state in such a manner that the resistance variable layer flows the interelectrode current such that the interelectrode voltage is maintained at a third voltage when the interelectrode voltage increases in absolute value and reaches the third voltage according to the resistance ratio relationship between the series path and the resistance variable element, the third voltage being higher in absolute value than the second voltage and being identical in polarity to the second voltage; and the resistance variable layer changes from the second resistance state to the third resistance state in such a manner that its resistance value stops increasing when the interelectrode current reaches a first current value or lower in a state where the interelectrode voltage is not lower than the second voltage and lower than the third voltage; the method comprising: controlling a characteristic of the load resistor such that at least a current flowing through the series path is not lower than a current flowing by applying to the load resistor a voltage obtained by subtracting the first voltage from the first application voltage, in a state where the electric pulse of the second application voltage is applied and the resistance variable element is in the second resistance state; and controlling the characteristic of the load resistor such that a current flowing through the series path and the resistance variable element is restricted to the first current value or lower by at least the series path, after the resistance variable element has changed to the first resistance state by application of the electric pulse of the third application voltage.

In the nonvolatile memory device, the electric pulse application device may be configured to satisfy $VP \leq \beta (V3+I_{lim}/[2 \times K \times (V3-Vth)])$, for $\beta$ satisfying $0.9 \leq \beta \leq 1.1$, when an absolute value of a voltage applied from the electric pulse application device to the series path to change the resistance variable element from the first resistance state to the second resistance state, an absolute value of a voltage applied from the electric pulse application device to the series path to change the resistance variable element from the second resistance state to the first resistance state, and an absolute value of a voltage applied to the control terminal are all VP, V3 is the third voltage, $I_{lim}$ is the first current, K is a constant unique to the transistor in a linear range, and Vth is a threshold voltage of the transistor, in all write processes.

In the nonvolatile memory device, the electric pulse application device may be configured to satisfy $V_G=VP1=\alpha(V3+(I_{lim}/K2))+Vth$ and $VP2=\beta(V3+I_{lim}/\{2 \times K (V_G-Vth)\})$, for $\alpha$ satisfying $0.82 \leq \alpha \leq 1.09$, and $\beta$ satisfying $0.9 \leq \beta \leq 1.1$, when a voltage applied to the control terminal is $V_G$, an absolute value of a voltage applied from the electric pulse application device to the series path to change the resistance variable element from the first resistance state to the second resistance state is VP1, an absolute value of a voltage applied from the electric pulse application device to the series path to change the resistance variable element from the second resistance state to the first resistance state is VP2, V3 is the third voltage, $I_{lim}$ is the first current, K is a constant unique to the transistor in a linear range, K2 is a constant unique to the transistor in a velocity saturation range, and Vth is a threshold voltage of the transistor.

The nonvolatile memory device may further comprise a detecting circuit for detecting a resistance state of the resistance variable element; and the electric pulse application device may be configured to control writing based on the resistance state of the resistance variable element which is detected by the detecting circuit. The electric pulse application device may be configured to satisfy $VP2=\beta(V3+I_{lim}/\{2 \times K (VP1b-Vth)\})$ for $\beta$ satisfying $0.9 \leq \beta \leq 1.1$, when V3 is the third voltage, $I_{lim}$ is the first current, K is a constant unique to the transistor in a linear range, K2 is a constant unique to the transistor in a velocity saturation range, Vth is a threshold voltage of the transistor, an absolute value of a voltage applied from the electric pulse application device to the series path to change the resistance variable element from the first resistance state to the second resistance state is VP1, an absolute value of a voltage applied from the electric pulse application device to the series path to change the resistance variable element from the second resistance state to the first resistance state is VP2, $VP1a=V3+I_{lim}/[2 \times K \times (VP2-Vth)]$, and $VP1b=\alpha(V3+(I_{lim}/K2))+Vth$ for $\alpha$ satisfying $0.82 \leq \alpha \leq 1.09$, and the electric pulse application device may be configured to repeat a write process in such a manner that VP1 is increased from VP1a to VP1b with a predetermined step to change the resistance variable element from the first resistance state to the second resistance state, until the resistance state of the resistance variable element which is detected by the detecting circuit reaches a predetermined resistance state.

The above and further objects, features and advantages of the present invention will more fully be apparent from the following detailed description of preferred embodiments with reference to the accompanying drawings.

Advantageous Effects of the Invention

The present invention has the above configuration, and it is possible to provide a nonvolatile memory device and a method of writing data to the nonvolatile memory device which are capable of achieving higher stability and higher reliability of an operation in a nonvolatile memory device which devises a bipolar ReRAM than a conventional nonvolatile memory device and a conventional data writing method.

BRIEF DESCRIPTION OF THE DRAWINGS

FIG. 26 is a view showing simulated plots of changes in parameters occurring due to a voltage division relationship between the resistance variable element and a transistor, in a case where a transistor type B is used, and resistance of the resistance variable element changes from 100 kΩ to 1 kΩ by applying pulse voltages of −2.0V, −2.5V and −3.0V to the series path, in which FIG. 26(a) is a view in which a vertical axis indicates an absolute value of an interelectrode voltage, FIG. 26(b) is a view in which a vertical axis indicates an absolute value of a pulse current, and FIG. 26(c) is a view in which a vertical axis indicates electric power consumed by the element.

FIG. 27 is a view showing simulated plots of changes in parameters occurring due to a voltage division relationship between the resistance variable element and the transistor, when a transistor type A is used, and resistance of the resistance variable element changes from 100 kΩ to 1 kΩ by applying pulse voltages of −1.7V, −2.0V and −2.7V to the series path, in which FIG. 27(a) is a view in which a vertical axis indicates an absolute value of an interelectrode voltage, FIG. 27(b) is a view in which a vertical axis indicates an absolute value of a pulse current, and FIG. 27(c) is a view in which a vertical axis indicates electric power consumed by the element.

DESCRIPTION OF EMBODIMENTS

Hereinafter, embodiments of the present invention will be described in detail with reference to the drawings.

Embodiment 1

[Device Configuration]

Figure 1:
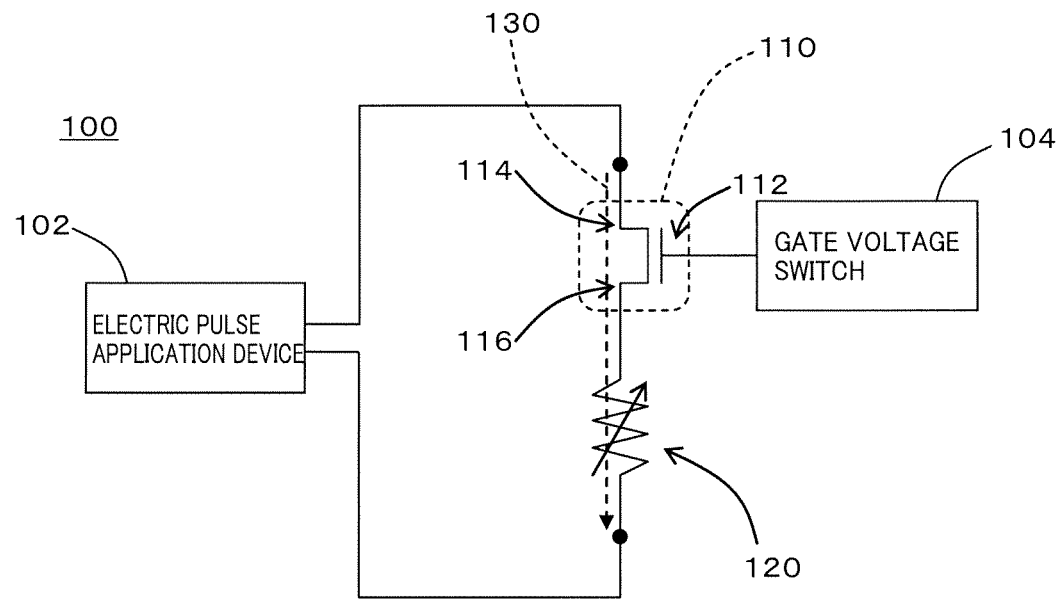
FIG. 1 is a block diagram showing an exemplary schematic configuration of a nonvolatile memory device according to Embodiment 1 of the present invention.
Figure 2:
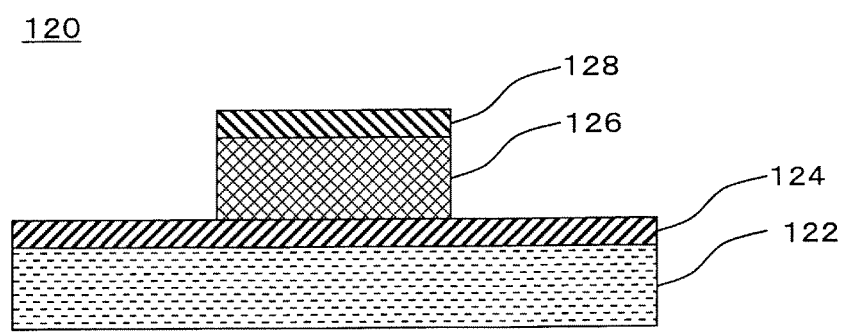
FIG. 2 is a view showing an exemplary schematic structure of a resistance variable element included in the nonvolatile memory device according to Embodiment 1 of the present invention.
Figure 3:
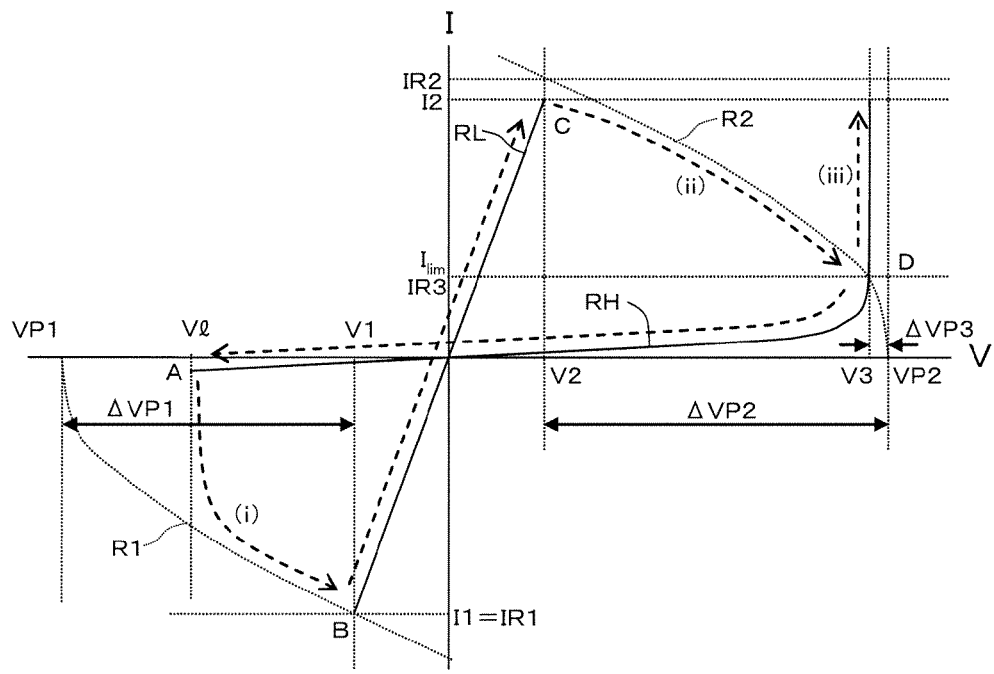
FIG. 3 is a view showing a relationship between current-voltage characteristics of the resistance variable element and a load resistor, and a voltage applied to a series path, in the nonvolatile memory device according to Embodiment 1 of the present invention.
Figure 4:
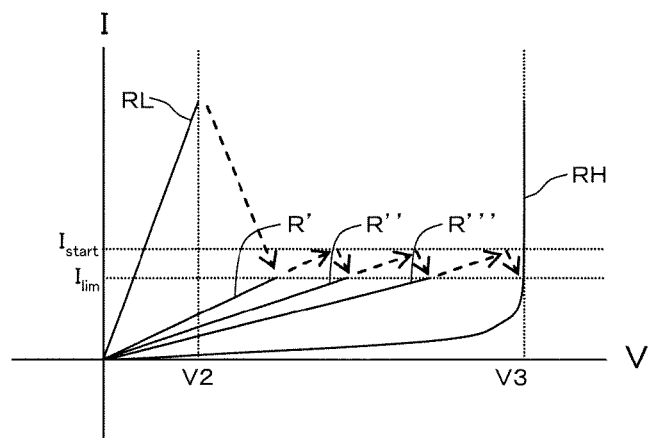
FIG. 4 is a conceptual view showing a first current which is a characteristic value of the resistance variable element included in the nonvolatile memory device according to Embodiment 1 of the present invention.

FIG. 1 is a block diagram showing an exemplary schematic configuration of a nonvolatile memory device according to Embodiment 1 of the present invention. FIG. 2 is a cross-sectional view showing an exemplary schematic structure of a resistance variable element included in the nonvolatile memory device according to Embodiment 1 of the present invention, as viewed from the side. FIG. 3 is a view showing a relationship between current-voltage characteristics of the resistance variable element and a load resistor and a voltage applied to a series path, in the nonvolatile memory device according to Embodiment 1 of the present invention. FIG. 4 is a conceptual view showing a first current which is a characteristic value of the resistance variable element included in the nonvolatile memory device according to Embodiment 1 of the present invention. Hereinafter, a nonvolatile memory device 100 of Embodiment 1 will be described with reference to these Figures.

As shown in FIG. 1, the nonvolatile memory device 100 of Embodiment 1 includes a series path 130 (path sandwiched between black circles in FIG. 1) including a resistance variable element 120 and a load resistor (in the example of FIG. 1, ON-resistance of a transistor 110, hereinafter referred to as transistor 110 for the sake of convenience of explanation) connected in series with the resistance variable element 120, and an electric pulse application device 102 configured to selectively apply to the series path 130 either an electric pulse of a first application voltage or an electric pulse of a second application voltage with a polarity different from that of the first application voltage.

As the load resistor, resistive elements other than the transistor may be used. The load resistor may be a single element, but may be, for example, a device capable of selecting one among from a plurality of resistive elements or resistive elements arranged in parallel and having a plurality of characteristics different from each other. As the resistance variable element 120, for example, a ReRAM element may be used. As the electric pulse application device 102, for example, a general write circuit may be used.

As shown in FIG. 2, the resistance variable element 120 includes a first electrode (in the example of FIG. 1, lower electrode 124 formed on a substrate 122, hereinafter referred to as lower electrode 124 for the sake of convenience of explanation), a second electrode (in the example of FIG. 1, upper electrode 128, hereinafter referred to as upper electrode 128 for the sake of convenience of explanation), and a resistance variable layer 126 provided between the lower electrode 124 and the upper electrode 128.

As a material for the lower electrode 124 and the upper electrode 128, Pt (platinum), W(tungsten), Cu (copper), Al (aluminum), TiN (titanium nitride), TaN (tantalum nitride), TiAlN (titanium aluminum nitride), etc. may be used. Although the lower electrode has a larger size than the upper electrode, the present invention is not limited to this. These electrodes may suitably have an optimal shape depending on a semiconductor process, for example, a part of wire plugs may be used as these electrodes.

As a material of the resistance variable layer 126, for example, oxygen-deficient transition metal oxide (preferably, oxygen-deficient tantalum (Ta) oxide) is used. The oxygen-deficient transition metal oxide refers to an oxide which is less in oxygen content (atom ratio: ratio of the number of oxygen atoms to total number of atoms) than an oxide having a stoichiometric composition. For example, in the case where transition metal is tantalum (Ta), a stoichiometric oxide composition is $Ta_2O_5$, and a ratio of the number of oxygen (O) atoms to the number of tantalum (Ta) atoms (O/Ta) is 2.5. Therefore, in the oxygen-deficient tantalum oxide, the ratio of the number of O atoms to the number of Ta atoms is larger than 0 and smaller than 2.5. As transition metal, there are, for example, tantalum (Ta), nickel (Ni), hafnium (Hf), niobium (Nb), zirconium (zr), titanium (Ti), etc. In this embodiment, oxygen-deficient Ta oxide is preferably used as the oxygen-deficient transition metal oxide. More suitably, the resistance variable layer 126 has at least a stacked structure in which a first tantalum-containing layer having a composition expressed as $TaO_x$ ($0<x<2.5$) and a second tantalum-containing layer having a composition expressed as $TaO_y$ ($x<y<2.5$) are stacked together. It is needless to say that other layer, for example, a third tantalum-containing layer or other transition metal oxide layer may be suitably provided. $TaO_x$ preferably satisfies $0.8 \leq x \leq 1.9$, and $TaO_y$ preferably satisfies $2.1 \leq y < 2.5$. The thickness of the second tantalum-containing layer is preferably not less than 1 nm and not more than 8 nm.

As shown in FIG. 3, the resistance variable layer 126 changes from a first resistance state (in the example of FIG. 3, RH, expressed as RH for the sake of convenience of explanation) to a second resistance state (in the example of FIG. 3, RL, expressed as RL for the sake of convenience of explanation) in which a resistance value of the resistance variable layer 126 is lower than a resistance value of the resistance variable layer 126 in the first resistance state, when the electric pulse application device 102 applies to the series path 130, a first application voltage (in the example of FIG. 3, VP1, hereinafter referred to as VP1 for the sake of convenience of explanation). In this case, R1 in FIG. 3 indicates a load curve assuming that a sum of a wire resistance and an ON-resistance of the transistor 110 is a load resistance. When an intersection of R1 and RH which is a voltage-current characteristic in the state where the resistance variable element is in the first resistance state (RH) is larger in absolute value than Vl (point A), the resistance variable element starts changing to the low-resistance state, and an interelectrode voltage of the resistance variable element 120 shifts on an intersection of RL and R1 and reaches V1 (point B) when the resistance variable element changes to RL (dotted arrow (i)). As shown in FIG. 3, the dotted arrow (i) indicating a change from RH to RL is not present on a line of R1 in an initial stage of the change. This is because the resistance variable element starts changing its resistance value upon the interelectrode voltage exceeding Vl, in the course of rising from zero to VP1 in the applied voltage and the dotted arrow (i) transiently shifts onto R1. As can be seen, when the interelectrode voltage of the resistance variable element 120 on R1 reaches V1, a voltage of $\Delta VP1$ (=VP1-V1) drops because of the transistor and the wire resistance which are the load resistance.

In the same manner, when the electric pulse application device 102 applies to the series path 130 an electric pulse of a second application voltage (in the example of FIG. 3, VP2, hereinafter referred to as VP2 for the sake of convenience of explanation), the resistance variable element changes from RL to RH. In this case, R2 in FIG. 3 indicates a load curve assuming that a sum of the wire resistance and the ON-resistance of the transistor 110 is a load resistance in voltage application in an opposite direction to the above application. When the interelectrode voltage of the resistance variable element 120 exceeds in absolute value an intersection (point C) of V2 and RL which is a voltage-current characteristic in the state where the resistance variable element 120 is in the second resistance state (RL), the resistance variable element starts changing to the high-resistance state, while the interelectrode voltage of the resistance variable element 120 shifts along R2 (dotted arrow (ii)) and reaches V3 (point D) when the resistance variable element changes to RH. As shown in FIG. 3, the dotted line (ii) indicating a change from RL to RH is not present on R2 in an initial stage of the change. This is because the resistance variable element starts changing its resistance upon the intersection exceeding V2, in the course of the voltage of the applied pulse, rising from zero to VP2, and the dotted line (ii) transiently shifts along R2. As can be seen, when the interelectrode voltage reaches V3, a voltage of $\Delta VP3$ (=VP2-V3) drops due to the transistor and the wire resistance which are the load resistance.

As described above, the resistance variable element 120 has a bipolar resistance changing characteristic in which its resistance changes in different directions by applying voltages with different polarities to the element.

As shown in FIG. 3, it is supposed that the polarity of the first application voltage is negative (first polarity), the polarity of the second application voltage is positive (second polarity), a voltage generated between the lower electrode 124 and the upper electrode 128 is the interelectrode voltage, a current flowing between the lower electrode 124 and the upper electrode 128 is the interelectrode current, the polarity of the interelectrode voltage in a case where the electric pulse application device 102 applies VP1 to the series path 130 is negative (first polarity), and the polarity of the interelectrode voltage in a case where the electric pulse application device 102 applies VP2 to the series path 130 is positive (second polarity).

In main examples of the present specification, it is supposed that the direction in which a current flows from the upper electrode to the lower electrode is positive and an opposite direction is negative. Also, it is supposed that by voltage application in a positive direction, the resistance variable element changes from a low-resistance state to a high-resistance state (hereinafter also referred to as attain high-resistance state), and changes from the high-resistance state to the low-resistance state (hereinafter also referred to as attain low-resistance state) by voltage application in a negative direction. However, this is exemplary, and in some cases, the resistance variable element changes to the low-resistance state by application in the positive direction (application state in which a current flows from the upper electrode to the lower electrode) and changes to the high-resistance state by application in the negative direction (application state in which a current flows from the lower electrode to the upper electrode). Therefore, the configuration of the subject application does not depend on the polarity. For example, by stacking the second tantalum-containing layer in contact with the lower electrode, the operation associated with the polarity is reversed. By disposing an electrode material which easily causes resistance change and an electrode material which does not easily cause resistance change and by changing the positional relationship between the upper electrode and the lower electrode, the operation is reversed.

As shown in FIG. 3, in a case where the resistance variable layer 126 changes from RH to RL, it starts changing its resistance when the interelectrode voltage exceeds Vl which is a negative voltage, and its resistance value stops decreasing (in other words, the interelectrode voltage stops decreasing, the interelectrode current stops increasing) when the interelectrode voltage reaches a first voltage (V1 in the example of FIG. 3, hereinafter referred to as V1 for the sake of convenience of explanation) (i.e., the absolute value of the interelectrode voltage decreases and reaches V1 in a resistance ratio relationship with the load resistor according to a decrease in the resistance value of the resistance variable element 120) (see third finding in Experiment example 7).

In a case where the resistance variable layer 126 changes from RL to RH, its resistance value starts increasing (in other words, the interelectrode voltage starts increasing, the interelectrode current starts decreasing) when the interelectrode voltage reaches a second voltage (V2 in the example of FIG. 3, hereinafter referred to as V2 for the sake of convenience of explanation) which is a positive voltage being equal in absolute value to V1 and being opposite in polarity (see fifth finding in Experiment example 7).

Figure 17:
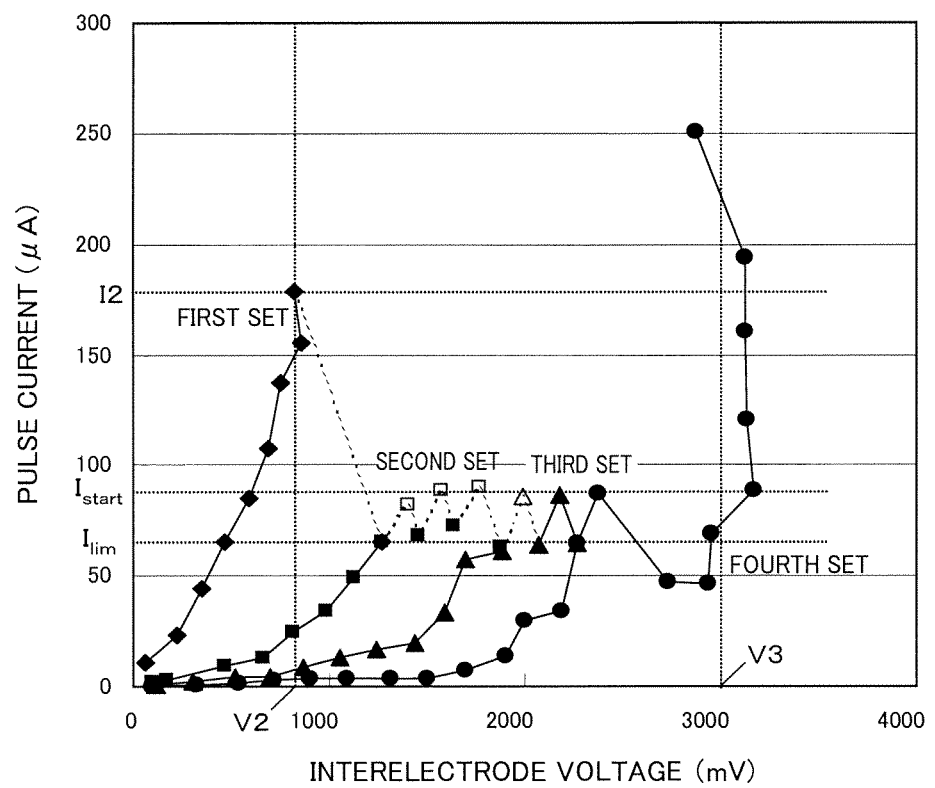
FIG. 17 is a view showing a relationship between an interelectrode voltage and a pulse current in Experiment example 6.

The resistance variable layer 126 has a characteristic in which in a case where the resistance variable layer 126 changes from RL to RH, the resistance variable layer 126 flows the interelectrode current such that the interelectrode voltage is maintained at a third voltage (V3 in the example of FIG. 3, hereinafter referred to as V3 for the sake of convenience of explanation) higher than V2 when the interelectrode voltage reaches V3 (see dotted-line arrow (iii), Experiment example 6 and FIG. 17).

Figure 15:
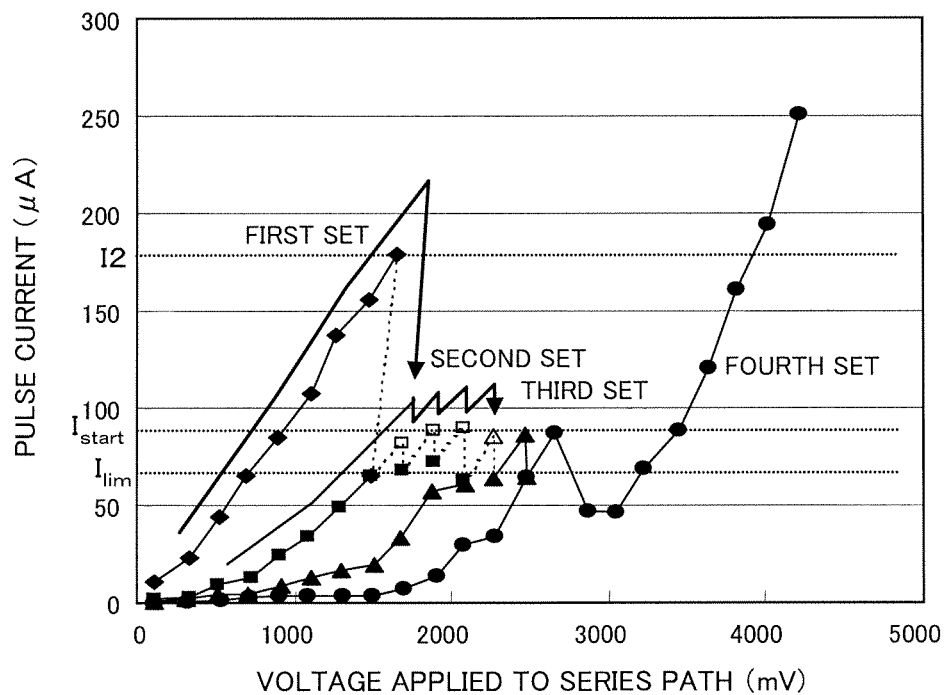
FIG. 15 is a view showing a relationship between a voltage applied to a series path and a pulse current in Experiment example 6.

As shown in FIG. 4, the resistance variable layer 126 has a characteristic in which in a case where the resistance variable layer 126 changes from RL to RH, its resistance value stops increasing (in other words, the interelectrode voltage stops increasing, the interelectrode current stops decreasing) when the interelectrode current decreases to a first current value ($I_{lim}$ in the example of FIG. 3, referred to as $I_{lim}$ for the sake of convenience of explanation) or lower in a state where the interelectrode is not lower than V2 and lower than V3 (see experiment example 6, and FIGS. 15 and 17).

Specific description will be given with reference to the example of FIG. 4. When the interelectrode voltage of the resistance variable layer 126 in RL is gradually increased, the resistance value starts increasing at a time point when the interelectrode voltage reaches V2 (interelectrode current reaches I2). When the interelectrode current decreases to $I_{lim}$, its resistance value stops increasing (in other words, the interelectrode voltage stops increasing, and the interelectrode current stops decreasing). This state is a first intermediate resistance state (R').

When the interelectrode voltage is further increased, the interelectrode current exceeds the above $I_{lim}$ and therefore the resistance value starts increasing again. FIG. 4 shows that the interelectrode current flowing by increasing a voltage rise step by one step reaches $I_{start}$ and soon decreases to $I_{lim}$. When the interelectrode current decreases to $I_{lim}$ in this way, the resistance value stops increasing (in other words, the interelectrode voltage stops increasing, the interelectrode current stops decreasing) again. This state is second intermediate resistance state (R").

When the interelectrode voltage is further increased by one more step, the interelectrode current reaches $I_{start}$ again, and the resistance value starts increasing again. When the interelectrode current decreases to $I_{lim}$, the resistance value stops increasing (in other words, the interelectrode voltage stops increasing, and the interelectrode current stops decreasing) again. This state is third intermediate resistance state (R'''). The value of $I_{start}$ is not particularly limited to a constant value but may be variable according to a width of the step used for increasing the voltage. This phenomenon is observed so long as the value of $I_{start}$ is larger than $I_{lim}$.

As described above, by increasing the interelectrode voltage of the resistance variable layer 126 in a step form, the interelectrode current repeats increasing and decreasing between $I_{start}$ and $I_{lim}$, and the resistance value increases stepwisely. Finally, the resistance variable layer 126 reaches RH. By writing data at a plurality of levels utilizing such stepwise change of the resistance values, multi-valued data can be stored.

As should be evident from the above description, it may be said that the resistance variable layer 126 does not change to a higher-resistance state if the interelectrode current is not higher than the current value $I_{lim}$, or the resistance value of the resistance variable layer 126 stops changing (increasing) if the interelectrode current reaches a value which is not higher than the current value $I_{lim}$, when the resistance value of the resistance variable layer 126 increases (see Experiment example 6, FIG. 15 and FIG. 17).

As shown in FIG. 3, the transistor 110 has a characteristic (R2 in the example of FIG. 3, hereinafter referred to as R2 for the sake of convenience of explanation) in which a current (IR3 in the example of FIG. 3, hereinafter referred to as IR3 for the sake of convenience of explanation) flowing when a voltage (ΔVP3 in the example of FIG. 3, hereinafter referred to as ΔVP3 for the sake of convenience of explanation) obtained by subtracting V3 from VP2 of the electric pulse output from the electric pulse application device 102 is applied to the transistor 110 is not higher than $I_{lim}$ (see fourth finding in Experiment example 7). FIG. 3 depicts that IR3 is substantially equal to $I_{lim}$, although IR3 is not higher than $I_{lim}$.

The "load resistance characteristic" of R2 shown in FIG. 3 merely indicates a state where the amplitude of the electric pulse output from the electric pulse application device 102 reaches VP2, and may be different from that shown in FIG. 3 in a transient state where the amplitude is rising from zero level (hereinafter the same applies). It is sufficient that the application voltages (VP1, VP2) of the electric pulse application device 102, the characteristic values (V1, V2, V3, $I_{lim}$) of the resistance variable element, and the load resistance characteristics (R1, R2) are designed to satisfy the above conditions, as a whole.

In a method of writing data to the nonvolatile memory device of this embodiment, the transistor 110 restricts a current flowing through the series path 130 to $I_{lim}$ or lower after the resistance value of the resistance variable element has changed to the first resistance state (RH), when the electric pulse of VP2 is fed to the series path 130, in the nonvolatile memory device having the above configuration.

In accordance with the above configuration, when the resistance value of the resistance variable layer 126 increases, the interelectrode current at a time point when the interelectrode voltage reaches V3 is restricted to $I_{lim}$ or lower. Therefore, it is possible to suppress the resistance variable layer 126 from changing to a super-high resistance state irreversibly or the resistance variable element from being broken due to a high current.

When VP2 is applied between the both ends of the series path 130, VP2 is divided for the transistor 110 and the resistance variable element 120. When the resistance state completes changing, a voltage of V3 is applied to the resistance variable element 120 and a voltage of ΔVP3 (=VP2−V3) is applied to the transistor 110 in ideal cases. A current flowing through the series path 130 at that time is determined by the characteristic R2 of the transistor 110 and IR3 ($\leq I_{lim}$). Therefore, a current-voltage characteristic corresponding to RH passes through a point D of a current value IR3 and a voltage V3.

To be specific, the resistance variable element 120 in a high-resistance state has a nonlinear current-voltage characteristic (dotted-line arrow (iii)) in which the interelectrode current increases abruptly when the interelectrode voltage becomes high. There are numerous resistance states to which the resistance variable element 120 may possibly transition from RL by application of VP2. Among the numerous resistance states, a resistance state corresponding to a point of a current value IR3 and a voltage V3 is a target resistance state in which the resistance variable element 120 has a current-voltage characteristic in which the resistance variable element 120 does not change to a super-high resistance state and a resistance value read in response to a read voltage is highest. This is an ideal high-resistance state (RH).

Since the resistance variable element 120 has a non-linear current-voltage characteristic, an apparent resistance value changes according to an interelectrode voltage. Therefore, it is supposed that comparison is made for the magnitude relationship of the resistance value between RH and RL in a case where the interelectrode voltage is equal. To be more specific, comparison is made for the resistance values calculated from currents flowing when the interelectrode voltages much lower in absolute value than V1 and V2 are applied.

The above mentioned suitable characteristic (current-voltage characteristic of the ON-resistance between the first main terminal 114 and the second main terminal 116) of the transistor 110 is obtained by, for example, a configuration in which the nonvolatile memory device 100 includes a gate voltage switch 104 as shown in FIG. 1 and the gate voltage switch 104 properly controls the gate voltage (voltage of the control terminal 112) of the transistor 110.

In the nonvolatile memory device 100 of Embodiment 1, as shown in FIG. 3, the transistor 110 has a characteristic (R2 in the example of FIG. 3) in which a current (IR2 in the example of FIG. 4, hereinafter referred to as IR2 for the sake of convenience of explanation) flowing when a voltage (ΔVP2 in the example of FIG. 3, hereinafter referred to as ΔVP2 for the sake of convenience of explanation) obtained by subtracting V2 from VP2 of the electric pulse output from the electric pulse application device 102 is applied to the transistor 110 is not lower in absolute value than a current (IR1 in the example of FIG. 3, hereinafter referred to as IR1 for the sake of convenience of explanation) flowing when a voltage (ΔVP1 in the example of FIG. 3, hereinafter referred to as ΔVP1 for the sake of convenience) obtained by subtracting V1 from VP1 is applied to the transistor 110 (see fifth finding in Experiment example 7).

In accordance with the above configuration, when the electric pulse application device 102 outputs the electric pulse of VP2, a sufficiently high interelectrode voltage is applied to enable the resistance variable element 120 to surely start changing its resistance state from RL to RH. This is because a current value (I2 in the example of FIG. 3, hereinafter referred to as I2 for the sake of convenience of explanation) with which the resistance value of the resistance variable layer 126 in RL starts increasing is equal in absolute value to an interelectrode current (I1 in the example of FIG. 3) in a case where the interelectrode voltage corresponding to RL is equal to the first voltage V1 and is equal in absolute value to a current (IR1 in the example of FIG. 3) flowing through the transistor 110 when a voltage of V1–VP1 is applied (fifth finding in Experiment example 7).

The value of I1=IR1 is determined by the relationship among V1, VP1 and the characteristic (R1 in the example of FIG. 3, hereinafter referred to as R1 for the sake of convenience) of the transistor 110 when the electric pulse application device 102 outputs the electric pulse of VP1.

VP1 is applied between both ends of the series path 130 and is divided for the transistor 110 and the resistance variable element 120. At an initial stage, most part of the voltage is fed to the resistance variable element 120 which is in RH and has a high resistance value. As the resistance state starts changing and the resistance value of the resistance variable element 120 decreases, the absolute value of the voltage fed to the resistance variable element 120 decreases. When the interelectrode voltage decreases to V1, the resistance value of the resistance variable element 120 does not decrease any more. V1 is a characteristic value of the resistance variable element 120, and is determined by the composition and thickness of the resistance variable layer, an electrode area, an electrode material, and others. A current at a point when the interelectrode voltage reaches V1 is determined by the resistance characteristic R1 of the transistor 110. This current is equal to a current flowing through the transistor 110 in a case where the voltage of V1–VP1 is applied. This current value is I1 and IR1. The resistance value of the resistance variable element 120 in RL is theoretically determined by this current and V1. That is, among the numerous resistance states which the resistance variable element 120 may possibly have, a resistance state corresponding to a point of a current value I1 (=IR1) and a voltage V1 is RL. By using this phenomenon, RL is set to have a plurality of levels so that multi-valued data is stored.

Experiment Example 1

Resistance Variable Element and its Resistance Changing Characteristic

Figure 5:
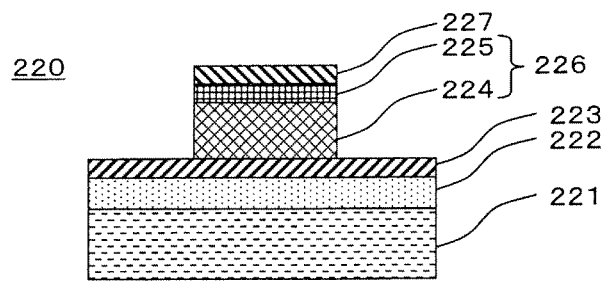
FIG. 5 is a conceptual view showing a schematic configuration of a resistance variable element according to Experiment example 1.

FIG. 5 is a conceptual view showing a schematic configuration of a resistance variable element according to Experiment example 1.

As shown in FIG. 5, a resistance variable element 220 includes a substrate 221, an oxide layer 222 formed on the substrate 221, a first electrode layer 223 formed on the oxide layer 222, a second electrode layer 227, and a resistance variable layer 226 sandwiched between the first electrode layer 223 and the second electrode layer 227. In this experiment example, by way of example, the resistance variable layer 226 includes a first tantalum-containing layer (hereinafter referred to as "first tantalum oxide layer" or simply referred to as "first oxide layer") 224 with lower oxygen content, and a second tantalum-containing layer (hereinafter referred to as "second tantalum oxide layer" or simply referred to as "second oxide layer") 225 with higher oxygen content which is formed on the first tantalum-containing layer 224.

The substrate 221 may be but is not limited to a silicon monocrystalline substrate or a semiconductor substrate. Since the resistance variable layer 226 can be formed at a relatively low substrate temperature, it is possible to form the resistance variable layer 226 on a resin material, etc. FIG. 5 depicts that the lower electrode has a larger size than the upper electrode, but the present embodiment is not limited to this. These electrodes may suitably have an optimal shape depending on semiconductor processes, and may be constituted as for example, a part of wire plugs.

Subsequently, a manufacturing method of the resistance variable element 220 will be described.

Over the substrate 221 which was the monocrystalline silicon, the oxide layer 222 with 200 nm thickness was formed by thermal oxidation. As the first electrode layer 223, a Pt thin layer with 100 nm thickness was deposited on the oxide layer 222 by sputtering.

Over the first electrode layer 223, a tantalum-containing layer was deposited by reactive sputtering in which sputtering was conducted using a Ta target in argon and oxygen gases. The layer deposition conditions were such that a vacuum degree (back pressure) inside a sputtering device before starting the sputtering was set to about $7 \times 10^{-4}$ Pa. During the sputtering, a power was set to 250W a total gas pressure of an argon gas and an oxygen gas was set to 3.3 Pa, a flow ratio of the oxygen gas was set to 3.4%, a substrate set temperature was set to 30 degrees C., and a layer deposition time was set to 7 minutes. Thereby, a 30 nm-thick tantalum-containing layer which had oxygen content of about 58 at. % and was expressed as $TaO_{1.4}$ was deposited.

The uppermost surface of the tantalum-containing layer was irradiated with oxygen plasma to be reformed. To be specific, while keeping the sputtering conditions such as the gas pressure condition and the power, a shutter was inserted into a space between the Ta target and the substrate 221 disposed opposite to the Ta target. This state was kept for a predetermined time. Under this condition, the uppermost surface of the first tantalum-containing layer 224 was oxidated by oxygen plasma. As a result, the resistance variable layer 226 having a stacked structure was formed, in which the second tantalum-containing layer 225 ($TaO_{2.4}$) with higher oxygen content than the first tantalum-containing layer 224 ($TaO_{1.4}$) was stacked on the first tantalum-containing layer 224.

Finally, a 150 nm-thick Pt thin layer was deposited as the second electrode layer 227 on the second tantalum-containing layer 225 by sputtering. In this case, layer deposition conditions were identical to those for forming the first electrode layer 223. The first tantalum-containing layer 224, the second tantalum-containing layer 225 and the second electrode layer 227 were equal in size (shape when viewed from a thickness direction), which was 500 nm×500 nm.

In the manufacturing method of the resistance variable element 220, preferably, formation of the first tantalum-containing layer 224 and the second tantalum-containing layer 225, and deposition of the second electrode 227 are carried out continuously inside the sputtering apparatus. The thickness of the second tantalum-containing layer 225 can be controlled based on an irradiation time, irradiation ambient temperature and output of the oxygen plasma. As described layer, a resistance changing characteristic is varied depending on the thickness of the second tantalum-containing layer 225. Although the thickness of the oxide layer 222, the thickness of the electrode layer 223 and the thickness of the electrode layer 227 are illustrated, the thicknesses are not limited to these values.

Figure 8:
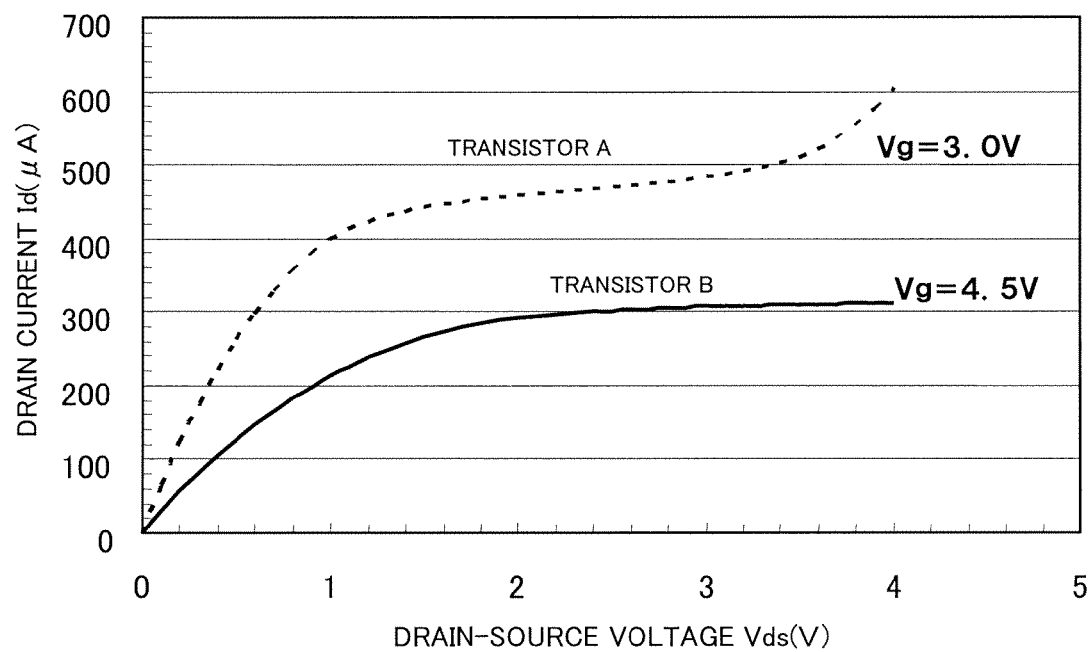
FIG. 8 is a view showing a characteristic of a transistor included in a circuit of Experiment example.

To drive the resistance variable element 220, the resistance variable element 220 was incorporated into a circuit configuration similar to that of FIG. 1, and its resistance state was changed. FIG. 8 is a view showing a characteristic of a transistor included in a circuit of Experiment example. In Experiment example 1, a transistor A (gate length: 0.18 μm, gate width: 0.44 μm, gate electrode material: polysilicon, gate oxide layer: oxynitride layer 3.2 nm, Well implantation: boron 30 keV, $5.3 \times 10^{12}$ $cm^{-2}$, Vt implantation, boron 30 keV, $1.2 \times 10^{12}$ $cm^{-2}$, S/D implantation: arsenic 50 keV, $3 \times 10^{15}$ $cm^{-2}$, activation annealing: 1010 degrees C., in $N_2.O_2$ gases) was used. A transistor B in FIG. 8 (gate length: 0.38 μm, gate width: 0.44 μm, gate electrode material: polysilicon, gate oxide layer: oxide layer 9.7 nm, Well implantation: boron 30 keV, $5.3 \times 10^{12}$ $cm^{-2}$, without Vt implantation, S/D implantation: arsenic 50 keV, $3 \times 10^{15}$ $cm^{-2}$, activation annealing: 1010 degrees C., in $N_2.O_2$ gases) will be described later. The transistor of FIG. 1 is used as the load resistor described above. In addition, in arrangement of a plurality of memory cells arrayed assuming a portion between black circles of FIG. 1 (series path 130 including the resistance variable element 120 and the transistor 112) is one memory cell, the transistor is used as a select element (see FIG. 33).

To drive the resistance variable element, electric pulses with specified conditions (+3V and 100 ns as a positive pulse, −3V and 100 ns as a negative pulse) were applied between the ends of the series path by an external electric power supply. The electric pulses were applied in a state where one end of the series path was electrically grounded (GND) and a positive electric potential was applied to the other end. The polarity of the voltage was such that an electric pulse in a case where the electric potential of the second electrode layer 227 on the basis of the first electrode layer 223 was positive when the electric pulse was applied was a positive pulse. To be more specific, in FIG. 1, a pulse in a case (application state B in FIG. 35) where a positive electric potential electric pulse was applied to the end closer to the resistance variable element in a state where the main terminal which was not connected to the resistance variable element was electrically grounded (GND) was a positive pulse, while a pulse in a case (application state A in FIG. 35) where a positive electric potential electric pulse was applied to the main terminal which was not connected to the resistance variable element in a state where the end closer to the resistance variable element was electrically grounded (GND) was a negative pulse. The resistance value was obtained in such a manner that after the electric pulse was applied every time, a voltage of +40 mV was applied to the series current path under the state where the main terminal which was not connected to the resistance variable element was electrically grounded (GND), and a current flowing through the resistance variable element was measured. The polarity of the voltage was defined in the same manner that the electric pulse was applied. The gate voltage of the transistor in the application of the electric pulse was set to +3.0V.

Figure 6:
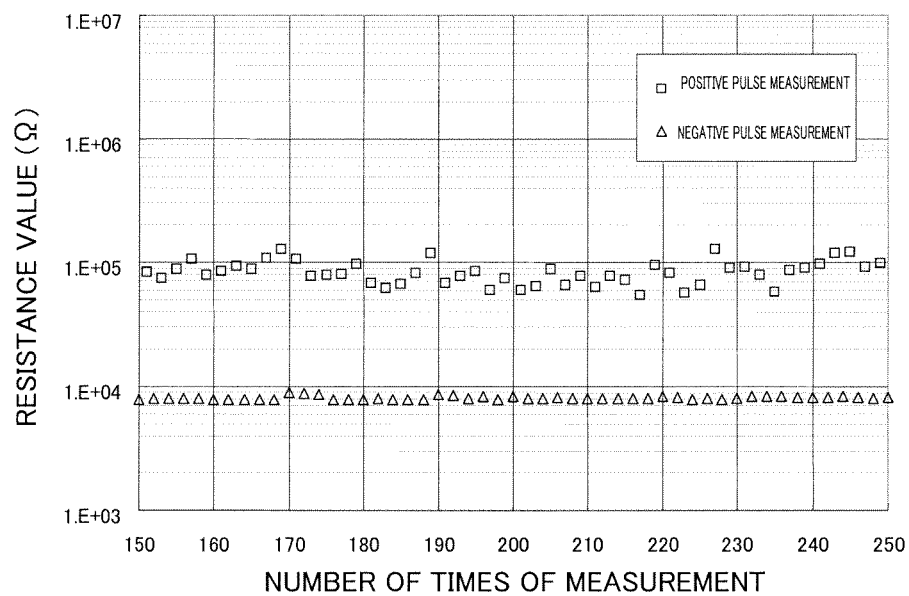
FIG. 6 is a view showing a resistance changing characteristic of a sample A when irradiation time of oxygen plasma is set to 15 seconds in Experiment example 1.
Figure 7:
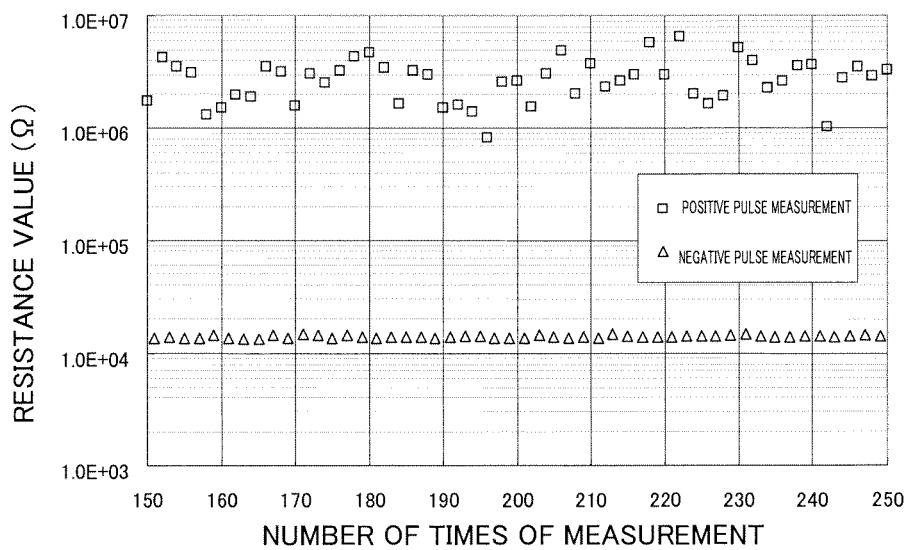
FIG. 7 is a view showing a resistance changing characteristic of a sample B when irradiation time of oxygen plasma is set to 40 seconds in Experiment example 1.

FIG. 6 is a view showing a resistance changing characteristic of the sample A when the irradiation time of oxygen plasma was set to 15 seconds in Experiment example 1. FIG. 7 is a view showing a resistance changing characteristic of the sample B when the irradiation time of oxygen plasma was set to 40 seconds in Experiment example 1. As described above, the thicknesses of the second tantalum-containing layers 225 in the samples A and B were different from each other according to the irradiation time. The thickness was 5.5 nm in the sample A, while the thickness was 7 nm in the sample B. The thickness of the second tantalum-containing layer 225 was presumed by conducting fitting assuming that two tantalum oxide layers were present on the substrate based on measurement data obtained by X-ray reflectometry (manufacture name: Rigaku, software name: X-ray reflectivity data processing software).

As shown in FIGS. 6 and 7, the resistance value of the resistance variable layer 224 of the resistance variable element 220 increased or decreased reversibly, according to the directions in which the voltages were applied. It was found out that the resistance variable element 220 was able to transition between at least two states which were a high-resistance state (RH state) in which the resistance value was high and a low-resistance state (RL state) in which the resistance value was lower than the resistance value corresponding to RH state, the resistance states were retained after stopping application of the voltages, and thus the resistance variable element 220 could be used to store data according to the respective states. According to the irradiation time of oxygen plasma (i.e., thickness of the second tantalum-containing layer 225), the resistance value of the resistance variable element in RH (high-resistance state) which was read in response to a read voltage, was different.

As can be clearly seen from comparison between FIGS. 6 and 7, a resistance changing magnitude was small in the sample A including the second tantalum-containing layer 225 which was thinner, and the resistance value of the resistance variable element in RH (high-resistance state), which was read in response to a read voltage, was low. On the other hand, a resistance changing magnitude was large in the sample B including the second tantalum-containing layer 225 which was thicker, and the resistance value of the resistance variable element in RH (high-resistance state), which was read in response to a read voltage, was higher in the sample B than in the sample A. In general, as the resistance changing magnitude is larger, a margin in determination in a case where the stored data is read based on the resistance state increases. Therefore, data reliability is improved and the resistance variable element can be robust with respect to a variation in data and an outside noise. In other words, it was discovered that as the thickness of the second tantalum-containing layer 225 was preferably larger to improve data reliability.

It should be noted that another problem arises, in which if the thickness of the second tantalum-containing layer 225 is excessively large, the second tantalum-containing layer 225 becomes closer to an insulating layer, then initial resistance of the resistance variable element is high, and thus a voltage required to be applied to change the resistance variable element to RL (low-resistance state) is very high, or a width of the pulse applied is long. Therefore, it was discovered that the thickness of the second tantalum-containing layer 225 could be desirably increased as much as possible in view of a voltage range within which the resistance variable element is drivable. It was presumed that there existed an optimal thickness and the corresponding optimal driving method.

Experiment Example 2

Problems Occurring in Conventional Driving Method

In Experiment example 2, a plurality of resistance variable elements were fabricated under the same conditions as those for the sample B in Experiment example 1 and their resistance states were changed under the conditions similar to those for Experiment example 1.

Figure 9:
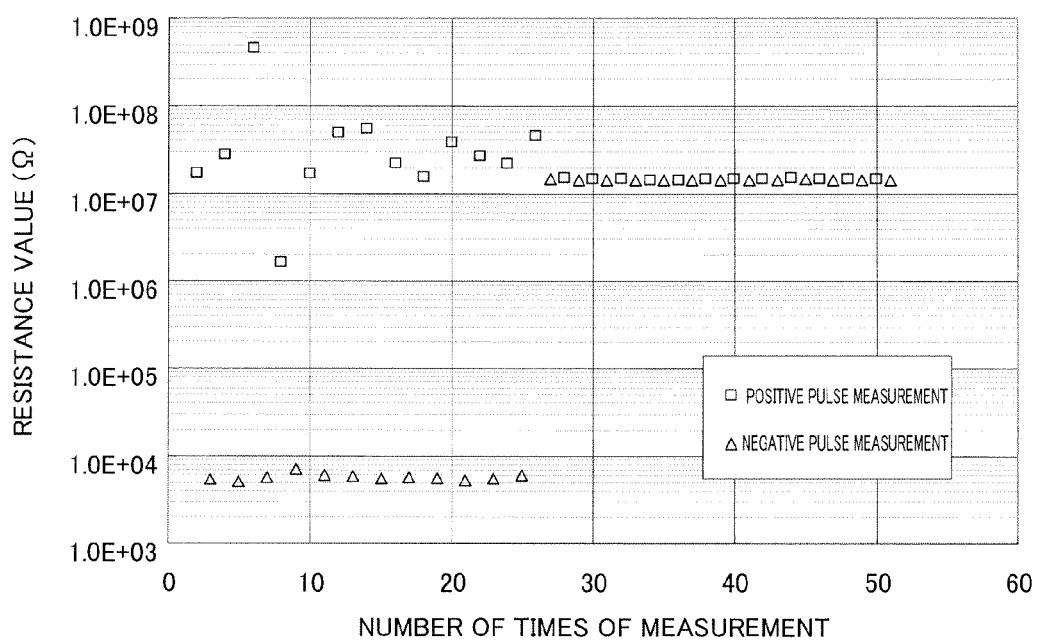
FIG. 9 is a view showing a resistance changing characteristic of a certain resistance variable element which is obtained in Experiment example 2.

FIG. 9 is a view showing a resistance changing characteristic of a certain resistance variable element which was obtained in Experiment example 2. As can be seen from FIG. 9, in Experiment example 2, when the number of times of electric pulse application was less than 30, several resistance variable elements were fixed at RH (high-resistance state) and did not return to RL (low-resistance state) thereafter. In other words, it was found out that the resistance variable elements changed to RH (high-resistance state) irreversibly (similar problem occurred in about 30% of evaluated samples). Such a phenomenon is fatal when the resistance variable element is incorporated into a rewritable memory device.

Experiment Example 3

Voltage-Current Characteristic of Resistance Variable Element Under Conditions of Experiment Example 2

In Experiment example 3, the voltage-current characteristic of the resistance variable element was measured with a device configuration similar to that of Experiment example 2. The gate voltage of the transistor was set to +3.0V similarly to Experiment example 2. The voltage-current characteristic was measured in such a manner that a pulse width of the electric pulse applied was fixed to 100 ns, the voltage was increased stepwise from 0V to about +2.4V, then the voltage was decreased stepwise to −3V, and then was increased stepwise up to 0V again. The application method of the electric pulses and the polarities of the voltages were similar to those in Experiment example 2. A current value (current value at terminal end of the pulse width) in a case where the electric pulse was applied was recorded as a pulse current. The resistance value (element DC resistance value) was obtained in such a manner that after every application of electric pulse, a voltage of +400 mV was applied to the series path under the state where the main terminal which was not connected to the resistance variable element was electrically grounded (GND), and a flowing current was measured.

Figure 10:
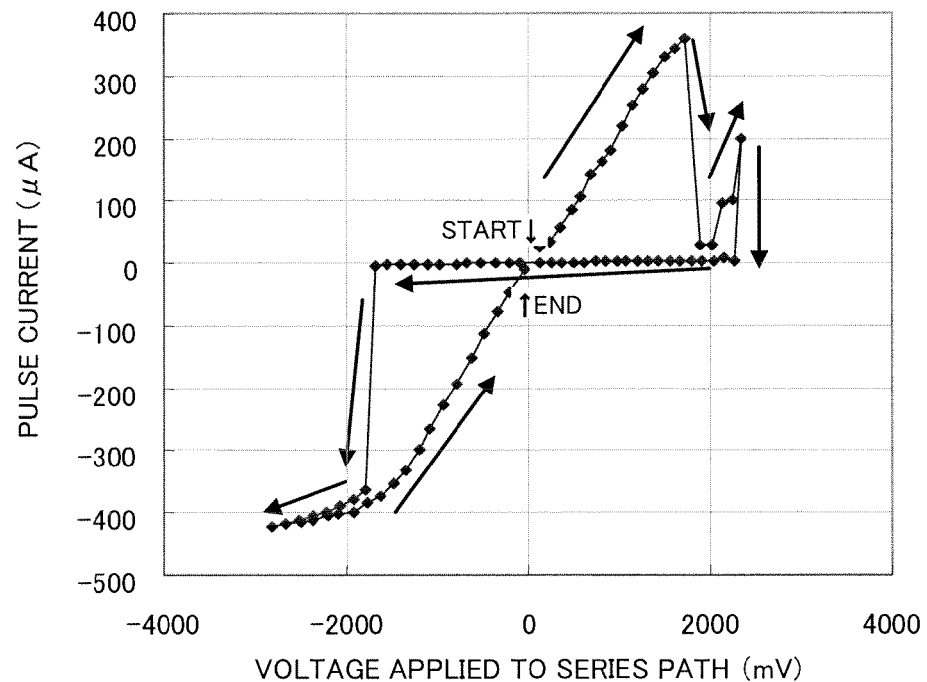
FIG. 10 is a view showing a relationship between a voltage applied to a series path and a pulse current in Experiment example 3.
Figure 11:
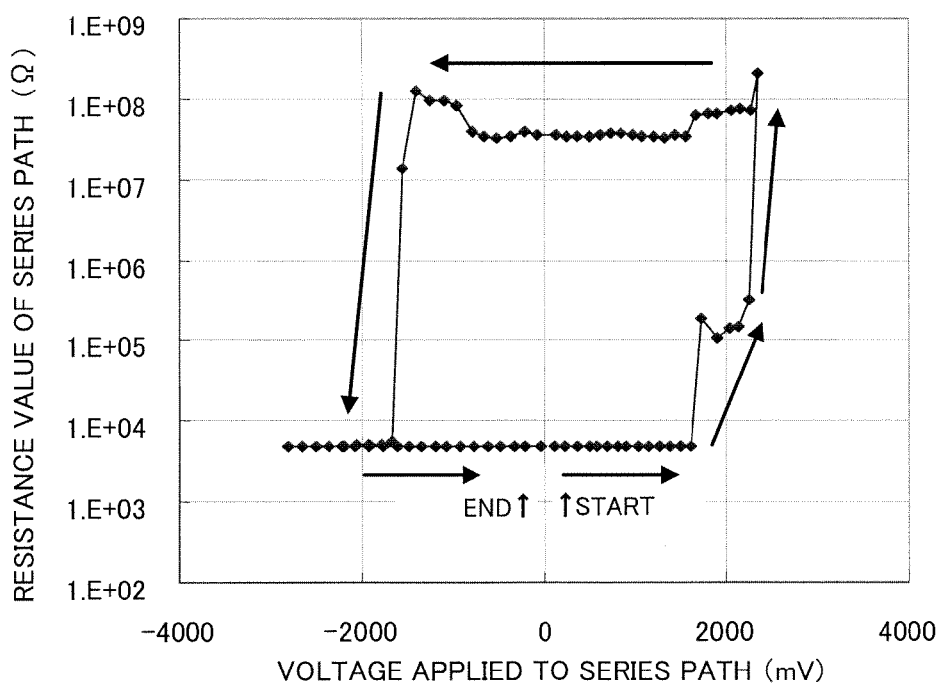
FIG. 11 is a view showing a relationship between the voltage applied to the series path and a resistance value of the series path in Experiment example 3.

FIG. 10 is a view showing a relationship between the voltage applied to the series path and the pulse current in Experiment example 3. FIG. 11 is a view showing a relationship between the voltage applied to the series path and the resistance value of the series path in Experiment example 3.

As shown in FIGS. 10 and 11, when the voltage was increased from 0V to +1.7V, the resistance value was increased from 4.7 kΩ to several hundreds kΩ. In this case, the pulse current was decreased to about 30 μA. When the voltage was further increased, the current started flowing abruptly and the pulse current reached 200 μA when the voltage was about +2.4V. Immediately after this, the resistance value exceeded 100 MΩ, and the resistance variable element changed into a super-high resistance state. The resistance values of FIG. 10 were apparently different from the resistance values of FIG. 11. This was because the resistance values in FIG. 11 were all resistance values occurring when 400 mV was applied. As described later, the resistance variable element in the high-resistance state (RH) has a nonlinear voltage-current characteristic. In the examples of FIGS. 10 and 11, when the voltage was decreased thereafter, the resistance values returned again to 4.7 kΩ at −1.7V, but some samples could not return to RL like the example of FIG. 9.

Experiment Example 4

Solution to Problem Occurring in Experiment Example 2

In Experiment example 4, using the same samples as those in Experiment example 2, the characteristic of the resistance variable element was measured in a similar experiment method except that the gate voltage of the transistor was decreased to +2.6V only when the resistance variable element changed to the high-resistance state (positive pulse was applied). The gate voltage of the transistor was set to +3.0V when the resistance variable element changed to the low-resistance state (negative pulse was applied).

Figure 12:
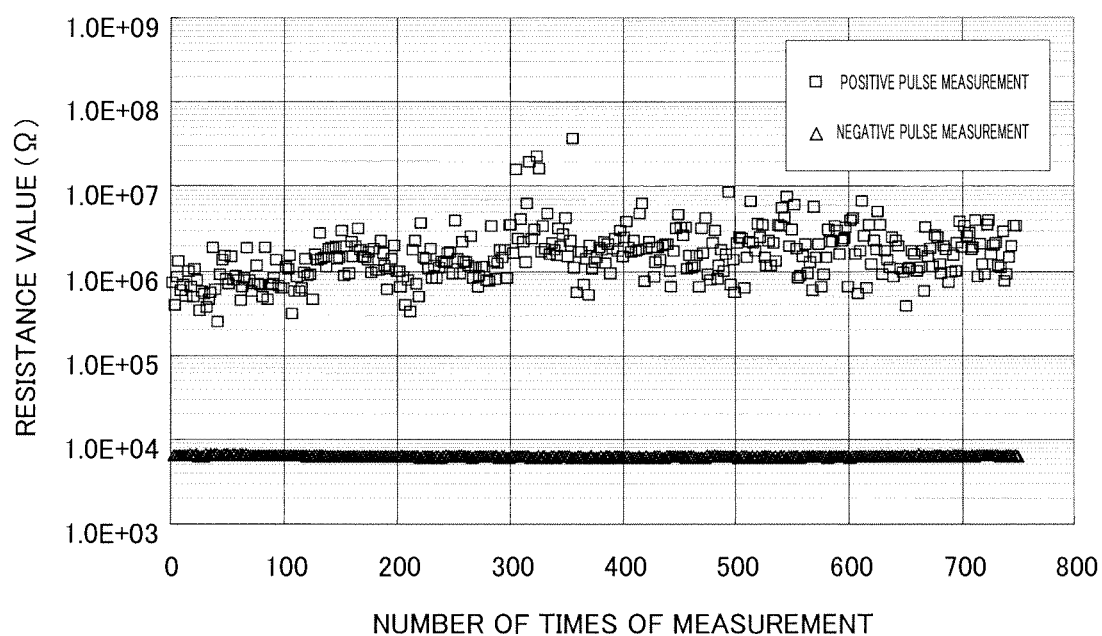
FIG. 12 is a view showing a resistance changing characteristic of a resistance variable element in Experiment example 4.

FIG. 12 is a view showing a resistance changing characteristic of the resistance variable element in Experiment example 4. As can be clearly seen from FIG. 12, even when the number of times of electric pulse application exceeded 700, the resistance variable element continued to change reversibly between RH (high-resistance state) and RL (low-resistance state). The resistance value of the resistance variable element in RH (high-resistance state) which was read in response to a read voltage was about $10^7 \Omega$ in Experiment example 2, while the resistance value which was read in response to a read voltage was about $10^6 \Omega$ in Experiment example 4. Thus, in Experiment example 4, the resistance value was one-digit lower than in Experiment example 2.

As can be seen from result of Experiment example 4, it was presumed that by increasing the resistance (ON-resistance of the transistor) of the load resistor connected to the resistance variable element, the problem occurring in Experiment example 2 could be solved.

Experiment Example 5

Voltage-Current Characteristic of Resistance Variable Element Under Conditions of Experiment Example 4

In Experiment example 5, a voltage-current characteristic of a resistance variable element was measured with a device configuration similar to that of Experiment example 4. The gate voltage of the transistor was set to +2.6V when the resistance variable element changed to the high-resistance state (positive pulse was applied), while the gate voltage of the transistor was set to +3.0V when the resistance variable element changed to the low-resistance state (negative pulse was applied), similarly to Experiment example 4. The other conditions of experiment method were similar to those of Experiment example 3.

Figure 13:
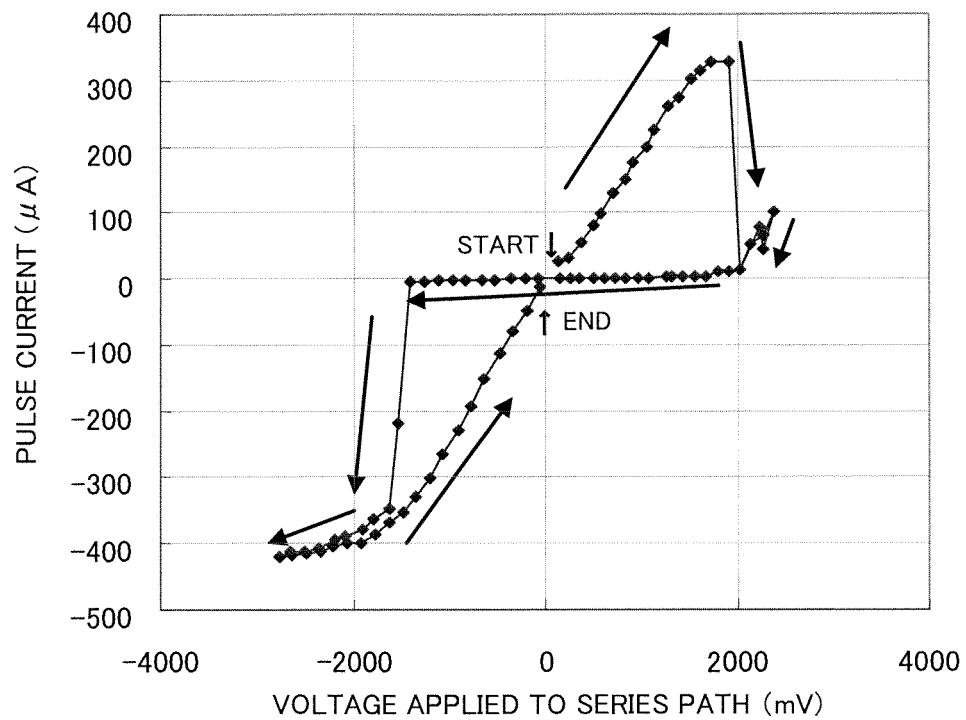
FIG. 13 is a view showing a relationship between a voltage applied to a series path and a pulse current in Experiment example 5.
Figure 14:
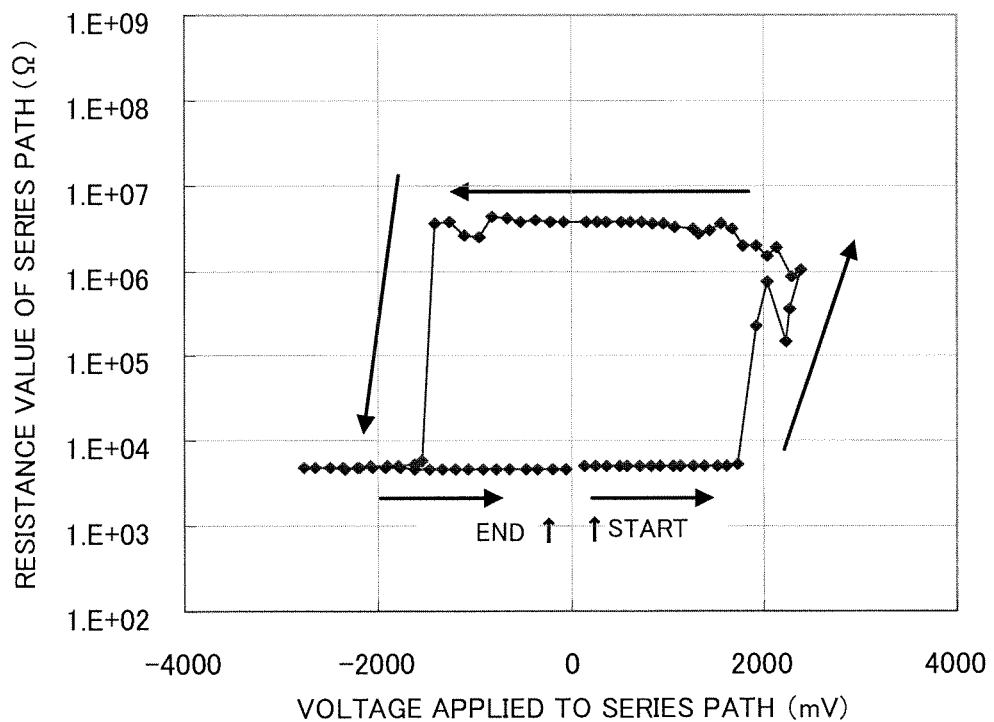
FIG. 14 is a view showing a relationship between the voltage applied to the series path and a resistance value of the series path in Experiment example 5.

FIG. 13 is a view showing a relationship between the voltage applied to the series path and the pulse current in Experiment example 5. FIG. 14 is a view showing a relationship between the voltage applied to the series path and the resistance value of the series path in Experiment example 5.

As shown in FIGS. 13 and 14, when the voltage was increased from 0V to +1.9V, the resistance value was increased from 4.7 kΩ to several hundreds kΩ. In this case, the pulse current was decreased to about several tens μA. When the voltage was further increased, a current started flowing abruptly like in Experiment example 3, but the pulse current was restricted to about 100 μA at a voltage of about +2.4V. The resistance value increased only to about several MΩ, and the resistance variable element did not change to a super-high resistance state. The resistance values of FIG. 13 were apparently different from the resistance values of FIG. 14 due to a difference in the applied voltages as described above. As described later, the resistance variable element in the high-resistance state (RH) has a nonlinear voltage-current characteristic. Thereafter, when the voltage was decreased, the resistance value returned to 4.71 kΩ again at −1.7V. It could be seen that by restricting a rapid rise of the current (characteristic in a range in which 2V was exceeded as shown in FIG. 10 or FIG. 13) due to non-linearity corresponding to the high-resistance state (RH), a phenomenon (phenomenon in FIG. 9) that the resistance values stuck to abnormally high resistance values was suppressed. Nonetheless, even in the example of FIG. 12, it was observed that the RH values fluctuated significantly, were inconstant and exceeded $10^7\Omega$ in rare cases in repeated resistance changing. The cause of this fluctuation is unclear, but an optimal condition of a restricted current value is required. This view point was clarified after more thorough study. Before explaining this, findings obtained so far will be summarized.

[Findings Obtained from Experiment Examples 1 to 5]

From the results of Experiment example 1 to Experiment example 5, the following findings were obtained.

The first finding is such that the resistance variable element (preferably, resistance variable element including transition metal oxide as a resistance variable material, more preferably, resistance variable element having a stacked structure including as a resistance variable layer a first oxide layer and a second oxide layer which are different in oxygen content) exhibits a nonlinear voltage-current characteristic (semiconductive characteristic) in the high-resistance state (RH).

The resistance variable element exhibits a high-resistance value in a low bias range (range in which an absolute value of the interelectrode voltage is small) and a low-resistance value in a high bias range (range in which an absolute value of the interelectrode voltage is large). In that sense, the current-voltage characteristic of the resistance variable element in the high-resistance state (RH) has high bias dependency.

The second finding is such that the resistance variable element transitions irreversibly to a super-high resistance state and cannot be returned to a low-resistance state (RL) unless a current amount in the high bias range is properly restricted.

From comparison between Experiment example 3 and Experiment example 5, it was presumed that the resistance variable element changed to the super-high resistance state when the amount of current in the high bias range was large in Experiment example 3. It was presumed that the problem that the resistance variable element changed irreversibly to RH (high-resistance state) occurred due to the high current in the high bias range in Experiment example 2. In contrast, it was presumed that the resistance variable element continued to change reversibly between RH (high-resistance state) and RL (low-resistance state) in Experiment example 4 due to the fact that the current was restricted by the transistor (load resistor) such that the current amount in the high bias range became small as reviewed with reference to Experiment example 5. The problem associated with Experiment example 2 can be suppressed by restricting the current when the resistance variable element changes to the high-resistance state.

Experiment Example 6

Detail of Voltage-Current Characteristic of Resistance Variable Element when Resistance Variable Element Changes to High-Resistance State In Experiment example 2 to 5, changing from RL to RH occurred sensitively in response to a change in the applied voltage, and therefore it was difficult to fully understand its course. In Experiment example 6, changing from RL to RH was studied carefully using the transistor B (see FIG. 8, gate voltage: +4.5V) having a voltage-current characteristic rising more gradually, instead of the transistor A used in Experiment examples 2 to 5.

To be specific, a resistance variable element manufactured under the conditions identical to those for the sample B in Experiment example 1 was incorporated into a circuit configuration similar to that of FIG. 1, and its resistance state was changed. As the transistor, the transistor B in FIG. 8 was used. An electric pulse was applied to a series path with respect to a resistance variable element in a low-resistance state (resistance value 10 kΩ) while increasing the voltage gradually from 0V. At a time point when the resistance value (element DC resistance value) of the series path changed five times or more, the voltage was caused to stop increasing (this was one set). The electric pulse was applied to the series path while increasing the voltage gradually from 0V again (this was next set). The application method of the electric pulses, definition of the voltage polarities, the measurement method of the resistance values were similar to those in Experiment example 2 and Experiment example 3.

Figure 16:
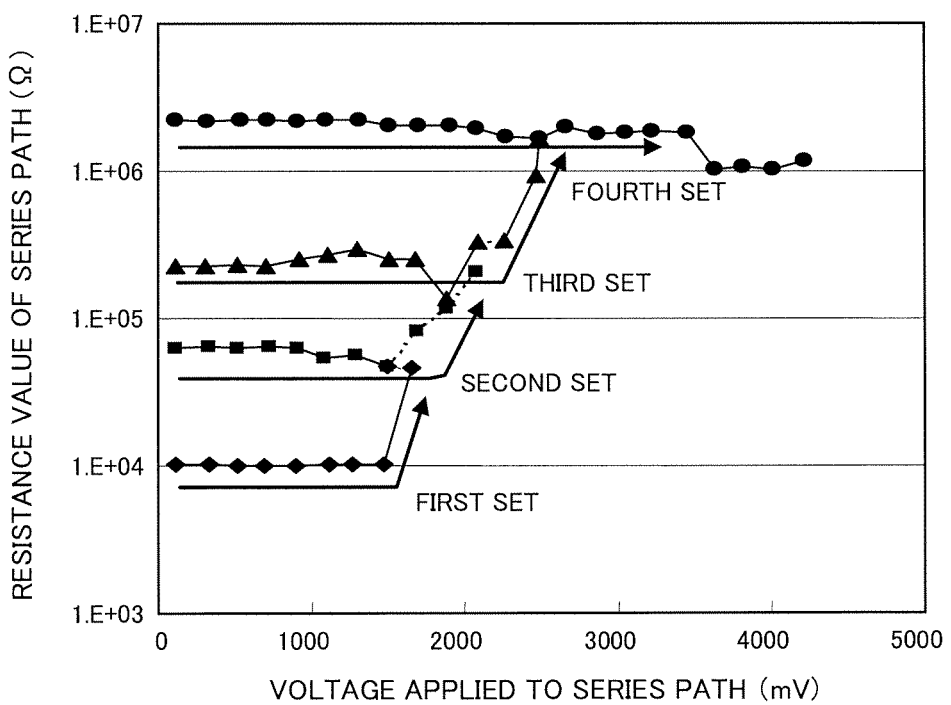
FIG. 16 is a view showing a relationship between the voltage applied to the series path and a resistance value of the series path in Experiment example 6.

FIG. 15 is a view showing a relationship between the voltage applied to the series path and the pulse current in Experiment example 6. FIG. 16 is a view showing a relationship between the voltage applied to the series path and the resistance value (element DC resistance value) of the series path in Experiment example 6. Data in first set are depicted as black lozenges (♦), data in second set are depicted as black rectangles (■), data in third set are depicted as black triangles (▲), and data in fourth set are depicted as black circles (●). In FIG. 15, white rectangles (□) and white triangles (Δ) indicate current values (values obtained by extrapolation of former-half values of pulse widths from actual measurement points) before the resistance states changed when the electric pulses were applied, and black rectangles (■) and black triangles (▲) indicate current values (values at terminal ends of the pulse widths) after the resistances state changed when the electric pulses were applied.

FIG. 17 is a view showing a relationship between an interelectrode voltage and a pulse current in Experiment example 6. The interelectrode voltage was obtained in such a manner that a pulse voltage-current characteristic of a transistor simulated using a computer was calculated preliminary, a voltage drop amount due to ON-resistance of the transistor was obtained from a measured current value, and then the voltage drop amount was subtracted from the voltage applied to the series path.

As shown in FIGS. 16 and 17, in the first set, the resistance variable element in RL (resistance value: 10 kΩ) started increasing its resistance value when a current (equal to interelectrode current, hereinafter the same occurs in Experiment example 6) exceeded 180 μA. The resistance value stopped increasing at a time point when a current reached 60~70 μA.

In the second set, the resistance value started increasing again when the current amount was 80~90 μA (substantially value on $I_{startline}$) which was larger than the above mentioned 60~70 μA because of a step amount of a voltage increase. The resistance value stopped increasing at a time point when the current reached 60~70 μA again. In the second set, the operation was repeated as follows: the current increased and reached 80~90 μA→the resistance value increased the current decreased and reached 60~70 μA→the resistance value stopped increasing. In the third set, the same operation occurred. From the above, it was found out that the resistance variable element has a characteristic in which increasing of the resistance value did not progress unless the current was 60~70 μA or higher. The current value of 60~70 μA was $I_{lim}$. Conversely, it was considered that the resistance value started increasing if the current was a little higher than $I_{lim}$. In this measurement, the current value was 80~90 μA according to the relation of a step amount of a voltage increase, but was depicted as $I_{start}$ for the sake of convenience of explanation.

In the fourth set, when the interelectrode voltage reached +3V, the current was flowed such that the interelectrode voltage was maintained at +3V. In other words, it was revealed that the resistance variable element had a characteristic similar to that of Zener diode in which its breakdown voltage was +3V.

Here it is assumed that the voltage applied to the series path is further increased in a state where the interelectrode voltages has reached +3V. In this case, the voltage fed to the resistance variable element remains unchanged and is +3V. Therefore, only the voltage fed to the load resistor increases, and the current value increases correspondingly. It is presumed that the resistance variable element transitions to a super-high resistance state or an insulation breakdown will occur if an excess current flows therethrough.

FIGS. 18~21 are schematic views each showing a relationship between the current and voltage division between the load resistor (transistor in Experiment example 6) and the resistance variable element. In these Figures, with the characteristic (solid line) of the transistor fixed, the characteristic (broken line) of the resistance variable element is depicted with an opposite direction from a point at which the voltage is applied to the series path. An intersection of the solid line and the broken line is a current value actually implemented. A voltage having a value at the intersection is a voltage to be fed to the transistor and a voltage having a value obtained by subtracting the value of the voltage to be fed to the transistor from the value of the voltage applied to the series path is a voltage to be fed to the resistance variable element.

Figure 18:
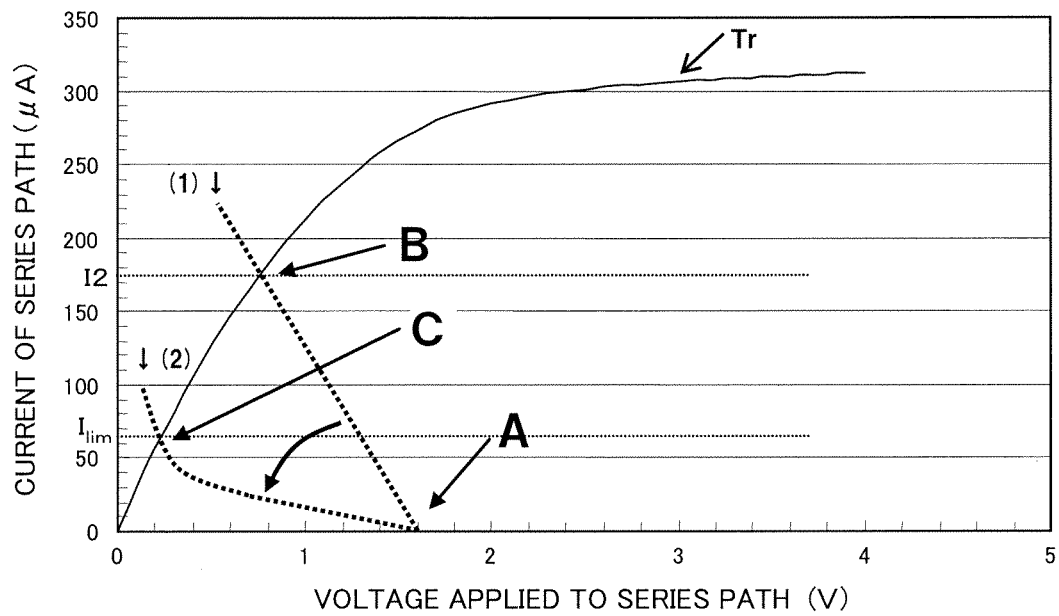
FIG. 18 is a schematic view showing how a resistance variable element changes from a first characteristic (RL) to a second characteristic.

FIG. 18 is a schematic view showing how the resistance variable element changes from a first characteristic (RL) to a second characteristic. As shown in FIG. 18, when the voltage applied to the series path reaches +1.6V (A in FIG. 18) in a case where the resistance variable element is in the first characteristic ((1) in FIG. 18) which is RL, the current flowing through the series path reaches 180 μA, and the resistance value of the resistance variable element starts increasing (B in FIG. 18). When the current decreases to 60~70 μA ($I_{lim}$), the resistance value stops increasing (C in FIG. 18), and the resistance variable element is caused to have the second characteristic ((2) in FIG. 18).

Figure 19:
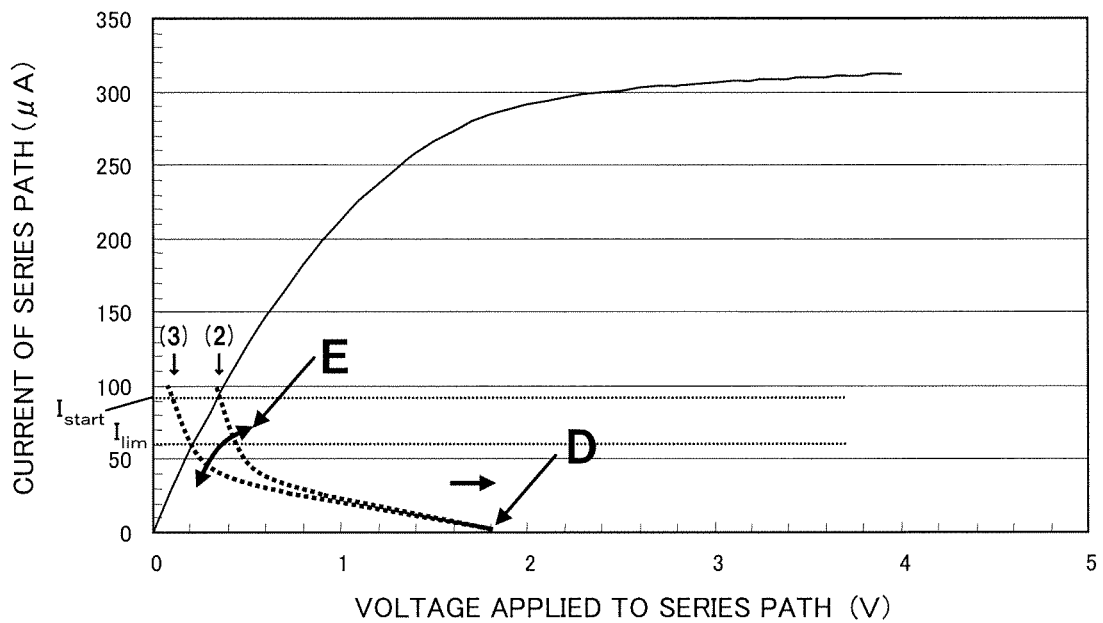
FIG. 19 is a schematic view showing how the resistance variable element changes from the second characteristic to a third characteristic.

FIG. 19 is a schematic view showing how the resistance variable element changes from the second characteristic to a third characteristic. As shown in FIG. 19, when the voltage applied to the series path is increased by one step voltage amount in the state where the resistance variable element is in the second characteristic and reaches, for example, +1.8V (D in FIG. 19), and the current flowing through the series path reaches 80~90 μA ($I_{start}$), the resistance value of the resistance variable element starts increasing. When the current decreases to 60~70 μA, the resistance value stops increasing and the resistance variable element is caused to have the third characteristic ((3) in FIG. 19). That is, the resistance value increases while a phenomenon that the current increases with an increases in the applied voltage and then decreases is repeated (E in FIG. 19).

Figure 20:
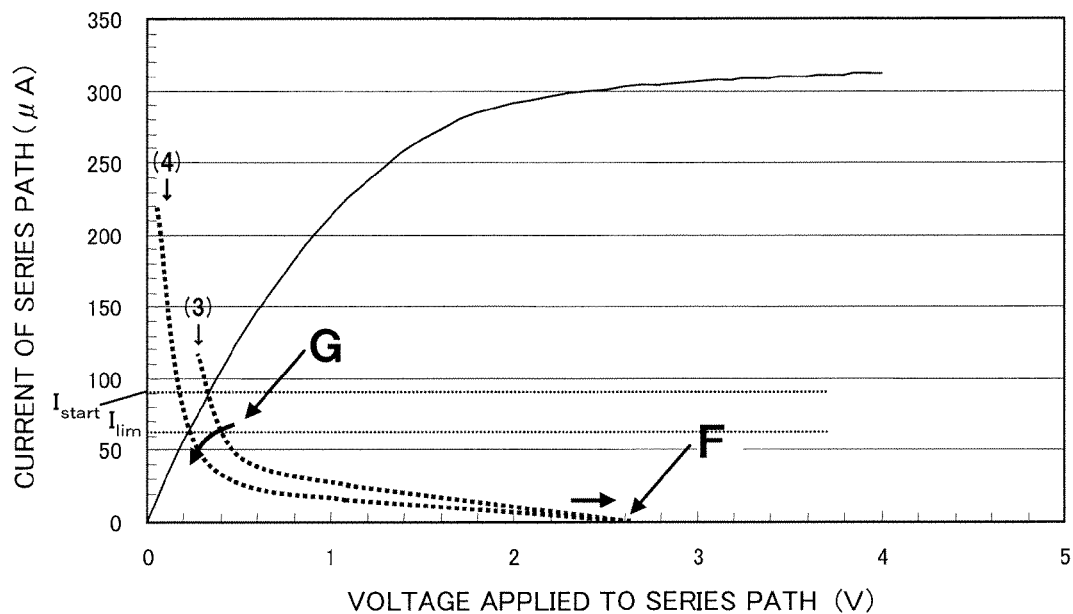
FIG. 20 is a schematic view showing how the resistance variable element changes from the third characteristic to a fourth characteristic.

FIG. 20 is a schematic view showing how the resistance variable element changes from the third characteristic to a fourth characteristic. As shown in FIG. 20, when the voltage applied to the series path is increased in a state where the resistance variable element is in the third characteristic, the current flowing through the series path reaches 80~90 μA and the resistance value of the resistance variable element starts increasing at a point (F in FIG. 20) when the applied voltages reaches +2.6V. When the current decreases to 60~70 μA, the resistance value stops increasing and the resistance variable element is caused to have a fourth characteristic ((4) in FIG. 20). The fourth characteristic is a final stage of resistance increasing, at which stage, the resistance variable element is in a high-resistance state in which the resistance value will not change to a higher one any more. At this stage, the resistance variable element has a characteristic similar to that of Zener diode in which when the interelectrode voltage reaches a predetermined value, a current is flowed therethrough such that that voltage is maintained.

Figure 21:
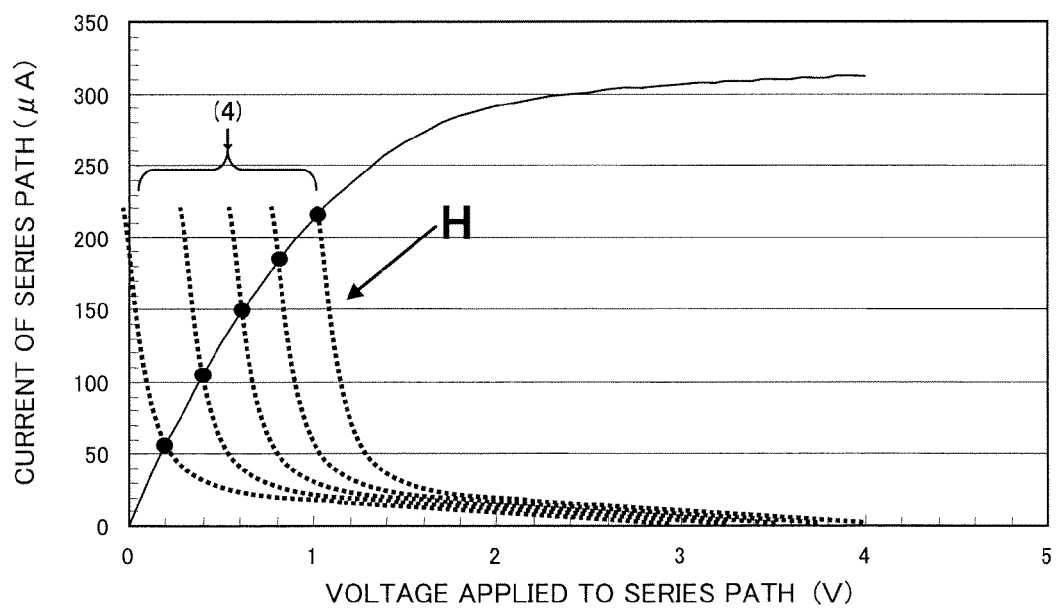
FIG. 21 is a schematic view showing a state where the voltage applied to the series path is further raised after the resistance variable element reaches the fourth characteristic.

FIG. 21 is a schematic view showing a state where the voltage applied to the series path is further increased after the resistance variable element has reached the fourth characteristic. As shown in FIG. 21, the resistance variable element has a characteristic similar to that of Zener diode. This characteristic is somewhat stable and remains unchanged unless the resistance variable element becomes a super-high resistance state or is broken down because a current which is much higher than $I_{start}$ flows through the element. With an increase in the voltage applied to the series path, the interelectrode voltage is fixed at +3V but the voltage fed to the transistor increases, so that the current increases. If the voltage-current characteristic of the transistor rises (slopes) steeply near 0V (e.g., characteristic similar to that of the transistor A of FIG. 8), a high current flows through the series path momentarily, causing the resistance variable element to change to a super-high resistance state or to change to an abnormally low resistance state due to insulation breakdown. Once the resistance variable element has changed to the super-high resistance state, it will not be able to return to the low-resistance state in some occasions. In other words, the resistance state of the resistance variable element changes irreversibly due to a high current flowing therethrough, and the resistance variable element will fail to function as a memory element.

In other words, when the resistance variable element reaches the fourth characteristic in which the resistance variable element will not increase its resistance value any more and exhibits highest RH, it is not necessary to flow a current in a range which is not lower than the interelectrode voltage (RH breakdown voltage described later: corresponding to V3 in FIG. 17) at which a current flows abruptly. However, since it is necessary to change the resistance variable element to a target highest RH at the RH breakdown voltage or lower, a current which is not lower than the above $I_{lim}$ is preferably flowed. This is an optimal condition for restricting the current in RH. The value of the RH breakdown voltage and the value of $I_{lim}$ seem to be varied according to the thickness of the second oxide layer of the resistance variable element, the size of the element, the composition and material of the resistance variable layer, etc. That is, the value of the RH breakdown voltage and the value of $I_{lim}$ are roughly determined uniquely by the configuration of the element but are not limited. As can be seen from the experiments described above, the values unique to the elements for use in the nonvolatile memory device can be measured and can be derived as the condition values of the load resistor. Since numerous elements are incorporated into the nonvolatile memory device, there are variations in the values of the RH breakdown voltage and the values of $I_{lim}$ because of a variation in quality of the elements, etc. To be more practical, it is more preferred that variation characteristics of the values of the RH breakdown voltage and the values of $I_{lim}$ are measured and the characteristic of the load resistor is not higher than an intersection of the lower limit of the RH breakdown voltage obtained by multiplying a sufficient safety coefficient and the upper limit of $I_{lim}$ obtained by multiplying a sufficient safety coefficient.

As should be understood from the above, one characteristic condition (characteristic condition of the load resistor derived from the state after the resistance variable element has changed to RH) of characteristic conditions of the load resistor when the resistance variable element changes from RL to RH can be decided. However, the other condition, i.e., characteristic condition of the load resistor before the resistance variable element changes to RH is not decided yet. To clarify this, the following experiments will be described.

Experiment Example 7

Study of Difference in Current Value (I2) at which Resistance Value Starts Increasing from RL As shown in FIGS. 10 and 13, the current value (I2) at which the resistance value started increasing from RL was about 350 µA when the transistor A was used as the load resistor, while as shown in FIGS. 15 and 17, the current value I2 was about 180 µA when the transistor B was used as the load resistor.

In Experiment example 7, the reason why the above difference in I2 occurred due to a difference in the transistor was studied. To be specific, the voltage-current characteristic of the resistance variable element was measured using the same device configuration and condition as those in Experiment example 3 except that the transistor B (gate voltage was +4.5V) was used as the transistor, the voltage application started from a negative voltage side, and a voltage changing magnitude was different.

Hereinafter, a decreasing course (low-resistance attaining course) of the resistance value from RH will be described prior to conditions for starting increasing of the resistance value (changing to the high-resistance state) from RL will be described.

Figure 22:
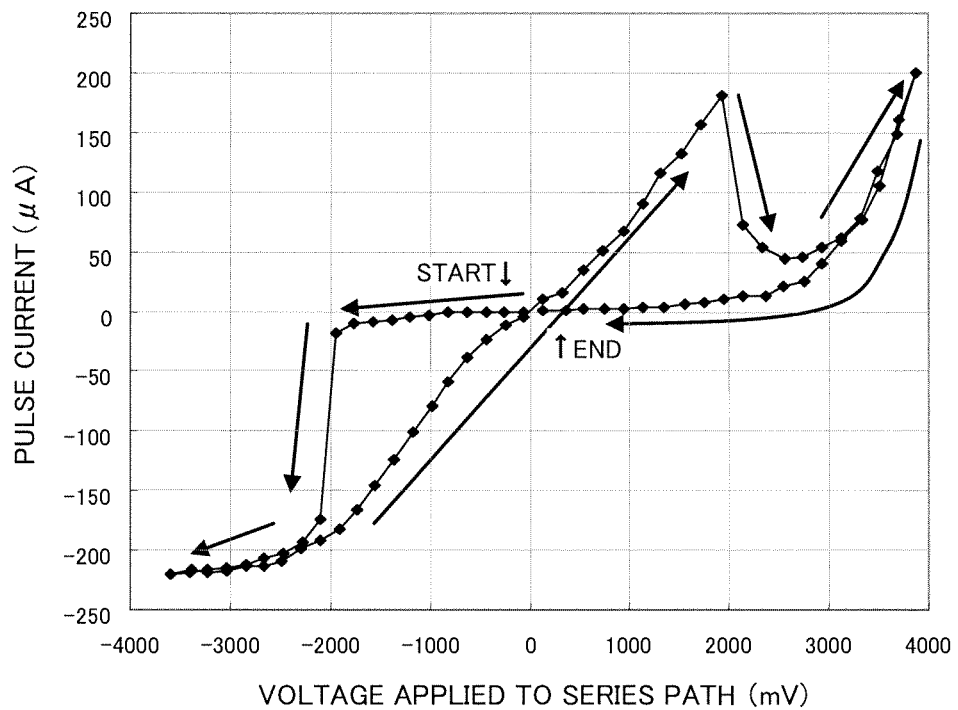
FIG. 22 is a view showing a relationship between a voltage applied to a series path and a pulse current in Experiment example 7.
Figure 23:
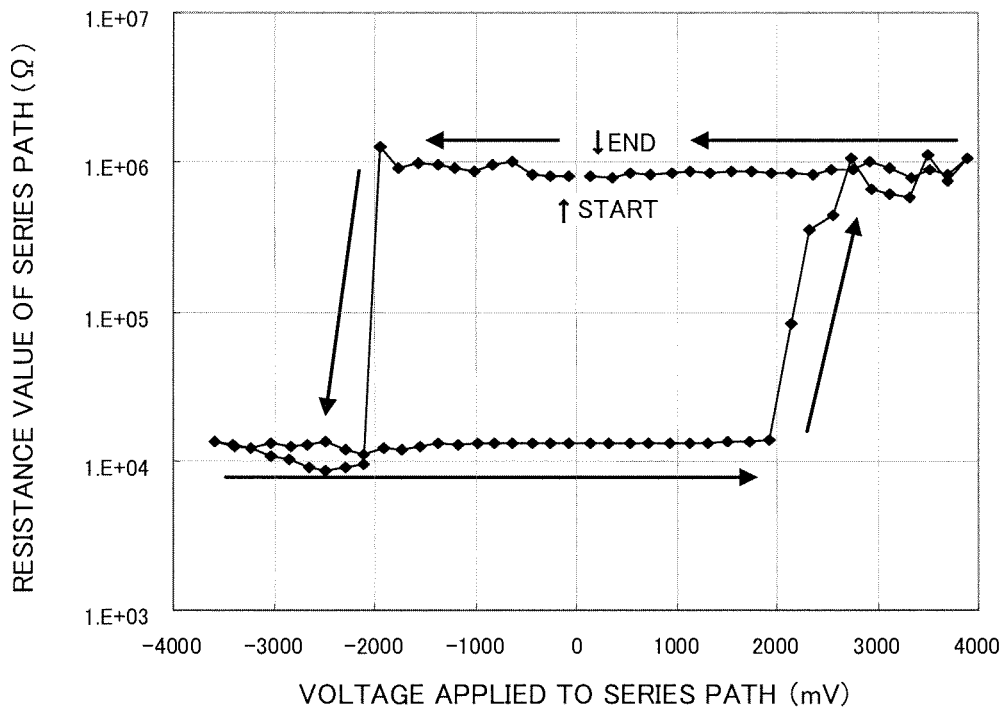
FIG. 23 is a view showing a relationship between the voltage applied to the series path and a resistance value of the series path in Experiment example 7.

FIG. 22 is a view showing a relationship between the voltage applied to the series path and the pulse current in Experiment example 7. FIG. 23 is a view showing a relationship between the voltage applied to the series path and the resistance value of the series path in Experiment example 7.

As shown in FIGS. 22 and 23, when the voltage was decreased from 0V to −2V, the resistance state changed from RH to RL. After that, when the voltage was increased up to +2V, the resistance state changed from RL to RH. After that, when the voltage was further increased, a current started flowing abruptly, and a pulse current reached 200 µA when the voltage was about +4V. However, the resistance value did not increase any more after it reached about 1 MΩ. The resistance values of FIG. 22 were apparently different from the resistance values of FIG. 23 due to the fact that the voltages were different and the resistance variable element had a nonlinear voltage-current characteristic.

Figure 24:
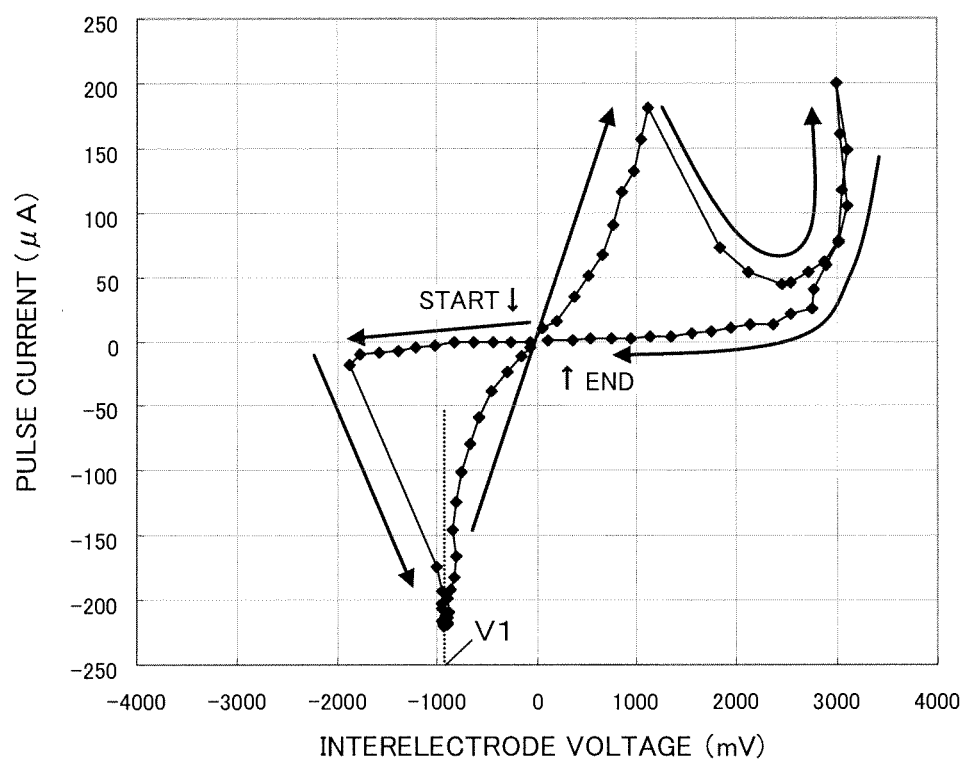
FIG. 24 is a view showing a relationship between an interelectrode voltage and the pulse current in Experiment example 7.

FIG. 24 is a view showing a relationship between the interelectrode voltage and the pulse current in Experiment example 7. The interelectrode voltage was measured in a method similar to that used in Experiment example 6.

Figure 25:
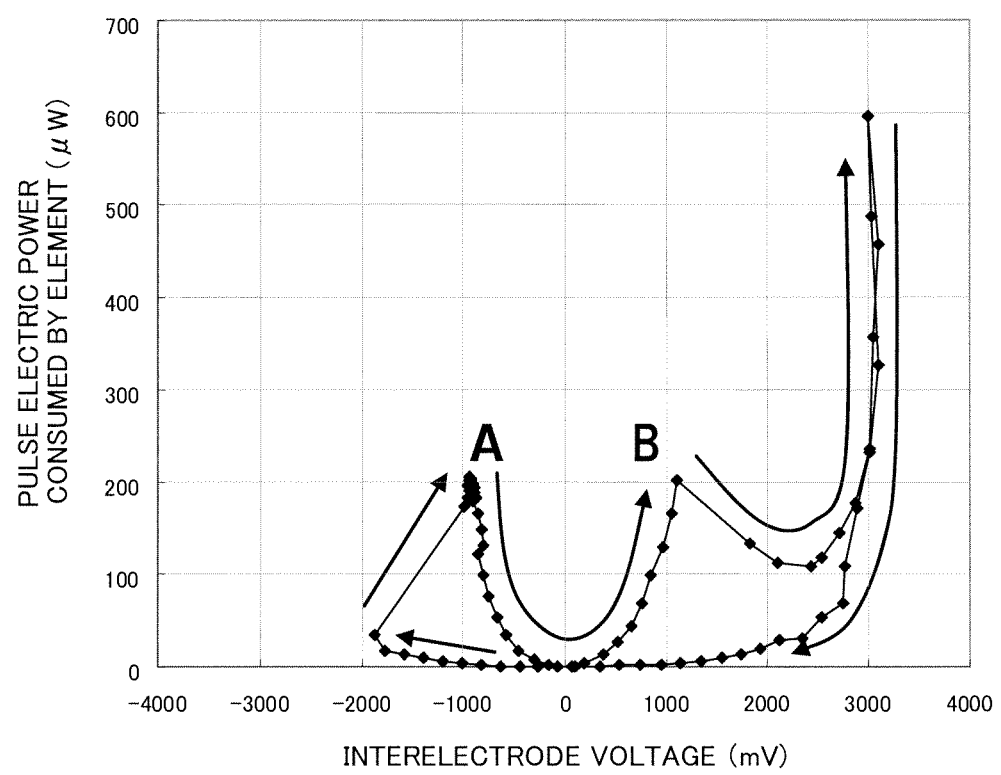
FIG. 25 is a view showing a relationship between the interelectrode voltage and a pulse electric power consumed by the element in Experiment example 7.

When comparison was made between FIG. 22 and FIG. 10, currents just before the resistance variable element started changing from RL to RH were 180 µA as shown in FIG. 22 and 350 µA as shown in FIG. 10, respectively, which was a significant difference, although the same structure was used. However, when comparison was made between the currents in FIG. 22, i.e., the current just before the resistance variable element started changing from RL to RH was 180 µA and the current with which the resistance variable element reached RL was −220 µA, and these values were close to each other in absolute value. Likewise, in the example in FIG. 10, the currents were 350 µA and 400 µA and were relatively close to each other. From this, it might be presumed that changing from RL to RH depended on the characteristic of RL. This dependency was further clarified with reference to the relationship between the interelectrode voltage and the electric power consumed by the element (product of interelectrode voltage and element current) in Experiment example 7 as shown in FIG. 25. As can be clearly seen from FIG. 25, the element started changing from RL to RH when electric power consumed by the element was about 200 µW, which was equal in amount to a maximum electric power fed to the element when the element completed changing from RH to RL. In other words, when the electric power which was equal in amount to or larger in amount than the maximum electric power fed when the element changed to RL was fed to the element in an opposite direction, the resistance variable element started changing from RL to RH. That is, the condition for changing from RL to RH depended on the characteristic of RL.

Now, how the characteristic of RL is determined will be described.

With reference to FIG. 24, which particularly pays attention to the interelectrode voltage, it is notable that a point at which the element starts changing from RL to RH and a point at which the element reaches RL are substantially symmetric with respect to zero position. This means that the voltage-current characteristic of the element in RL (low-resistance state) is substantially symmetric between a positive polarity and a negative polarity. It is observed that the voltage is restricted to about −1V and the current is restricted to about −220 µA when the element reaches RL. Therefore, there may be possibilities that the characteristic of RL is restricted by the voltage applied to the element, the characteristic of RL is restricted by the amount of the current flowed through the element, and further, the characteristic of RL is restricted by an electric power which is a product of the voltage and the current. Therefore, three parameters which are the interelectrode voltage, the pulse current and the electric power consumed by the element were individually studied and were studied with reference to FIG. 26 from simulation and actual measurement.

Figure 26:
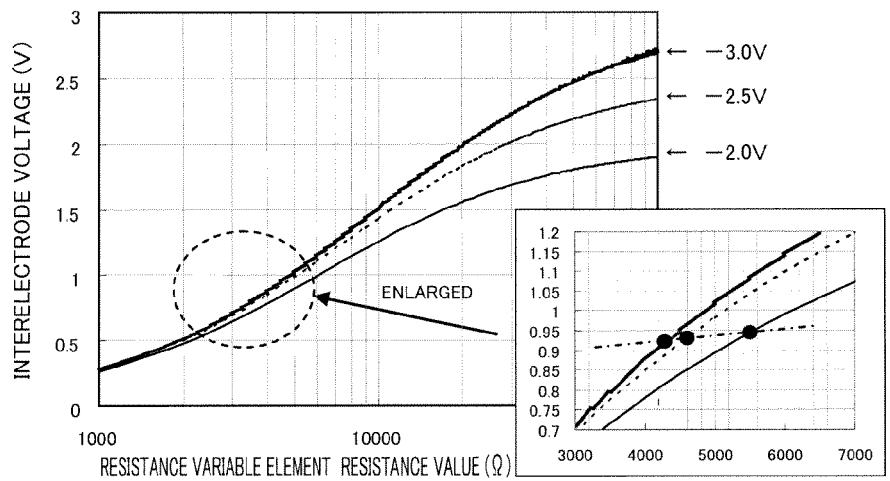
Figure 26:
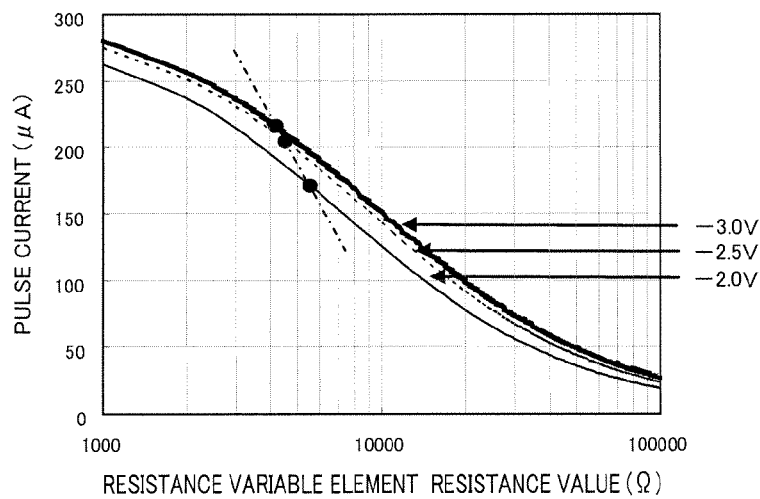
Figure 26:
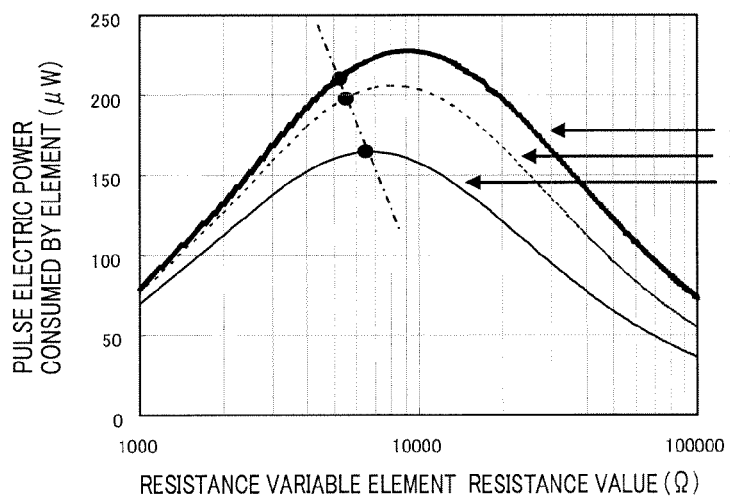

FIG. 26 is a view showing simulated plots of changes in the parameters occurring due to a divided voltage relationship between the resistance variable element and the transistor, when the transistor B is used, and the resistance of the resistance variable element changed from 100 kΩ to 1 kΩ by applying pulse voltages of −2.0V, −2.5V and −3.0V to the series path, in which FIG. 26(a) is a view in which a vertical axis indicates an absolute value of the interelectrode voltage, FIG. 26(b) is a view in which a vertical axis indicates an absolute value of the pulse current, and FIG. 26(c) is a view in which a vertical axis indicates the electric power consumed by the element. In these Figures, black circles (●) indicate actual measurement values in RL.

With reference to FIG. 26(b), actual measurement values of the currents of the resistance variable elements in RL (low-resistance state) were 180 μA, 210 μA, and 220 μA when the voltages applied between the both ends of the memory cell were −2V, −2.5V and −3.0V, respectively, and there was a tendency that the current increased according to an increase in the absolute value of the applied voltage. It can be seen that a more element current could be flowed in amount if the resistance of the resistance variable element was further reduced. As can be seen, an event that the current was restricted by external factors (e.g., electric driving method, etc) and thereby transitioning to the low-resistance state stopped, did not occur.

With reference to FIG. 26(c), a peak of electric power consumption amount appeared in every applied voltage. However, the actual measurement values deviated from the peak values. The fed electric power increased when the voltages applied to the series path were, for example, −2.5V and −3.0V which were larger in absolute value than −2.0V. Therefore, there was no tendency that the transitioning to the low-resistance was restricted by the electric power consumption.

As can be clearly seen from plotted measurement values in cases where the voltages applied to the series path were −2.0V. −2.5V and −3.0V, respectively, the voltages applied between the both ends were substantially constant and fixed as 0.9~0.95V. This voltage value was a low-resistance state attaining limit voltage (first voltage: V1). It could be seen that the resistance variable element had a characteristic in which the resistance value and current of the resistance variable element in RL (low-resistance state) were determined by the interelectrode voltage (electric field), and the resistance value did not further decrease any more when the interelectrode voltage was lower than V1.

Figure 27:
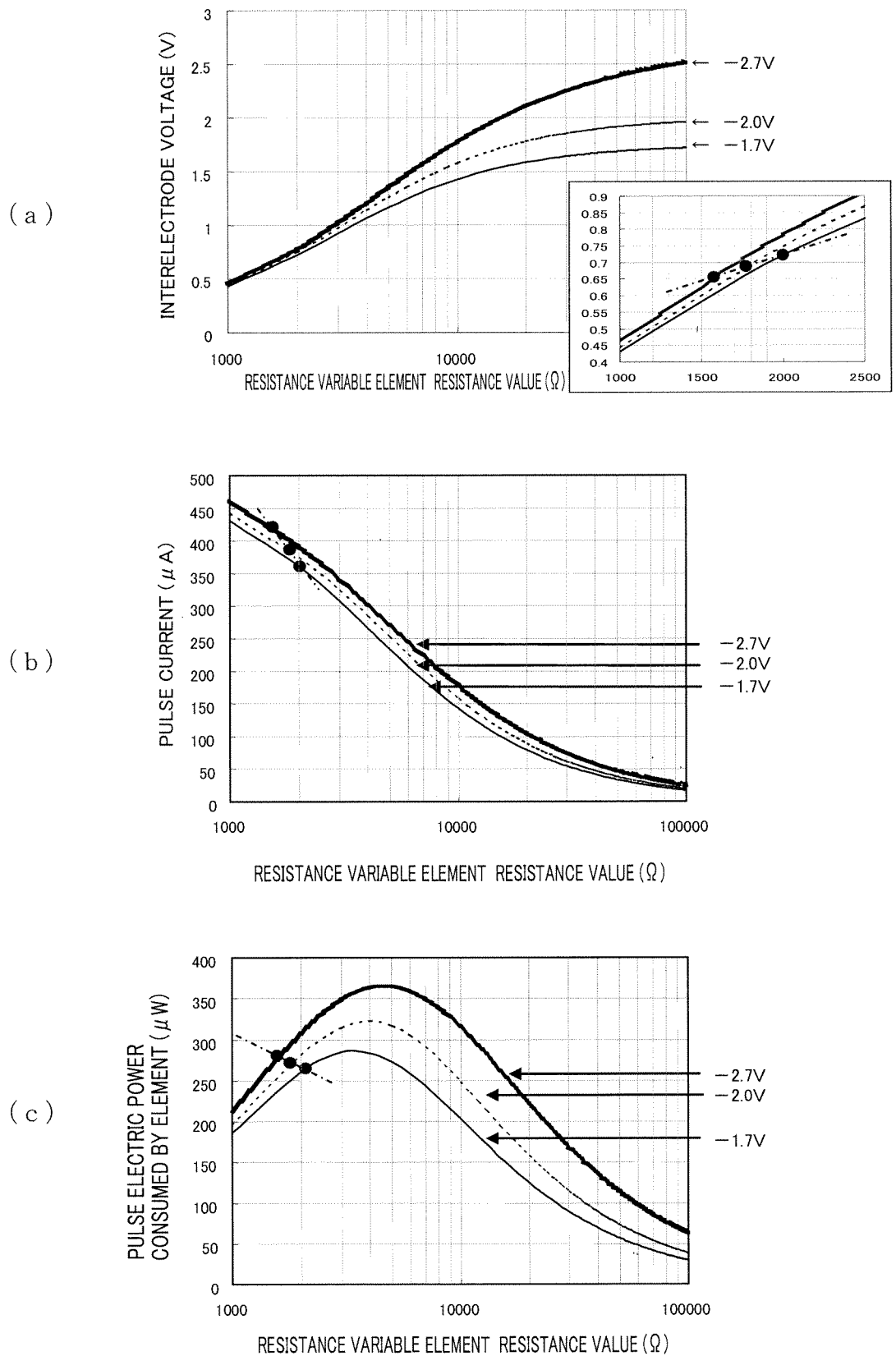

FIG. 27 is a view showing simulated plots of changes in the parameters occurring due to a divided voltage relationship between the resistance variable element and the transistor, when the transistor type A is used, and the resistance of the resistance variable element changes from 100 kΩ to 1 kΩ by applying pulse voltages of −1.7V, −2.0V and −2.7V to the series path, in which FIG. 27(a) is a view in which a vertical axis indicates an absolute value of an interelectrode voltage, FIG. 27(b) is a view in which a vertical axis indicates an absolute value of a pulse current, and FIG. 27(c) is a view in which a vertical axis indicates electric power consumed by the element. In these Figures, black circles (●) indicate actual measurement values in RL.

The tendency shown in FIG. 27 is similar to that shown in FIG. 26. That is, the interelectrode voltage corresponding to RL (low-resistance state) was substantially constant.

It should be notable that as shown in FIG. 27, the low-resistance state attaining limit voltage (first voltage: V1) was 0.65~0.75V and was lower than that shown in FIG. 26 by about 0.2V. Such a difference was presumed as a variation originated in the manufacturing process of the resistance variable elements. Therefore, at a design stage, V1 is determined as a unique value according to the structure of the resistance variable layer, composition of the resistance variable layer, the element structure in the resistance variable element, and the like.

The current value (or resistance value which the resistance variable element in RL may take when the interelectrode voltage is V1) just after the resistance variable element has changed to RL, is determined by the voltage-current characteristic of the load resistor connected in series with the resistance variable element. The current amount of the load resistor at a voltage of a value (VP1−V1) obtained by subtracting V1 from the voltage (VP1) applied to the series path is a current corresponding to RL. The resistance value of the resistance variable element in RL is determined by this current amount and the voltage V1 applied to the resistance variable element.

Figure 28:
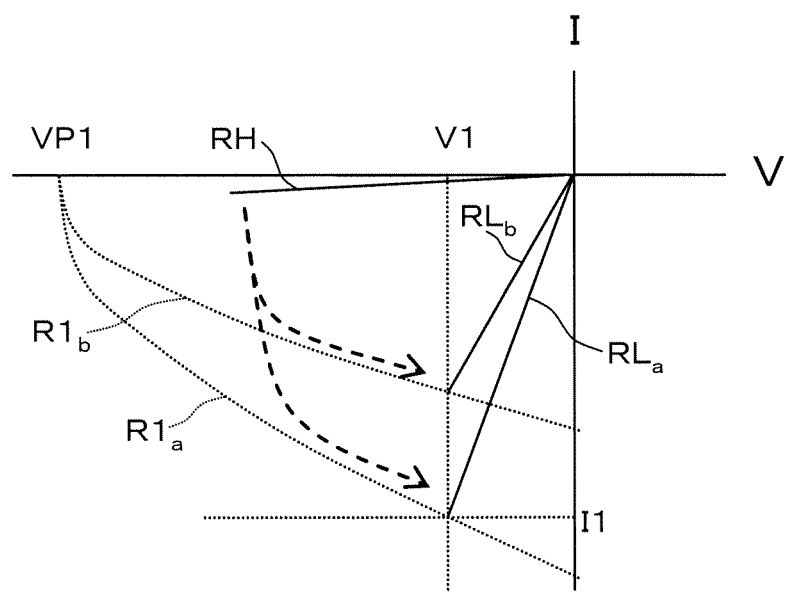
FIG. 28 is a conceptual view showing a voltage compliance when the resistance variable element changes from RH to RL.

FIG. 28 is a conceptual view showing a voltage compliance when the resistance variable element changes from RH to RL. FIG. 28 shows a composition of a negative voltage-current characteristic (solid line) of the resistance variable element and a load curve (broken line) of the transistor.

As shown in FIG. 28, the resistance value of the resistance variable element does not decrease (the resistance variable element does not change to the low-resistance state) unless the voltage is leftward (larger in absolute value of voltage) relative to V1. The resistance variable element which has been in RH (high-resistance state) changes to the low-resistance state through a route indicated by a broken line arrow and completes changing to the low-resistance state when an intersection of a load curve (R1a) of the transistor A and a line V=V1 is reached or an intersection of a load curve (R1b) of the transistor B and the line V=V1 is reached. Likewise, the resistance state (current-voltage characteristic) of the resistance variable element connected with the transistor A is RLa, and the corresponding current value reaches 350~380 μA. The resistance state (current-voltage characteristic) of the resistance variable element connected with the transistor B is RLb, and the corresponding current value is 200~230 μA. As should be understood from the above, the current value (or resistance value) of the resistance variable element in the low-resistance state (RL) is determined by the load resistance characteristic of the load resistor connected with the resistance variable element and V1.

Constriction in the process for changing the resistance variable element to the low-resistance state has been described above.

Next, a condition with which the resistance variable element starts changing from RL to RH (start changing to high-resistance state) will be reviewed.

As can be seen from FIG. 25, when an electric power is fed to the resistance variable element in RL (low-resistance state) in an opposite direction with an amount equal to an amount of a maximum electric power (in FIG. 25, point A, about 200 μW), the resistance variable element starts changing to the high-resistance state (resistance value increasing) (point B). That is, an electric power consumed by the element when changing to the high-resistance state starts is equal to an electric power consumed by the element when changing to the low-resistance state completes. The voltages are fundamentally equal and the currents are fundamentally equal if the resistance values are equal and electric powers are equal. It should be noted that the resistance variable element has a voltage-current characteristic which is slightly different between positive side application and negative side application, and therefore there is no perfect coincidence. Therefore, to be precise, the currents (absolute values) are different and the voltages (absolute values) are different between the negative side and the positive side. However, the current (absolute value) and the voltage (absolute value) just after the resistance variable element has changed to the low-resistance state are substantially close to the current (absolute value) and the voltage (absolute value) at a point when the resistance variable element starts changing to the high-resistance state, respectively. As design condition for controlling the resistance variable element, the current (absolute value) and the voltage (absolute value) just after the resistance variable element has changed to the low-resistance state are treated as being substantially equal to the current (absolute value) and the voltage (absolute value) at a point when the resistance variable element starts changing to the high-resistance state, respectively. To be specific, the voltage with which the resistance variable element starts changing to the high-resistance state is equal in absolute value to V1, and the current with which the resistance variable element starts changing to the high-resistance state is equal in absolute value to I1. Therefore, it is required that the current value in positive pulse application (in high-resistance state attaining pulse application) have an ability to exceed I1 in absolute value.

The above mentioned contents will be summarized. In addition to the above mentioned two findings, three new findings are added.

The third finding is that the resistance value of the resistance variable element does not decrease any more when the interelectrode voltage is lower than a low-resistance state attaining limit voltage (first voltage: V1). The resistance value stops decreasing (changing its resistance) at a point when the interelectrode voltage reaches V1, and the current-voltage characteristic at that point is the current-voltage characteristic corresponding to the low-resistance state (RL). The current amount (I1) at a point when the interelectrode voltage of the resistance variable element in RL reaches V1 is equal to a current amount (IR1) in a case where a voltage of ΔVP1 (=VP1−V1) is applied between the both ends of the load resistor connected to the resistance variable element. VP1 indicates the voltage applied to the series path to change the resistance variable element to the low-resistance state.

The fourth finding is that the interelectrode voltage for changing the resistance variable element from RL to RH includes a first RH attaining voltage range (RL range lower than V2, a current in a case where the interelectrode voltage is V2 is I2) before the resistance variable element starts changing from RL to RH (attaining high-resistance state), a second RH attaining voltage range (range which is not lower than V2 and lower than V3) in which the resistance variable element continues to change to the high-resistance state by flowing a current higher than the predetermined high-resistance state attaining limit current ($I_{lim}$), and a third RH attaining voltage range (range which is not lower than V3) which is higher in voltage than the second RH attaining voltage range and in which a current flows such that the interelectrode voltage is maintained at a constant voltage (V3). In order to prevent the resistance variable element from changing to a super-high resistance state or prevent insulation breakdown of the element, it is necessary to restrict a current which would abruptly increase in the third RH attaining voltage range to not higher than a predetermined threshold. To be specific, it is desirable to set a current value with which the interelectrode voltage reaches V3 to not higher than the high-resistance state attaining limit current ($I_{lim}$).

The fifth finding is such that to allow the resistance variable element to start changing from RL to RH (attaining a high-resistance state), the voltage is applied to the series path in such a manner that an electric power is equal to I1×V1, and the voltage and the current flow in opposite direction to the voltage and current flowing when attaining the low-resistance state. The current I2 at which the resistance variable element starts changing to the high-resistance state is substantially equal in absolute value to I1, and the voltage V2 at which the resistance variable element starts changing to the high-resistance state is substantially equal in absolute value to V1.

Modification Example 1

Figure 29:
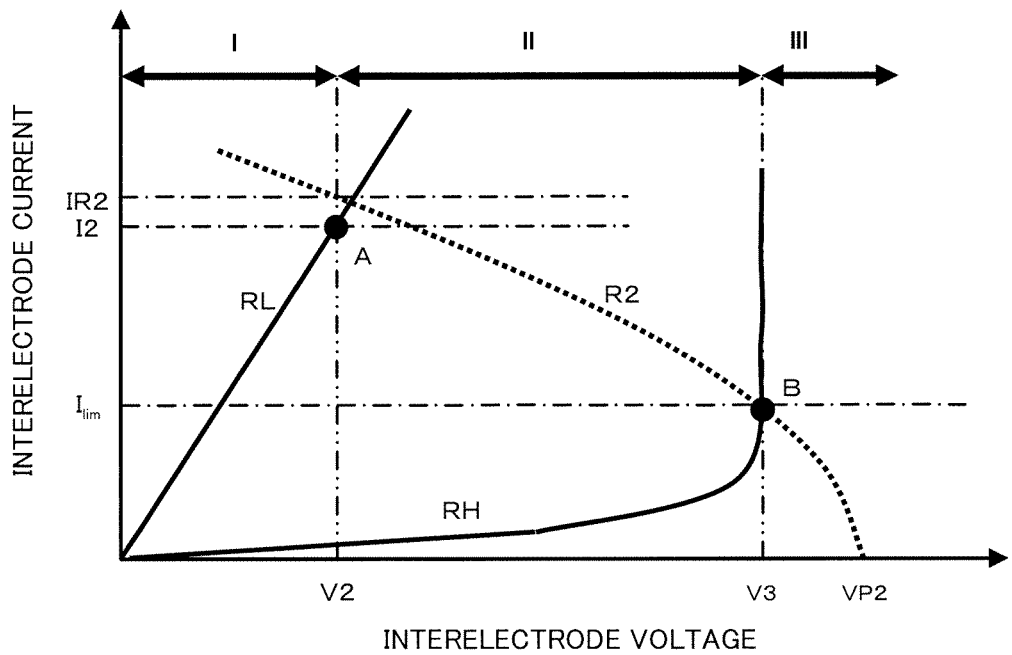
FIG. 29 is a view showing a positive voltage part extracted from FIG. 3.

FIG. 29 is a view showing only a positive voltage side extracted from FIG. 3. As shown in FIG. 29, in this embodiment, the voltage-current characteristic (load curve R2) of the load resistor was such that the current IR2 in a case where the voltage applied between the both ends was ΔVP2 (=VP2−V2) was higher than I2 (point A in FIG. 29) and was not higher than $I_{lim}$ (point B in FIG. 29) in a case where the voltage applied between the both ends was not higher than ΔVP3 (=VP2−V3). However, actually, I2 was much higher than $I_{lim}$ and it was difficult to prepare a load resistor having a load resistance characteristic meeting the above conditions with respect to a variation in memory cells in a memory array, etc. In FIG. 29, I designates the first RH attaining voltage range, II designates the second RH attaining voltage range and III indicates the third RH attaining voltage range (the same occurs in FIGS. 30 and 31).

Figure 30:
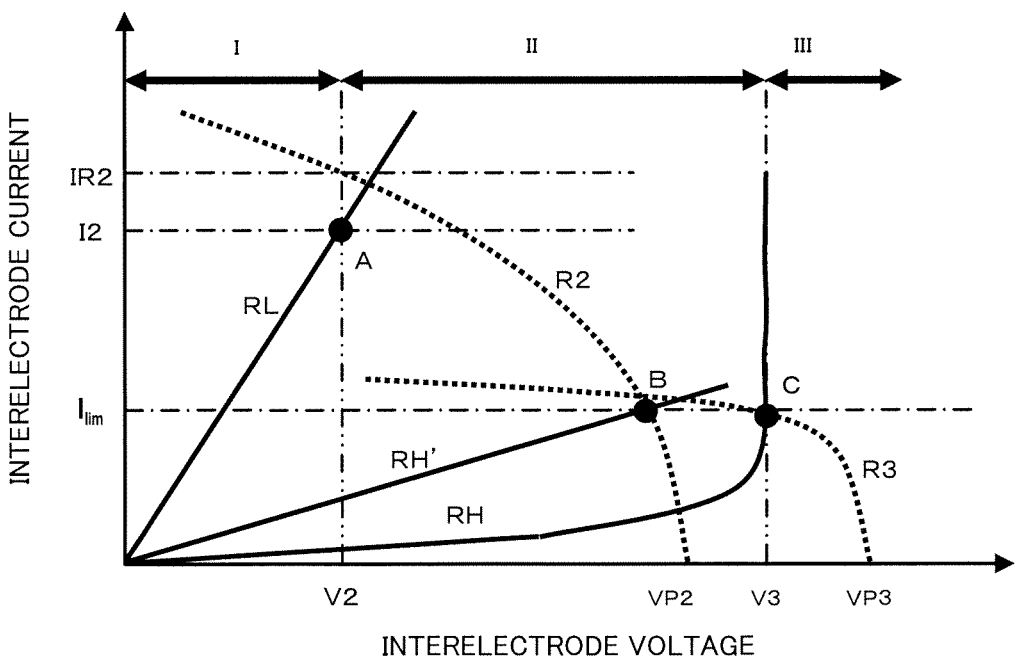
FIG. 30 is a view of a nonvolatile memory device according to Modification Example 1 of Embodiment 1 of the present invention, corresponding to FIG. 29.

FIG. 30 is a view of a nonvolatile memory device according to Modification example 1 of Embodiment 1 of the present invention, corresponding to FIG. 29. The device configuration and characteristic of the resistance variable element in Modification example 1 are as described above in Embodiment 1. In addition, a negative voltage side of FIG. 30 is similar to that of FIG. 3. But, Modification example 1 is different from Embodiment 1 in that the electric pulse application device 102 is configured to selectively output the electric pulse of VP1, the electric pulse of VP2 which is different in polarity from VP1, or an electric pulse of a third applied voltage (VP3 in the example of FIG. 30, hereinafter expressed as VP3 for the sake of convenience of explanation) which is different in polarity from VP1.

As shown in FIGS. 3 and 30, in Modification Example 1, when the electric pulse application device 102 applies the electric pulse of VP2 to the series path 130, the resistance variable layer 126 changes from RL to a third resistance state (in the example in FIG. 30, RH', hereinafter expressed as RH' for the sake of convenience of explanation) having a current-voltage characteristic which is lower in resistance value than RH and higher in resistance value than RL when comparison is made for the resistance values (e.g., resistance values corresponding to interelectrode voltage=V2) corresponding to an equal interelectrode voltage (point A→point B in FIGS. 3 and 30). VP2 indicates the voltage applied to the series path when the resistance variable element is caused to start changing to the high-resistance state.

When the electric pulse application device 102 applies the electric pulse of VP3 to the series path 130, the resistance variable layer 126 further changes from RH' to RH.

The polarity of VP1 is negative, the polarity of VP2 is positive, the voltage generated between the lower electrode 124 and the upper electrode 128 is the interelectrode voltage, the current flowing between the lower electrode 124 and the upper electrode 128 is the interelectrode current, the polarity of the interelectrode voltage in a case where the electric pulse application device 102 applies VP1 to the series path 130 is negative, and the polarity of the interelectrode voltage in a case where the electric pulse application device 102 applies VP2 to the series path 130 is positive.

As already described above, in the case where the resistance variable layer 126 changes from RH to RL, the resistance value stops decreasing when the interelectrode voltage reaches V1 which is a negative voltage, while in the case where the resistance variable layer 126 changes from RL to RH, the resistance value starts increasing when the interelectrode voltage reaches V2 which is equal in absolute value to V1 and is a positive voltage. In this case, when the electric pulse of voltage=VP2 is applied to the series path 130 under the state where the load resistor placed in the series path 130 is set to have the load resistance characteristic of R2 as shown and the voltage whose value at an intersection of point B is smaller than that of the voltage of V3 is VP2, its resistance does not increase to target RH and stops increasing at RH' which is lower in resistance value than RH at an equal interelectrode voltage. Further, when the electric pulse of voltage=VP3 is applied to the series path 130 under the state where the load resistor placed in the series path 130 is set to have the load resistance characteristic of R3 as shown and the voltage whose value is larger than that of V3 is VP3, the resistance variable layer 126 changes from RH' to RH. In this case, upon the interelectrode voltage reaching V3, the interelectrode current flows such that the interelectrode voltage is maintained at V3, and an equilibrium state is formed when the interelectrode current becomes equal to the amount (current value at point C) of a current flowing when the voltage of (VP3−V3) is applied to the load resistor. Similarly to the example of FIG. 29, the resistance variable layer 126 has a characteristic in which the resistance value stops increasing when the interelectrode current decreases to $I_{lim}$, in a state where the interelectrode voltage is not lower than V2 and lower than V3, which is a range of the interelectrode voltage in which the resistance variable layer 126 changes from RL to RH' and further to RH.

The transistor 110 which is an example of the above mentioned load resistor is set to have a load resistance characteristic in which a current flowing when a voltage obtained by subtracting V2 from VP2 is applied to the transistor 110 in a case where the electric pulse application device 102 outputs the electric pulse of VP2, is not lower in absolute value (not lower than I2 in FIG. 30) than a current flowing when a voltage obtained by subtracting V1 from VP1 is applied to the transistor 110, and is set to have a load resistance characteristic in which a current flowing when a voltage obtained by subtracting V3 from VP3 is applied to the transistor 110 in a case where the electric pulse application device 102 outputs the electric pulse of VP3, is not higher than $I_{lim}$ (point C in FIG. 30).

In a data writing method in the nonvolatile memory device according to Modification Example 1 which switches the load resistance characteristic as described above, the characteristic of the transistor 110 is set such that the current flowing through the series path 130 is not lower than the current flowing when the voltage obtained by subtracting V1 from VP1 is applied to the transistor 110 (point A in FIG. 30) when the electric pulse of VP2 is fed to the series path 130, and the transistor 110 restricts the current flowing through the series path 130 to not higher than $I_{lim}$ (point C in FIG. 30) when the electric pulse of VP2 is fed to the series path 130, in the nonvolatile memory device having the above configuration.

In accordance with the above configuration, at least two-step HR writing is accomplished as shown in FIG. 30. In other words, writing equivalent to that of FIG. 29 is accomplished by applying pulses several times under the varied load resistance characteristics, and the condition is satisfied. FIG. 30 depicts an example in which writing is completed by applying the pulse twice. Firstly, the characteristic of the transistor is set to R2 in which the voltage-current characteristic is steep and VP2 is applied to the series path to change the resistance variable element to a transient high-resistance state (RH'). In this case, the interelectrode voltage is desirably set not to fall within the third RH attaining voltage range (range which is not lower than V3). Following that, the characteristic of the transistor is set to R3 in which the voltage-current characteristic is gentle, and the third application voltage (VP3) which is higher than V3 is applied to the series path to transition the resistance variable element to RH. Thus, when the electric pulse application device applies the voltages (VP2 and VP3) at two stages, the resistance variable element starts changing to the high-resistance state by application of VP2 to the series path and completes changing to the high-resistance state by application of VP3 to the series path.

In Modification example 1, the nonvolatile memory device includes a load resistance switch (gate voltage switch 104 in the example of FIG. 1, hereinafter referred to as the gate voltage switch 104 for the sake of convenience of explanation). The gate voltage switch 104 is configured to switch the characteristic of the transistor 110 among a case where the electric pulse application device 102 outputs the electric pulse of VP1, a case where the electric pulse application device 102 outputs the electric pulse of VP2, and a case where the electric pulse application device 102 outputs the electric pulse of VP3.

In Modification example 1, the load resistor is a transistor 110 including two main terminals 114 and 116 and one control terminal 112. The gate voltage switch 104 is configured to switch the voltage applied to the control terminal 112 to switch the characteristic of the transistor 110.

Alternatively, the electric pulse application device 102 may have a plurality of output impedances to be switched. In this case, a load resistive element used as an output impedance may be an active element such as a transistor, or a composite element in which a plurality of fixed resistors comprising polysilicon provided on a semiconductor substrate are switchable by a semiconductor switch or the like.

Modification Example 2

Figure 31:
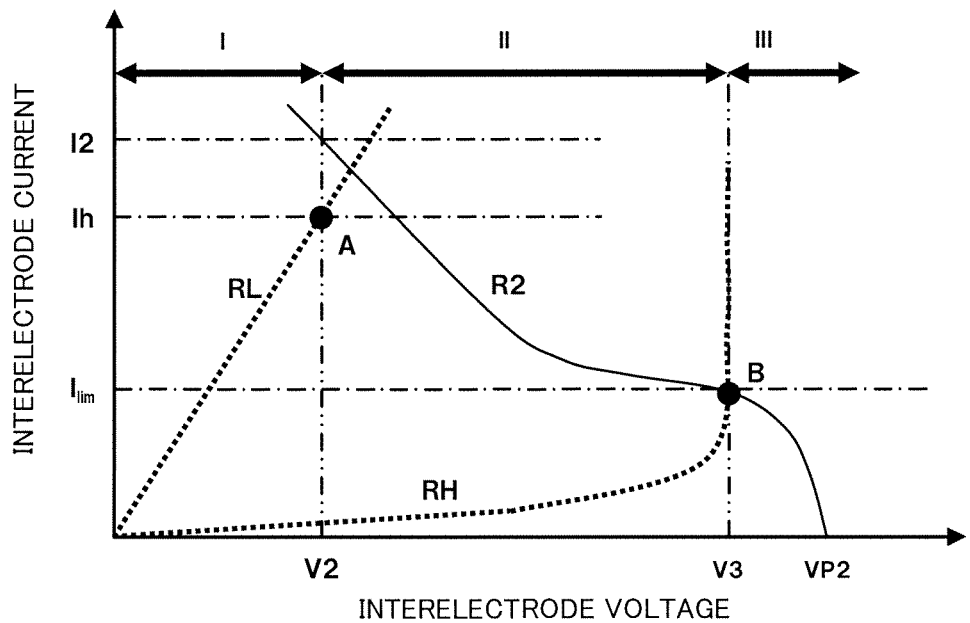
FIG. 31 is a view of a nonvolatile memory device according to Modification Example 2 of Embodiment 1 of the present invention, corresponding to FIG. 29.

FIG. 31 is a view of a nonvolatile memory device according to Modification example 2 of Embodiment 1 of the present invention, corresponding to FIG. 29. The device configuration of Modification example 2 has been described as Embodiment 1 except that the transistor 110 is replaced by a load resistor circuit 210.

Figure 32:
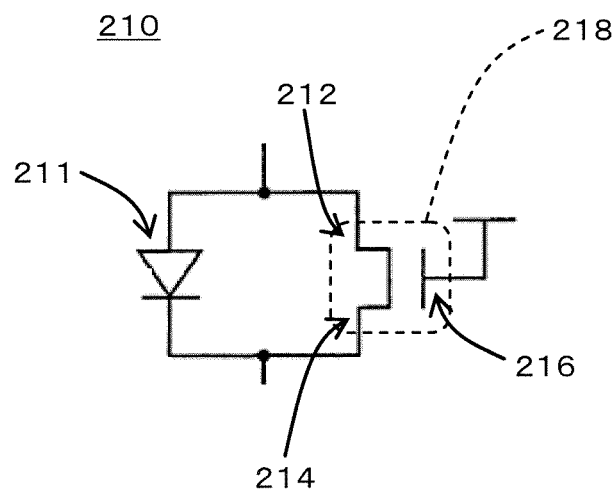
FIG. 32 is a circuit diagram showing a load resistance circuit in the nonvolatile memory device according to Modification Example 2 of Embodiment 1 of the present invention.

FIG. 32 is a circuit diagram showing the load resistor circuit in the nonvolatile memory device according to Modification example 2 of Embodiment 1 of the present invention.

As shown in FIG. 32, in the nonvolatile memory device of Modification example 2, the load resistor circuit 210 is configured to include a transistor 218 and a diode 211 which are connected in parallel. The transistor 218 includes a control terminal 216, a first main terminal 212 and a second main terminal 214.

In accordance with this configuration, as shown in FIG. 31, a current characteristic in which the transistor is dominant in the third RH attaining voltage range (range which is not lower than V3) is attained, while a current characteristic in which the diode is dominant in the first RH attaining voltage range (RL range which is lower than V2) is attained. The above mentioned condition is relatively easily satisfied.

Modification Example 3

In Modification example 3 of Embodiment 1 of the present invention, I2 in FIG. 29 may possibly be reduced to be closer to $I_{lim}$ to ease the condition of the load resistance characteristic based on the third finding and the fifth finding. However, this method has drawbacks that a difference (data detection allowance) between the resistance value corresponding to RH and the resistance value corresponding to RL becomes small because of an increase in the resistance value corresponding to RL. Nonetheless, this method is satisfactorily used when there is a sufficient data detection allowance in a case where a variation in the memory cells is less, a case where a capacity of the memory array is small, etc.

In Modification example 3, the nonvolatile memory device includes a load resistance switch (gate voltage switch 104 in the example of FIG. 1, hereinafter referred to as gate voltage switch 104 for the sake of convenience of explanation). The gate voltage switch 104 is configured to switch the characteristic of the transistor 110 between the case where the electric pulse application device 102 outputs the electric pulse of VP1 and the case where the electric pulse application device 102 outputs the electric pulse of VP2.

In the nonvolatile memory device of Modification example 1, the load resistor is a transistor 110 including two main terminals and one control terminal. The gate voltage switch 104 is configured to switch the voltage applied to the control terminal 112 to switch the characteristic of the transistor 110.

In accordance with this configuration, by reducing I2 in FIG. 29 to be closer to $I_{lim}$, the condition of the load resistance characteristic can be eased.

Embodiment 2

A nonvolatile memory device of Embodiment 2 is configured to have a 1T1R memory array based on the nonvolatile memory device of Embodiment 1.

Figure 33:
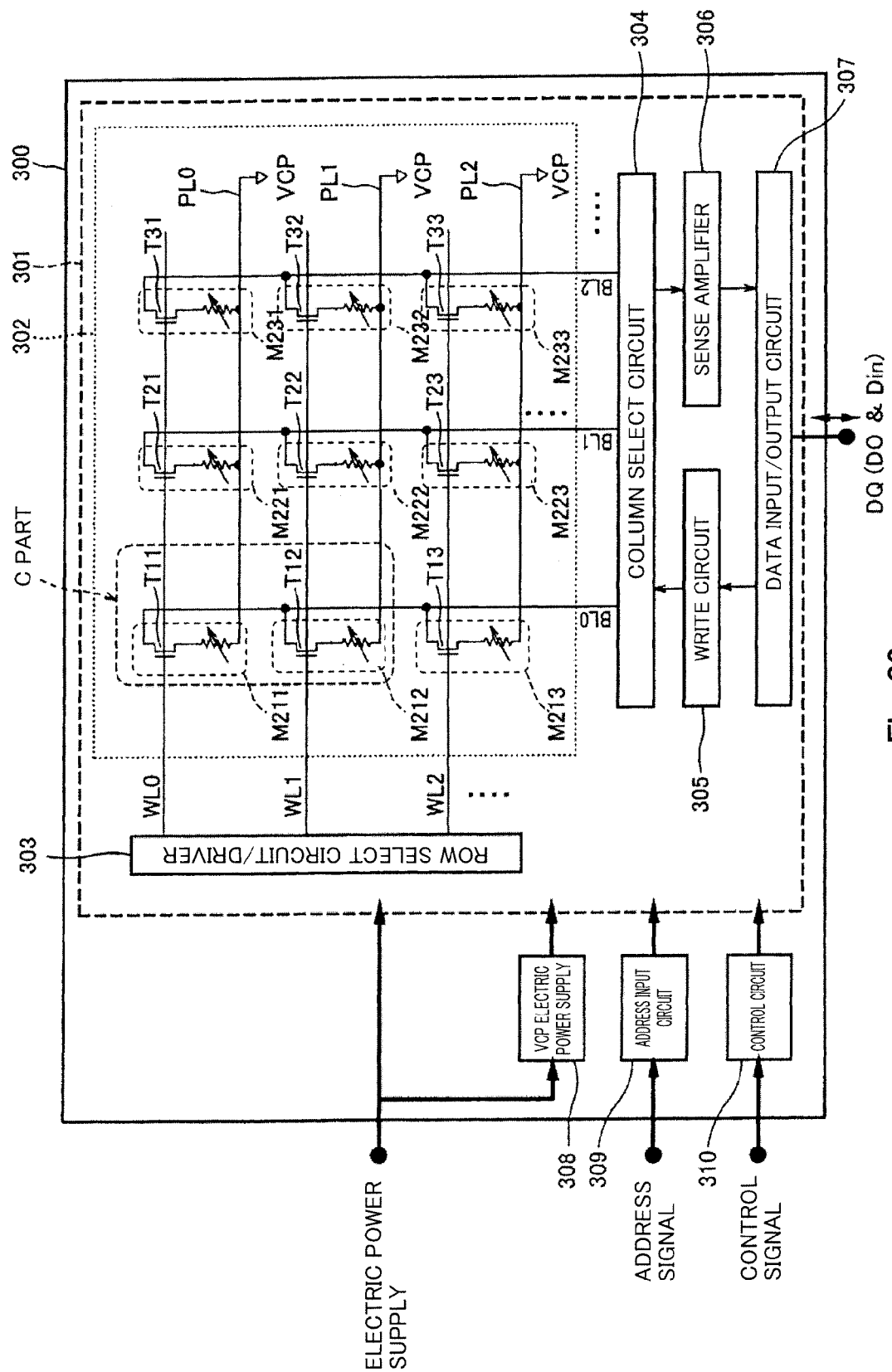
FIG. 33 is a block diagram showing a configuration of a nonvolatile memory device according to Embodiment 2 of the present invention.
Figure 34:
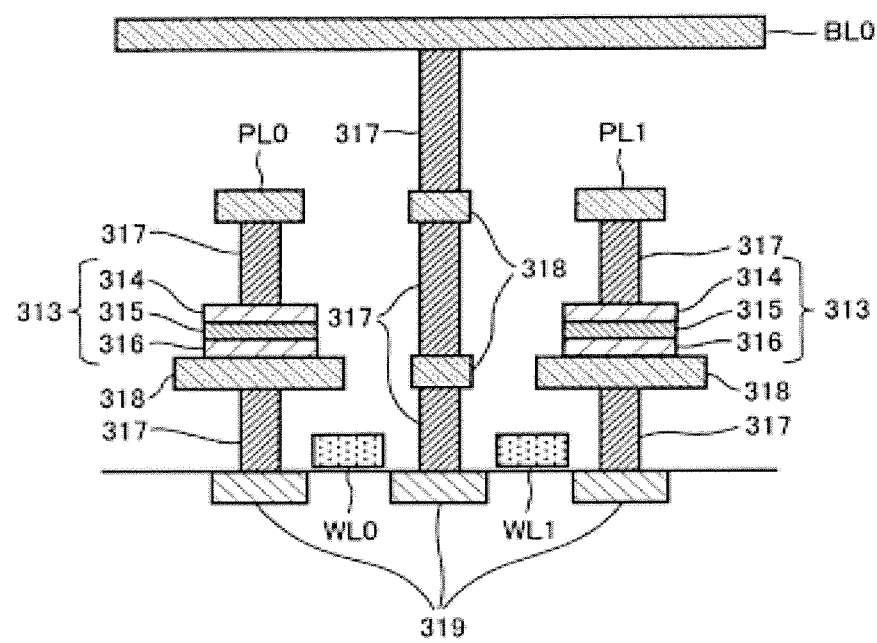
FIG. 34 is a cross-sectional view showing a configuration (configuration of 2 bits) of part C in FIG. 33.

FIG. 33 is a block diagram showing an exemplary schematic configuration of a nonvolatile memory device according to Embodiment 2 of the present invention. FIG. 34 is a cross-sectional view showing a configuration (configuration of 2 bits) of part C in FIG. 33.

As shown in FIG. 33, a nonvolatile memory device 300 according to this embodiment includes, on a semiconductor substrate, a memory main section 301 including a memory array 302, a row select circuit/driver 303, a column select circuit 304, a write circuit 305 for writing data, a sense amplifier 306 which detects an amount of a current flowing through a selected bit line and determines it as data "1" or data "0," and a data input/output circuit 307 which performs input/output processing of input/output data via a terminal DQ. The nonvolatile memory device 300 further includes a cell plate electric power supply (VCP electric power supply) 308, an address input circuit 309 which receives address signals externally input, and a control circuit 310 configured to control the operation of the memory main section 301 based on a control signal externally input.

The memory array 302 includes a plurality of first wires (in the example of FIG. 33, word lines WL0, WL1, WL2, . . . , hereinafter expressed as word lines WL0, WL1, WL2, . . . for the sake of convenience of explanation) which are formed on the semiconductor substrate to extend in parallel with each other in a first direction within a first plane, a plurality of second wires (in the example of FIG. 33, bit lines BL0, BL1, BL2, . . . , hereinafter expressed as bit lines BL0, BL1, BL2, . . . for the sake of convenience of explanation) which are formed so as to extend in parallel with each other in a second direction within a second plane parallel to the first plane and so as to three-dimensionally cross the first wires, and a plurality of memory cells M211, M212, M213, M221, M222, M223, M231, M232, M233 . . . (hereinafter expressed as "memory cells M211, M212, . . . ") which are arranged at the three-dimensional cross points of the word lines WL0, WL1, WL2, . . . , and the bit lines BL0, BL1, BL2 . . . . Each of the memory cells M211, M212, . . . includes the series path 130 shown in FIG. 1. The word lines WL0, WL1, WL2, . . . are connected to control terminals 112 of transistors T11, T12, T13, T21, T22, T23, T31, T32, T33, . . . , (hereinafter expressed as "transistors T11, T12, . . . ") included in the respective memory cells M211, M212, . . . . The bit lines BL0, BL1, BL2, . . . are connected to one ends of the series paths 130 included in the respective memory cells M211, M212, . . . .

The resistance variable element operates as the nonvolatile memory element within the memory cell. The memory cell is configured to include one transistor and one resistance variable element, and therefore is called 1T1R memory cell. The memory array 302 further includes a plurality of plate lines PL0, PL1, PL2, . . . arranged in parallel with the word lines WL0, WL1, WL2, . . . . The plate lines PL0, PL1, PL2, . . . are connected to the other ends of the series paths 130 included in the respective memory cells M211, M212, . . . , respectively.

As shown in FIG. 34, the bit line BL0 is disposed above the word lines WL0 and WL1, and the plate lines PL0 and PL1 are disposed between the word lines WL0 and WL1, and the bit line BL0.

The nonvolatile memory element included in each of the memory cells M211, M212, . . . has a resistance variable layer comprising tantalum oxide as described above. To be more specific, a lower electrode layer 314, an upper electrode layer 316 and a resistance variable layer 315 which are included in a nonvolatile memory element 313 of FIG. 34 correspond to the lower electrode layer 124, the upper electrode layer 128 and the resistance variable layer 126 in the resistance variable element 120 of FIG. 2, respectively.

In FIG. 34, 317 designates a plug layer, 318 designates a metal wire layer and 319 designates source/drain region.

N-channel MOS transistors are exemplarily depicted as select transistors in the memory array 302 of FIG. 33. The drains of the transistors T11, T12, T13, . . . are connected to the bit line BL0, the drains of the transistors T21, T22, T23, . . . are connected to the bit line BL1, and the drains of the transistors T31, T32, T33, . . . are connected to the bit line BL2.

The gates of the transistors T11, T21, T31, . . . are connected to the word line WL0, the gates of the transistors T12, T22, T32, . . . are connected to the word line WL1, and the gates of the transistors T13, T23, T33, . . . are connected to the word line WL2.

The sources of all of the transistors T11, T12, . . . are connected to the associated resistance variable elements, respectively. The relationship between the drain and the source is defined for the sake of convenience of explanation and may be reversed according to the application direction, of course.

The memory cells M211, M221, M231, . . . are connected to the plate line PL0, the memory cells M212, M222, M232, ... are connected to the plate line PL1, and the memory cells M213, M223, M233, ... are connected to the plate line PL2.

The address input circuit 309 receives address signals from an external circuit (not shown) and outputs row address signals to the row select circuit/driver 303 and column address signals to the column select circuit 304 based on the address signals. The address signals are signals indicating an address of a specified memory cell selected from among the plurality of memory cells M211, M212, . . . . The row address signals are signals indicating a row address in the address indicated by the address signals, and the column address signals are signals indicating a column address in the address indicated by the address signals.

In a write cycle of data, the control circuit 310 outputs to the write circuit 305, a write signal for causing application of a write voltage, according to input data Din input to the data input/output circuit 307. In a read cycle of data, the control circuit 310 outputs to the column select circuit 304 a read signal for causing application of a read voltage.

The row select circuit/driver 303 receives the row address signals output from the address input circuit 309, and selects one of the plurality of word lines WL0, WL1, WL2, . . . according to the row address signals, and applies a predetermined voltage to the selected word line.

The column select circuit 304 receives the column address signals output from the address input circuit 309, selects one of the plurality of bit lines BL0, BL1, BL2, . . . according to the column address signals, and applies a write voltage or a read voltage to the selected bit line. According to the application direction, the cell plate electric power supply 308 selectively outputs GND or a predetermined application voltage.

Receiving the write signal output from the control circuit 310, the write circuit 305 outputs to the row select circuit 304 a signal for causing application of a write voltage to the selected bit line. In this embodiment, the electric pulse application device is configured to include the control circuit 310 and the write circuit 305.

In the read cycle of data, the sense amplifier 306 detects an amount of a current flowing through the selected bit line which is a read target, and determines the data as "1" or "0." The resulting output data DO is output to the external circuit via the data input/output circuit 307.

[Exemplary Operation of Nonvolatile Memory Device]

Next, an exemplary operation of the nonvolatile memory device in a write cycle in a case where data is written and in a read cycle in which data is read will be described with reference to the timing chart shown in FIG. 35.

Figure 35:
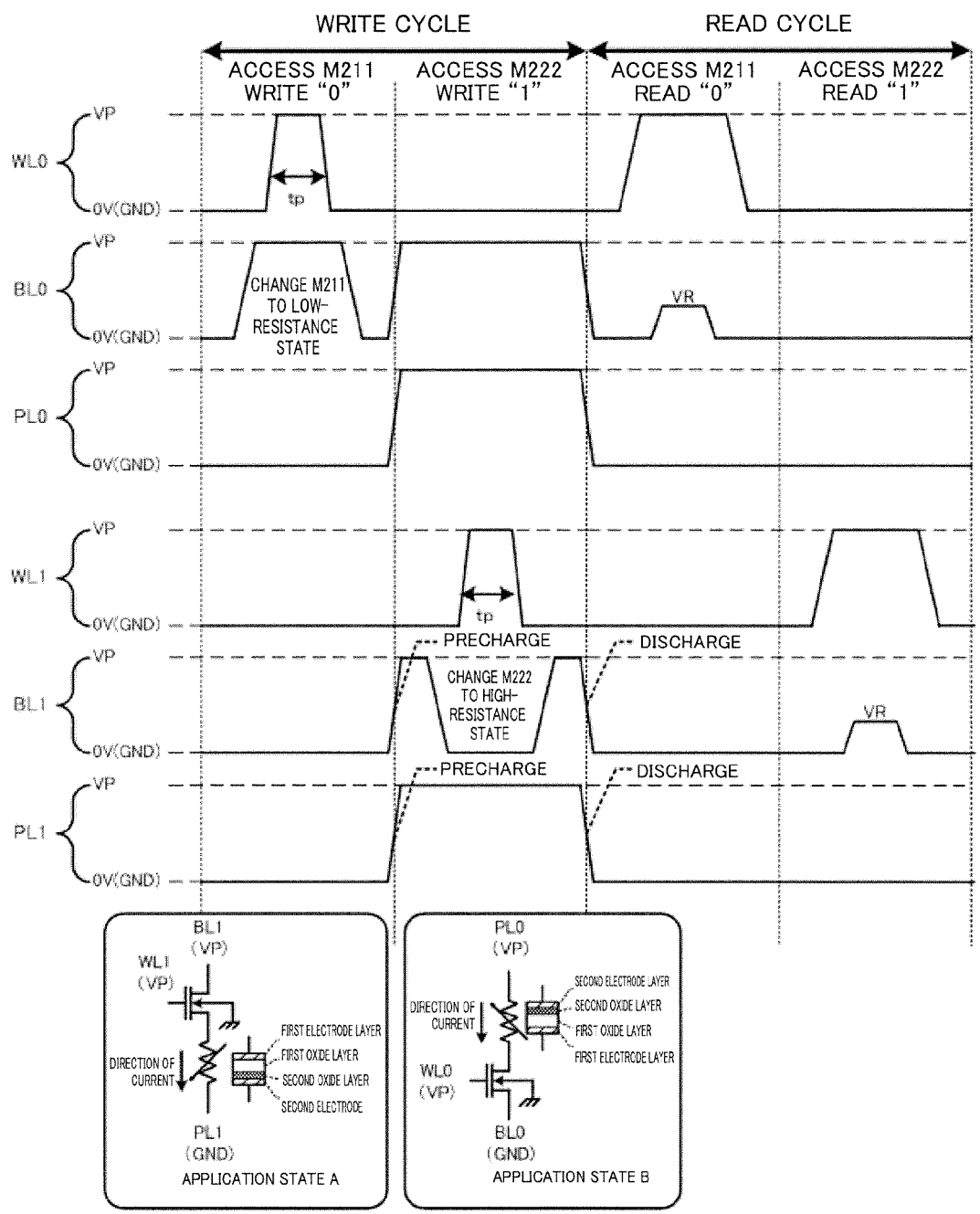
FIG. 35 is a timing chart showing an exemplary operation of the nonvolatile memory device of the present invention.
Figure 36:
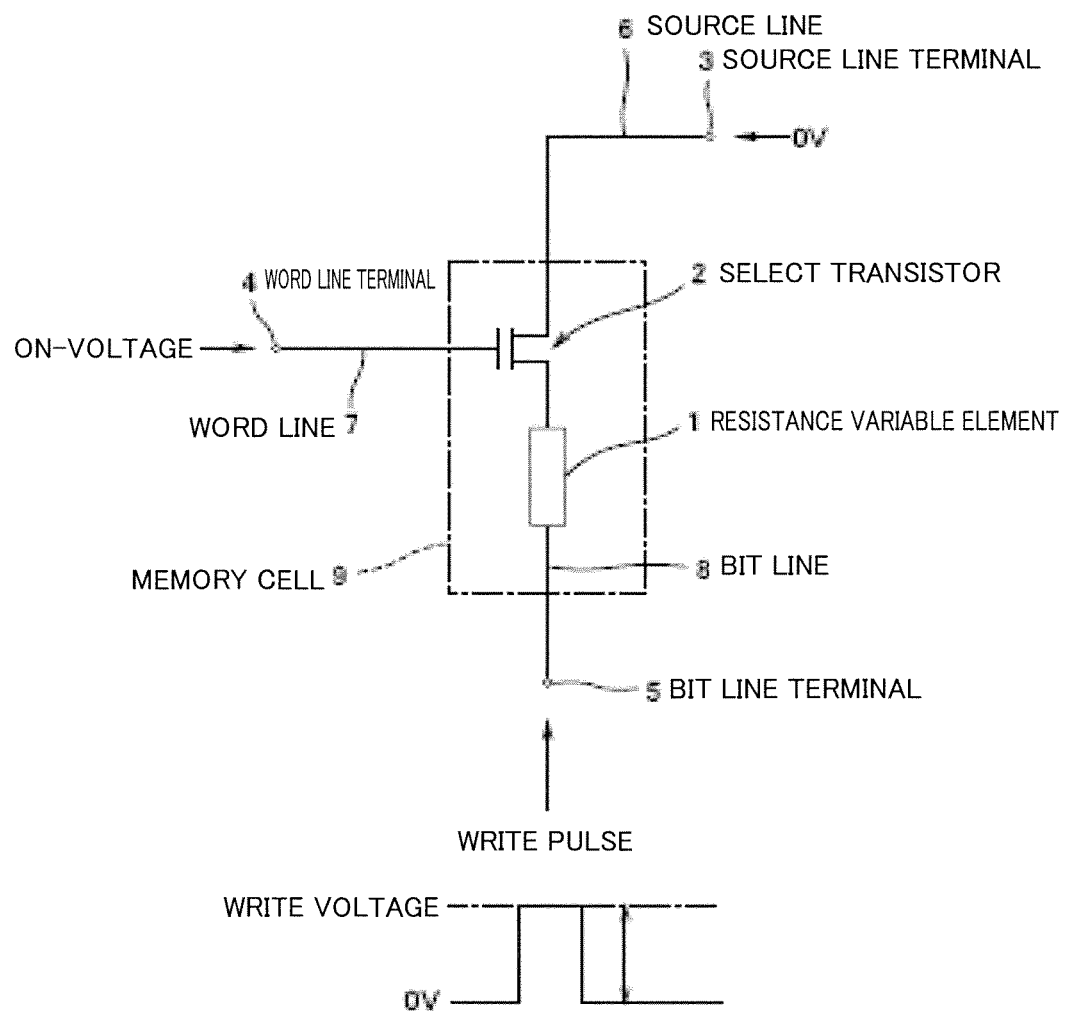
FIG. 36 is a view showing an application state of a voltage pulse in a case where a write operation is performed in a memory cell of Patent literature 1.
Figure 37:
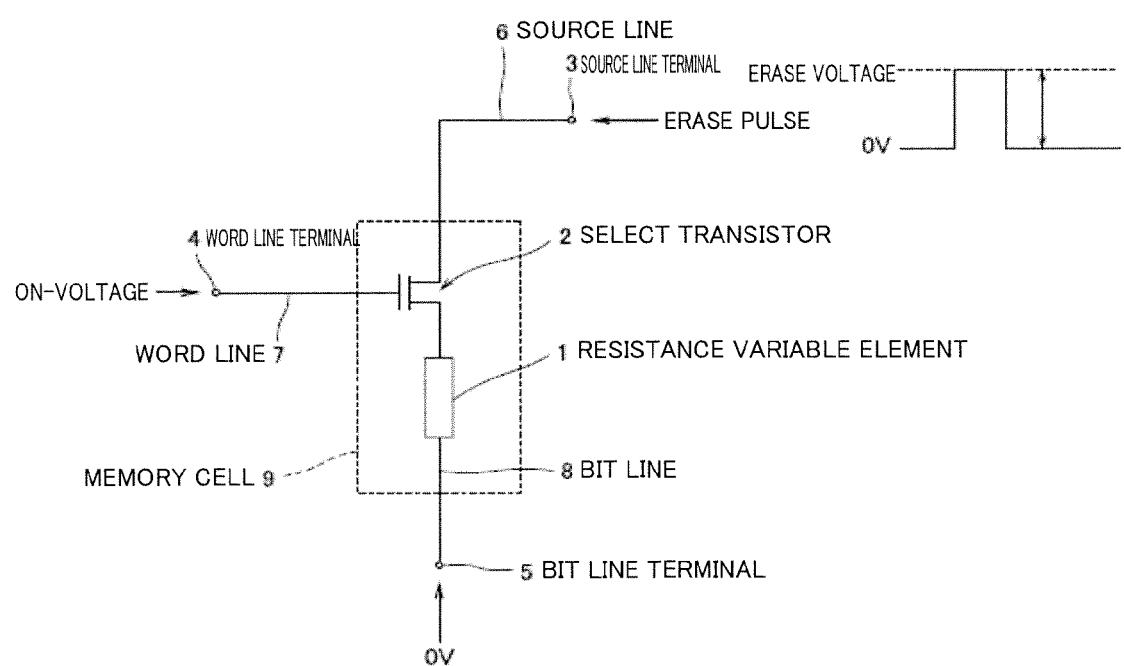
FIG. 37 is a view showing an application state of a voltage pulse in a case where an erase operation is performed in the memory cell of Patent literature 1.
Figure 38:
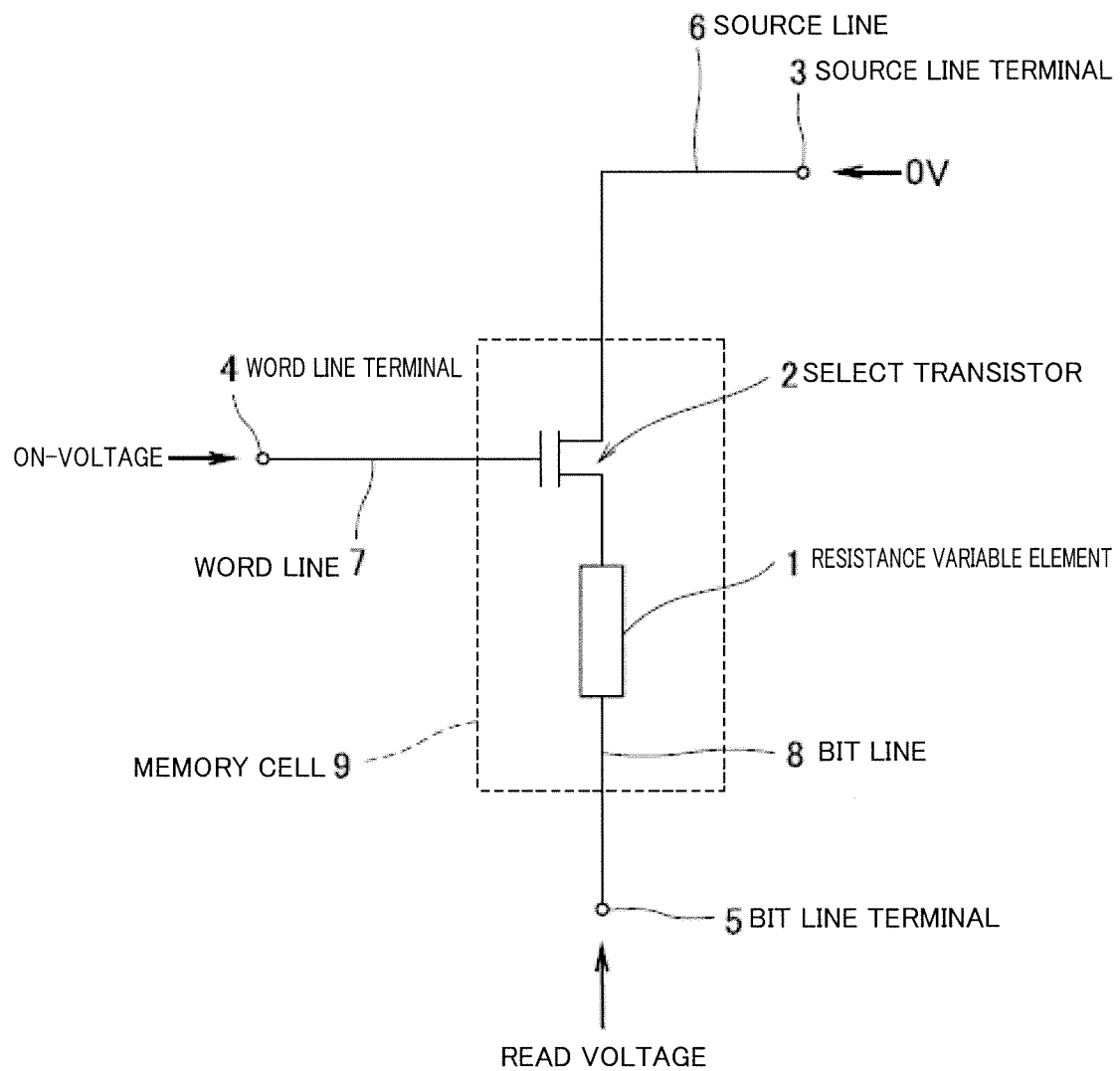
FIG. 38 is a view showing an application state of a voltage pulse in a case where a read operation is performed in the memory cell of Patent literature 1.
Figure 39:
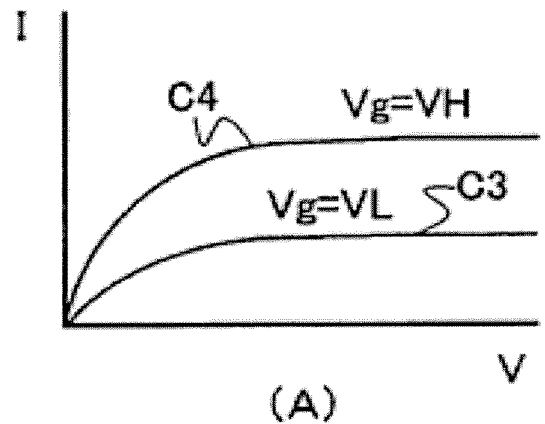
FIG. 39 is a view showing a control method disclosed in Patent literature 2.
Figure 39:
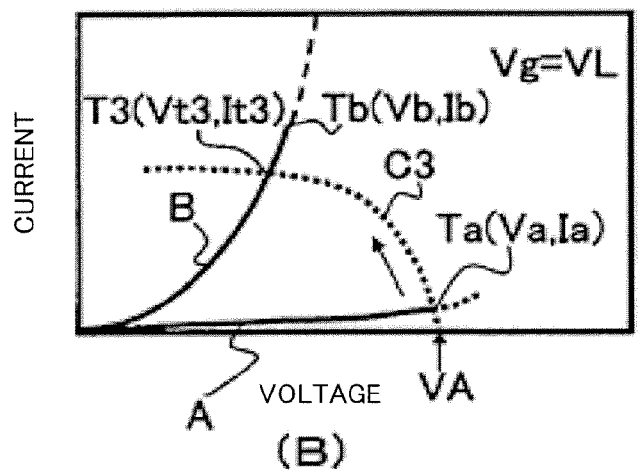
Figure 39:
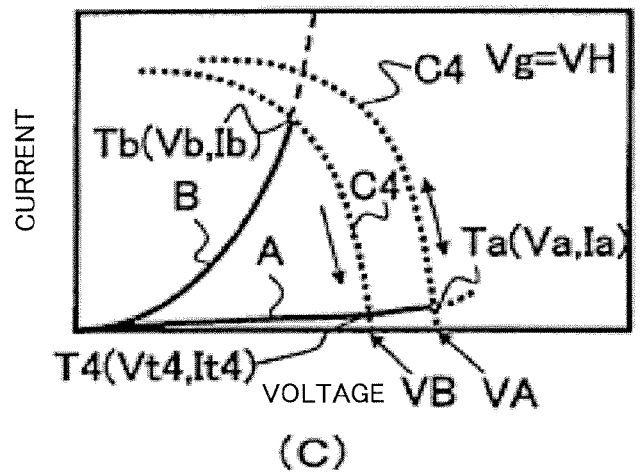

FIG. 35 is a timing chart showing an exemplary operation of the nonvolatile memory device of the present invention. In this embodiment, an exemplary operation in a case where an event that the resistance variable layer is in RH (high-resistance state) is allocated to data "1," while an event that the resistance variable layer is in RL (low-resistance state) is allocated to data "0" will be described. For the sake of convenience of explanation, only cases where data is written to and read from the memory cell M211 and the memory cell M222 are depicted.

In FIG. 35, VP designates a pulse voltage applied between both ends of a memory cell required to change the resistance of the resistance variable element. The plate line is connected to the voltage VP or GND according to the application direction, and each bit line and each plate line are precharged with VP or discharges to GND according to switching as desired.

In a write cycle for the memory cell M211, a pulse voltage VP with a pulse width tp is applied to the word line WL0, causing the transistor T11 to be turned ON. According to this timing, the pulse voltage VP is applied to the bit line BL0 and the plate line PL0 is set to GND level. Thus, the write voltage VP in the case where data "0" is written to the memory cell M211 is applied with a pulse width tp to the first electrode side (lower electrode side) of the resistance variable element, causing the resistance variable layer of the memory cell M211 to change to the low-resistance state. In other words, data "0" is written to the memory cell M211. The application state in this case is schematically depicted as application state A in FIG. 35. It can be seen that a current flows from the first electrode layer (lower electrode layer) toward the second electrode layer (upper electrode layer).

Next, in a write cycle for the memory cell M222, all of the word lines are 0V and unselected bit lines and plate lines are precharged with VP in initial stage of the cycle, 0V is applied only to a selected bit line BL1, and the pulse voltage VP with a pulse width tp is applied to the word line WL1, causing the transistor T22 to be turned ON. Thus, the write voltage VP in the case where data "1" is written to the memory cell M222 is applied to the second electrode side (upper electrode side) of the resistance variable element, causing the resistance variable layer of the memory cell M222 to change to the high-resistance state. In other words, data "1" is written to the memory cell M222. At the end of the cycle, each line precharged with VP discharges to 0V. The application state in this cycle is schematically depicted as application state B in FIG. 35. From this, it can be seen that a current flows from the second electrode layer (upper electrode layer) toward the first electrode layer (lower electrode layer).

In a read cycle for the memory cell M211, a predetermined voltage is applied to the word line WL0 to turn ON the transistor T11, and according to its timing, a read pulse voltage VR which has a smaller amplitude than the write pulse and does not change the resistance state (hereinafter resistance state of the memory cell refers to a resistance state of the resistance variable element included in the memory cell) of the memory cell is applied to the bit line BL0. Thus, a current corresponding to the resistance value of the resistance variable layer of the memory cell M211 changed to the low-resistance state is output, and its output current value is detected. Thereby, the data "0" is read.

In a read cycle for the memory cell M222, a voltage similar to that in the previous read cycle for the memory cell M211 is applied to the word line WL1 and to the bit line BL1. Thus, a current corresponding to the resistance value of the resistance variable layer of the memory cell M222 changed to the high-resistance state is output, and its output current value is detected. Thereby, data "1" is read.

The direction (polarity) of resistance changing of the resistance variable element and connection relationship with the transistor will be described. The application state B in FIG. 35 indicates an application state in the case where the resistance variable element changes from RL (low-resistance state) to RH (high-resistance state) to attain the high-resistance state. The bit line is connected to GND and the plate line is fed with a high-resistance state attaining voltage (VP=VP2), so that a current flows from the plate line to the bit line. In this case, the resistance variable element is connected between VP and the drain. An application state A in FIG. 35 indicates an application state in the case where the resistance variable element changes from RH (high-resistance state) to RL (high-resistance state) to attain the low-resistance state. The bit line is fed with a low-resistance state attaining voltage (VP=VP1) and the plate line is connected to GND, so that a current flows from the bit line to the plate line. In this case, the resistance variable element is connected between the source and GND.

In FIG. 35, the bit line voltage is equal to the word line voltage in the application state A (for attaining the low-resistance state), the plate line voltage is equal to the word line voltage in the application state B (for attaining the high-resistance state) and these voltages are VP. In the application state A (for attaining the low-resistance state), a current flows from BL1 to PL1. The resistance variable element is connected to the source side (downstream side in a current flow direction) of the transistor. The first electrode layer (lower electrode) of the resistance variable element is applied with a voltage (VP−Vth) obtained by subtracting a threshold voltage (Vth) of the transistor from the voltage VP applied to the series path (between both ends of the memory cell). Even when the voltage applied to the series path is equal and VP, the absolute value of the current flowing through the resistance variable element in the same resistance state (having the same current-voltage characteristic) is larger in the application state B (for attaining the high-resistance state) than in the application state A (for attaining the low-resistance state). In accordance with the writing method of FIG. 35, when VP=VP2=|−VP1|, the load resistance characteristic R2 of the select transistor which satisfies a condition that a current at voltage V2 (≈|−V1|) exceeds I2 (≈|−I1|) as shown in FIG. 29 is attainable.

In the application state B, a word line voltage (gate voltage of a select transistor) is equal to a plate line voltage and is VP (VP is equal to VP2 [voltage applied to the series path to attain the high-resistance state]). As shown in FIG. 29, the characteristic of the select transistor is set such that the interelectrode current is not higher than a current value at point B when the interelectrode voltage is V3. Such a characteristic of the select transistor is determined by the voltage value of VP2. The current-voltage characteristic of the transistor at point B in FIG. 29 is a linear range because a drain-source voltage $V_{DS}$ is lower than a gate voltage $V_G$. Therefore, the drain-source current $I_{DS}$ approximates the following formula (1) using the gate-source voltage $V_{GS}$, the threshold voltage Vth and the drain-source voltage $V_{DS}$.

$$I_{DS}=K\times[2\times(V_{GS}-Vth)\times V_{DS}-V_{DS}^2] \quad (1)$$

where K=½×μn×Cox×(W/L), μn is an electron mobility, Cox is an oxide layer capacitance, W is a gate width, and L is a gate length.

$V_{GS}$ is equal to (VP2−V3) in FIG. 29. When VP2−V3=ΔV3, $V_{GS}$=VP2=V3+ΔV3, and $V_{DS}$=ΔV3. These are assigned to the formula (1), which is thereby solved, resulting in a formula (2).

$$I_{DS}=K\times[2\times(V3-Vth)\times\Delta V3-\Delta V3^2] \quad (2)$$

Since ΔV3 is sufficiently small and a term of ΔV3² is negligible, the following formula (3) results.

$$I_{DS}\approx K\times[2\times(V3-Vth)\times\Delta V3] \quad (3)$$

In the formula (3), the transistor may be handled assuming that $I_{DS}$ is proportional to ΔV3 (current-voltage characteristic of the transistor falls within the linear range). Further, the current amount at point B in FIG. 29 is $I_{lim}$, and is assigned to the formula (3) which is thereby solved. This results in ΔV3≈$I_{lim}$/[2K×(V3−Vth)] The condition of the voltage VP (=VP2) in FIG. 35 is given by the following formula (4)

$$VP\leq V3+I_{lim}/[2K\times(V3-Vth)] \quad (4)$$

Since the above ΔV3 is an approximate value, the formula (4) is an approximate formula. To calculate the upper limit of ΔV3 and the upper limit of VP more correctly, a circuit simulation such as SPICE may be used, of course.

It may be said that an optimal driving condition of the transistor is determined by V3 and $I_{lim}$. As can be clear from the foregoing description, V3 and $I_{lim}$ are determined uniquely by determining the structure (dimension, material, degree of oxidation, layered structure, electrode material, etc) of the resistance variable element of the memory cell. A phenomenon that a current flows abruptly if the interelectrode voltage is increased to exceed V3 is similar to a phenomenon named Zener breakdown in the Zener diode as described in Embodiment 1. As the diode breakdown, there are Avalanche breakdown and Zener breakdown attributed to a tunneling effect. A mechanism of a breakdown phenomenon of a resistance variable layer in RH state is not clarified yet at the present time, and therefore the breakdown phenomenon of the resistance variable layer in RH state is herein referred to as RH breakdown. In addition, the associated voltage V3 is referred to as RH breakdown voltage, the current upper limit value $I_{lim}$ set to restrict the transition of the element to a super-high resistance state due to occurrence of the breakdown phenomenon is referred to as RH breakdown limit current.

Typically, the select transistor in the memory array is set to a minimum size of a semiconductor manufacturing rule in order to ensure a maximum memory capacity, while the gate voltage of the transistor is set to a necessary and least value to reduce electric power consumption. When the structure of a resistance variable element to be used is determined, the RH breakdown voltage V3 and the RH breakdown limit current $I_{lim}$ are determined, and the driving voltage condition of the transistor satisfying the above described load resistance characteristic is determined uniquely.

As described above, in accordance with the configuration and writing method of this embodiment, the resistance variable element included in the memory cell is changed to the RL state by the application state A of FIG. 35, and is changed to the RH state by the application state B of FIG. 35. The gate voltage of the select transistor, the bit line voltage in the application state A and the plate line voltage in the application state B are set equal and to VP, and the value of VP is set so as to satisfy the condition of the formula (4). With this writing method, a current value in a case where the RH breakdown voltage V3 in FIG. 29 is applied to the memory cell is restricted to a value which is not higher than the RH breakdown limit current $I_{lim}$, thereby preventing an excess current from flowing through the resistance variable element in the RH state. This suppresses an event that the resistance variable element included in the memory cell transitions to a super-high resistance state or an event that the resistance variable element cannot be returned to the low-resistance state (RL). As a result, a nonvolatile memory device with very high reliability can be provided.

Embodiment 3

A nonvolatile memory device of Embodiment 3 is configured to further stabilize its operation in a device configuration which is substantially similar to that of the nonvolatile memory device of Embodiment 2.

Initially, experiment data for supporting Embodiment 3 will be explained.

Experiment Example 8

A memory cell used in the present experiment example had a layered structure in which a first tantalum-containing layer and a second tantalum-containing layer were stacked together like Experiment example 1 and a structure in which a resistance variable element 220 including the second electrode layer 227 in FIG. 5 comprising iridium (Ir) (materials and shapes of the constituents other than the second electrode layer 227 are similar to that in Experiment example 1) and a select transistor 112 (manufactured under the conditions for the above mentioned transistor A) were connected in series as shown in FIG. 1.

The direction (polarity) of resistance changing of the resistance variable element and connection relationship with the transistor were similar to those of Embodiment 2. In the operation, the memory cell changes to the low-resistance state (RL) in the application state A shown in FIG. 35 and changes to the high-resistance state (RH) in the application state B shown in FIG. 35. In Embodiment 2, the gate voltage $V_G$ of the select transistor, the bit line voltage (absolute value of the first application voltage VP1) in the application state A, and the plate line voltage (absolute value of second application voltage VP2) in the application state B were all set to an equal voltage (VP). In Experiment example 8, write endurance was measured under the condition in which each of $V_G$, VP1 and VP2 was made different. The write endurance was measured in such a manner that changing the element to the low-resistance state (applying the first application voltage VP1 to the series path [memory cell]) corresponding to writing data "0" and changing the element to the high-resistance state (applying the second application voltage VP2 to the series path [memory cell]) corresponding to writing data "1" were repeated alternately, a read voltage (0.4V) was applied after every voltage application to measure a cell current (an amount of current flowing through the memory cell so as to correspond to the resistance value of the resistance variable element), and distribution of the currents was evaluated.

Figure 40:
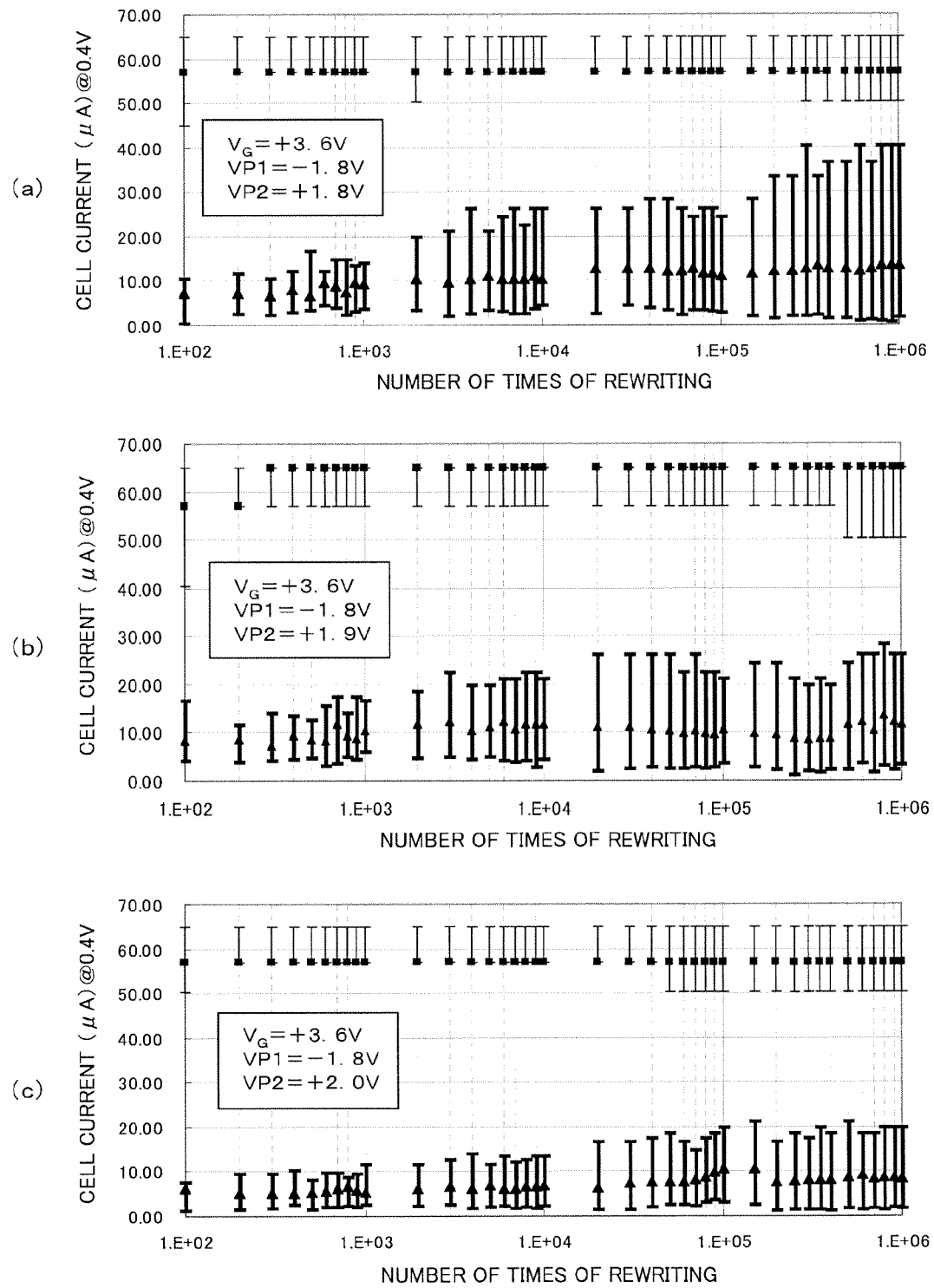
FIG. 40 is a view showing a difference in write endurance in a case where a gate voltage $V_G$ of a select transistor 112 is +3.6V, VP1 is −1.8V and VP2 is changed, in Experiment example 8.
Figure 41:
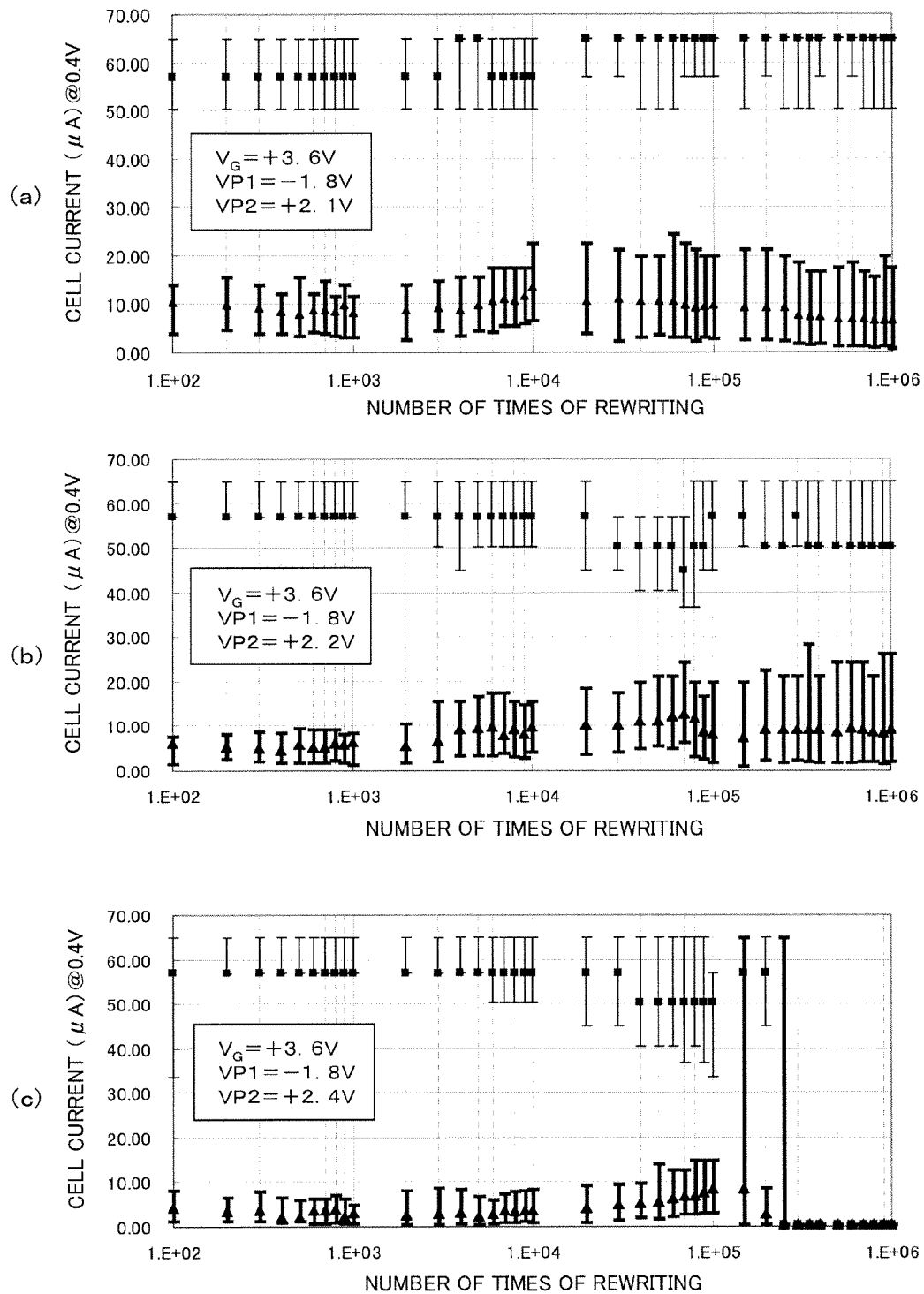
FIG. 41 is a view showing a difference in write endurance in a case where the gate voltage $V_G$ of the select transistor 112 is +3.6V, VP1 is −1.8V and VP2 is changed, in Experiment example 8.

FIGS. 40 and 41 depict a difference in write endurance in cases where the gate voltage $V_G$ of the select transistor 112 was set to +3.6V, VP1 was set to −1.8V and VP2 was changed. To be specific, FIG. 40(a) shows a result in a case where VP2=+1.8V, FIG. 40(b) shows a result in a case where VP2=+1.9V, and FIG. 40(c) shows a result in a case where VP2=+2.0V. FIG. 41(a) shows a result in a case where VP2=+2.1V, FIG. 41(b) shows a result in a case where VP2=+2.2V, and FIG. 41(c) shows a result in a case where VP2=+2.4V.

Figure 42:
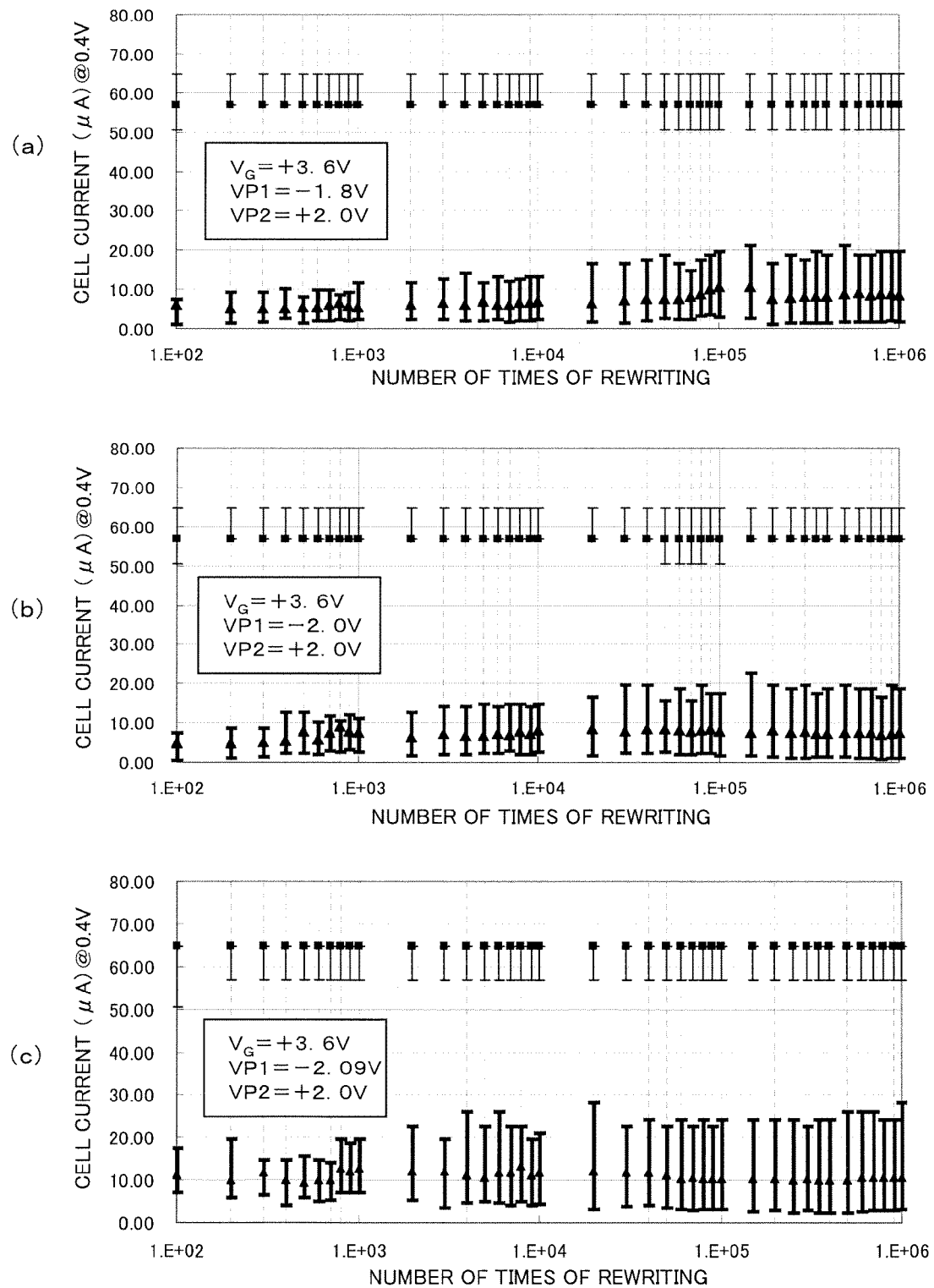
FIG. 42 is a view showing a difference in write endurance in a case where the gate voltage $V_G$ of the select transistor 112 is +3.6V, VP2 is +2.0V and VP1 is changed, in Experiment example 8.
Figure 43:
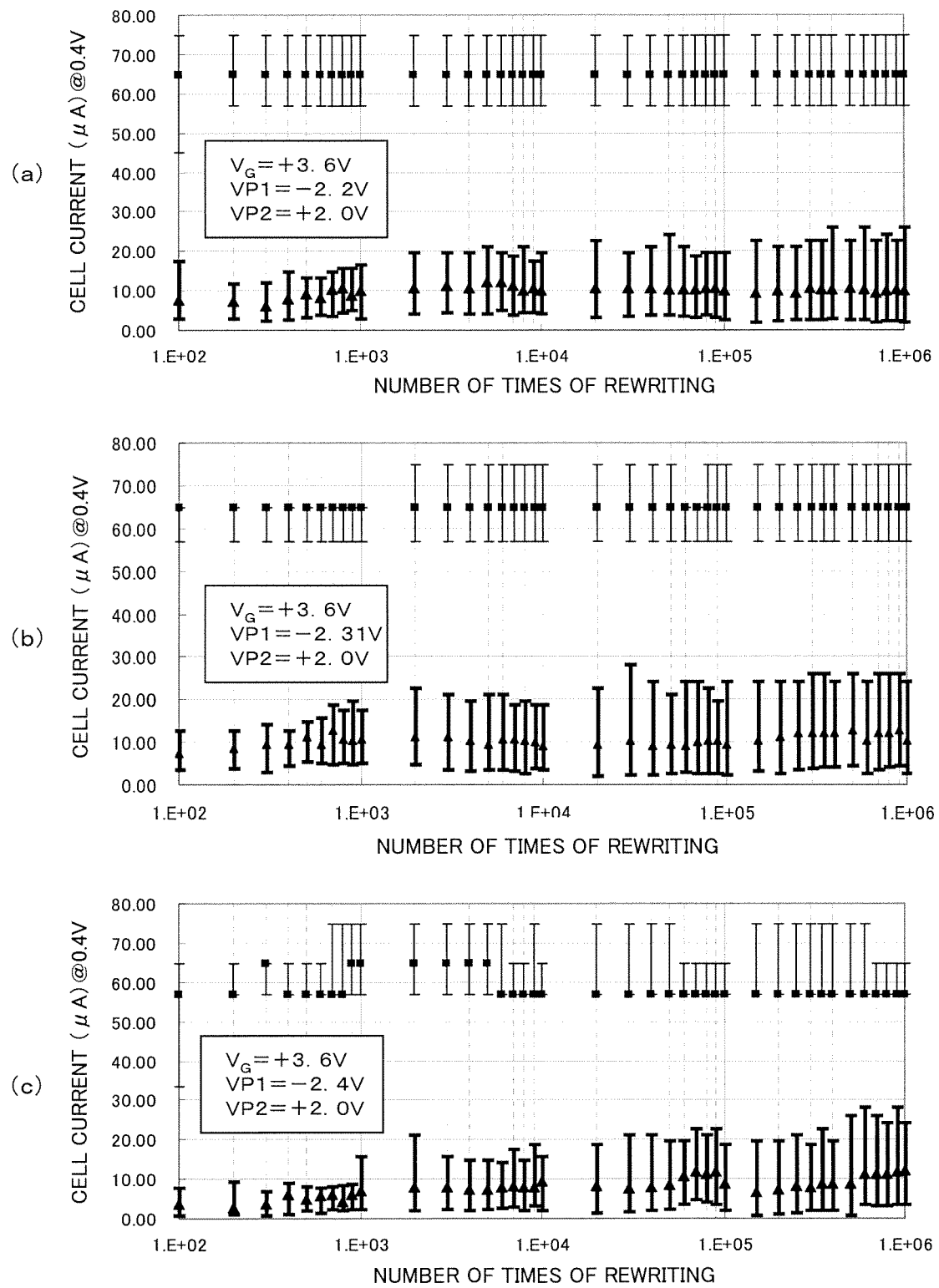
FIG. 43 is a view showing a difference in write endurance in a case where the gate voltage $V_G$ of the select transistor 112 is +3.6V, VP2 is +2.0V and VP1 is changed, in Experiment example 8.

FIGS. 42 and 43 depict a difference in write endurance in cases where the gate voltage $V_G$ of the select transistor 112 was set to +3.6V, VP2 was set to +2.0V and VP1 was changed. To be specific, FIG. 42(a) shows a result in a case where VP1=−1.8V, FIG. 42(b) shows a result in a case where VP1=−2.0V, and FIG. 42(c) shows a result in a case where VP1=−2.09V. FIG. 43(a) shows a result in a case where VP1=−2.2V, FIG. 43(b) shows a result in a case where VP1=−2.31V, and FIG. 41(c) shows a result in a case where VP1=−2.4V.

As in Embodiment 1 and Embodiment 2, a positive voltage is defined as the voltage applied when the current flows from the second electrode (upper electrode) to the first electrode (lower electrode) in the resistance variable element and a negative voltage is defined as a voltage applied in an opposite direction. Except otherwise noted, in the configuration of the nonvolatile memory device of FIG. 33 or FIG. 48 as described later, a case where a write operation is performed under the state where the plate line is placed at GND level and the bit line is applied with a voltage higher than GND level is regarded as a case where the first application voltage (VP1) is applied to change the resistance variable element to RL and the voltage is expressed as a negative voltage. On the other hand, a case where a write operation is performed under the state where the bit line is placed at GND level and the plate line is applied with a voltage higher than GND level is regarded as a case where the second application voltage (VP2) is applied to change the resistance variable element to RH and the voltage is expressed as a positive voltage.

In FIGS. 40 to 43, a horizontal axis indicates the number of times of rewriting and a vertical axis indicates a cell current after writing. The cell current is defined as an amount of a current flowing when a low voltage (in this experiment example, 0.4V) which does not cause the resistance variable element included in the memory cell to change its resistance. In these Figures, plots indicate average values in respective areas of the number of times of rewriting, and bars extending vertically in the plots indicate ranges within the areas (lower end of each bar indicates a minimum value and an upper end thereof indicates a maximum value). For example, point and bar plotted when the number of times of rewriting is 20000 indicate average cell current, minimum value and maximum value from 10001-th rewriting to 20000-th rewriting. In the Figures, black triangles (▲) indicate cell currents flowing through the resistance variable element in the high-resistance state after applying VP2, while black rectangles (■) indicate cell currents flowing through the resistance variable element in the low-resistance state after applying VP1.

As described above, in this experiment example, VP2 was gradually increased from the example of FIG. 40(a) to the example of FIG. 41(c). In the example of FIG. 40(a) in which VP2 was smallest, the maximum value of the cell current of the element in the high-resistance state was larger as the number of times of rewriting increased. The average value of the cell current of the element in the high-resistance state also gradually increased. This implies that a data detection window (difference in cell current between the low-resistance state and the high-resistance state) for distinguishing between the low-resistance state and the high-resistance state was small. This phenomenon was not preferable in terms of achievement of a stable operation of the nonvolatile memory device. This phenomenon may be due to the fact that with an increase in the number of times of rewriting, the resistance variable element changes its resistance state insufficiently despite the application of VP2 and cannot be changed to a desired high-resistance state.

As VP2 increased as shown in the example of FIG. 40(b) to the example of FIG. 41(c), a tendency that the cell current corresponding to RH increased as the number of times of rewriting increased was lessened, whereas the cell current corresponding to the low-resistance state decreased as the number of times of rewriting increased. It was found out that in a range from the example of FIG. 40(b) to the example of FIG. 41(b), the cell current corresponding to the low-resistance state and the cell current corresponding to the high-resistance state did not substantially change and the resistance variable element had a favorable characteristic in implementing a stable operation of the nonvolatile memory device. However, in the example of FIG. 41(c), it was found out that the resistance variable element could not return to the low-resistance state when the number of times of rewriting exceeded 300000, which was unfavorable in implementing a stable operation of the nonvolatile memory device.

As described above, in this Experiment example, in the example of FIG. 42(a) to the example of FIG. 43(c), the absolute value of VP1 was gradually increased. In the example of FIG. 42(a) in which the absolute value of VP1 was smallest, the minimum value of the cell current corresponding to the low-resistance state was small when the number of times of rewriting exceeded 50000. On the other hand, it was found out that in the example of FIG. 42(b) to the example of FIG. 43(b), the cell current corresponding to the low-resistance state and the cell current corresponding to the high-resistance state did not substantially change and the resistance variable element had a favorable characteristic in implementing a stable operation of the nonvolatile memory device. However, in the example of FIG. 43(c), a tendency that the maximum value of the cell current corresponding to the high-resistance state was larger as the number of times of rewriting increased was observed.

From the above result, it was discovered that write endurance was affected by both VP1 and VP2.

Figure 44:
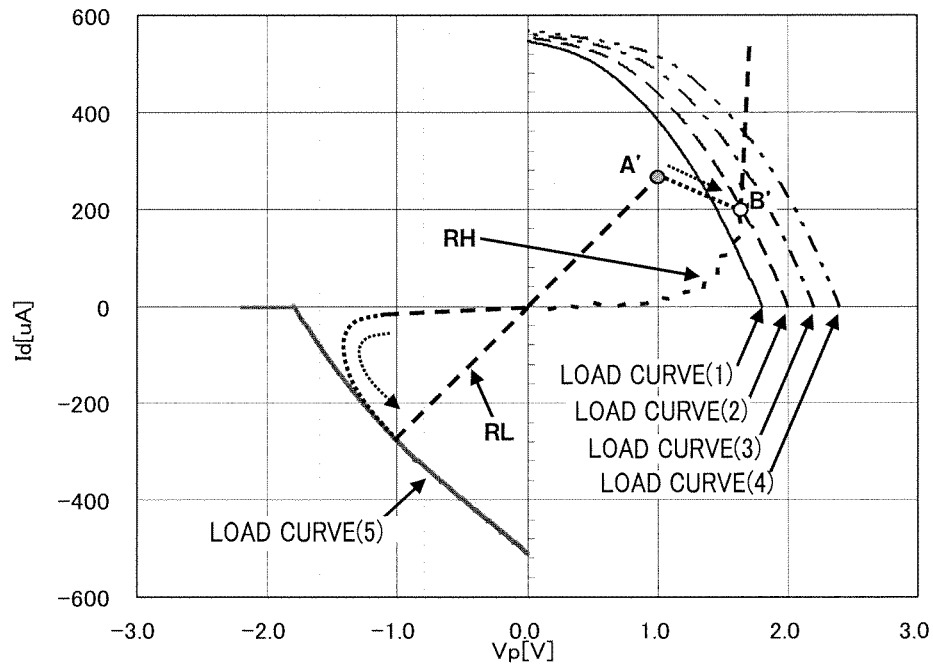
FIG. 44 is a view showing a result of operating-point analysis in Experiment example 8.
Figure 45:
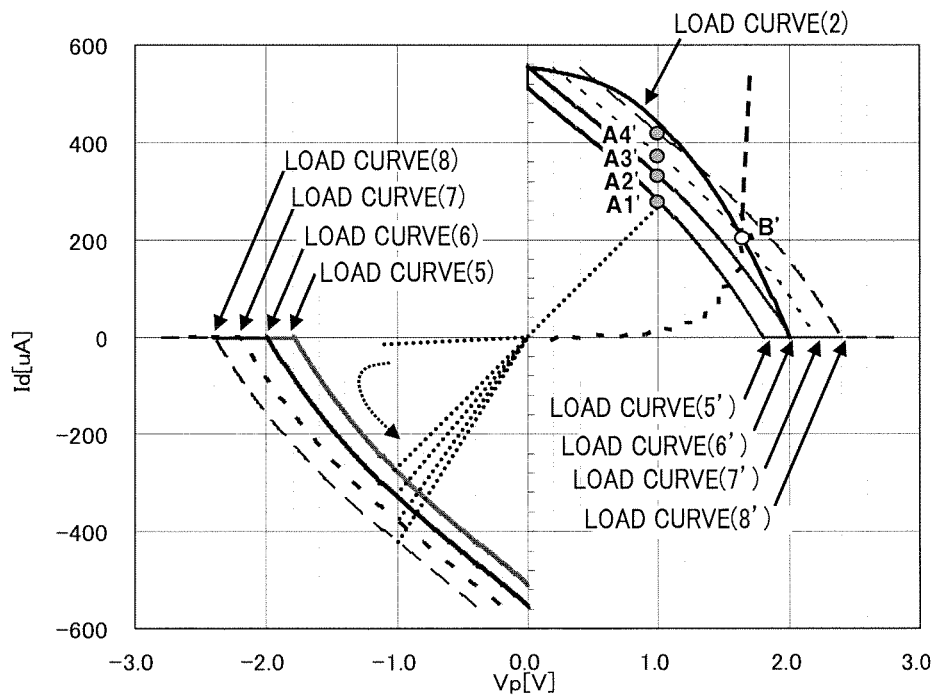
FIG. 45 is a view showing a result of operating-point analysis in Experiment example 8.

FIGS. 44 and 45 show results of operating-point analysis conducted by replacing the voltage conditions shown in FIGS. 40 to 43 with the relationship between the resistance variable element and the load resistor shown in FIG. 3.

As shown in FIG. 44, the gate voltage $V_G$ is +3.6V and constant. A load curve (5) indicates a load curve of a transistor in a case where the low-resistance state attaining voltage VP1 used for attaining the low-resistance state is −1.8V. As described above, when the resistance variable element changes to the low-resistance state, a circuit shown by the application state A of FIG. 35 is implemented, and therefore the resistance variable element is source-follower connected to the source of the transistor and GND. Load curves (1), (2), (3), and (4) indicate load curves of the transistor in cases where the high-resistance state attaining voltages VP2 used to change the resistance variable element to the high-resistance state are set to +1.8V, +2.0V, +2.2V, and +2.4V, respectively. The load curves (1), (2), (3), and (4) correspond to FIG. 40(a), FIG. 40(c), FIG. 41(b) and FIG. 41(c), respectively.

$I_{lim}$ (see FIG. 29) which was a current value at which the resistance variable element used in Experiment example 8 stopped changing its resistance state to the high-resistance state was measured preliminarily, and was about 200 μA. Point B' of FIG. 44 corresponds to point B of FIG. 29 (point D of FIG. 3). Likewise, V1 (see FIG. 28) which was a voltage value at which the resistance variable element used in Experiment example 8 stopped changing its resistance state to the low-resistance state and V2 (see FIG. 29) which was a voltage value at which the resistance variable element used in Experiment example 8 started changing its resistance state to the high-resistance state were measured preliminarily, and as a result, absolute values of them were about 1V. Therefore, point A' in FIG. 44 corresponds to point A in FIG. 29 (point C in FIG. 3).

In the load curves (1), (2), (3), and (4) in FIG. 44, the current values in a case where the interelectrode voltages are +1.0V (the load voltages applied to the transistor were +0.8V, +1.0V, +1.2V, and +1.4V) exceed the current value at point A'. It can be seen that according to any of the load curves, the resistance variable element can surely start changing to the high-resistance state.

On the other hand, in the load curves (3) and (4), the current values in a case where the interelectrode voltages are +1.6V (=V3) (the load voltages applied to the transistors are +0.2V and +0.4V) exceed the current value at point B'. According to the load curves (3) and (4), the transistor cannot not sufficiently restrict the current flowing through the resistance variable element after the resistance variable element has changed to the high-resistance state (RH), and a current exceeding $I_{lim}$ (200 μA) flows through the resistance variable element in the high-resistance state. For this reason, there is a high chance that according to the load curves (3) and (4), the resistance variable element changes to a super-high resistance state and cannot not return to the low-resistance state.

With reference to FIG. 41(b) corresponding to the load curve (3), a difference (window) in resistance value between RL and RH is narrow as the number of times of rewriting increases. With reference to FIG. 41(c) corresponding to the load curve (4), the resistance variable element cannot return to the low-resistance state as the number of times of rewriting increases. It is presumed that this phenomenon occurs due to the fact that the transistor corresponding to the load curve (3) and the load curve (4) cannot not sufficiently restrict the current flowing through the resistance variable element in the high-resistance state.

From the above study, in Experiment example 8, an optimal value of the high-resistance state attaining voltage is +2.0V, VP2 is preferably not lower than +1.8V and not higher than +2.2V (±10% of optimal value), more preferably not lower than +1.8V and not higher than +2.1V (−10% of optimal value to +5% of optimal value), and more preferably not lower than +1.9V and not higher than +2.1V (±5% of optimal value).

In the example of FIG. 45, the gate voltage $V_G$ is set to +3.6V and constant. The load curve (2) and the load curve (5) in FIG. 45 exhibit the same characteristics as those of the load curve (2) and the load curve (5) in FIG. 44. To be specific, the load curve (2) is a load curve of a transistor in VP2=+2.0V, while the load curve (5) is a load curve of a transistor in VP1=−1.8V.

The load curves (6), (7) and (8) are load curves of the transistor in cases where the values VP1 used for attaining the low-resistance state are −2.0V, −2.2V. and −2.4V, respectively. The load curves (5'), (6'), (7'), and (8') are curves obtained by rotating 180 degrees around an origin, the load curves (5), (6), (7), and (8). The load curves (5), (6), (7), and (8) correspond to FIG. 42(a), FIG. 42(b), FIG. 43(a) and FIG. 43(c), respectively.

In respective of the load curves (5), (6), (7) and (8), points at which the resistance variable element changed to the low-resistance state starts changing to the high-resistance state are intersections of a straight line in which the interelectrode voltage is V2 (=+1.0V) and the load curves (5'), (6'), (7'), and (8') and are A1', A2', A3' and A4', respectively. The current values in cases where the interelectrode voltages are +1.0V (the load voltage applied to the transistor in the load curve (2) is +1.0V) are larger than any one of the current values in the load curves A1', A2' A3' and A4'. Therefore, when the resistance variable element changes to the low-resistance state according to any one of the load curves (5), (6), (7) and (8), the resistance variable element can start changing to the high-resistance state surely.

Figure 55:
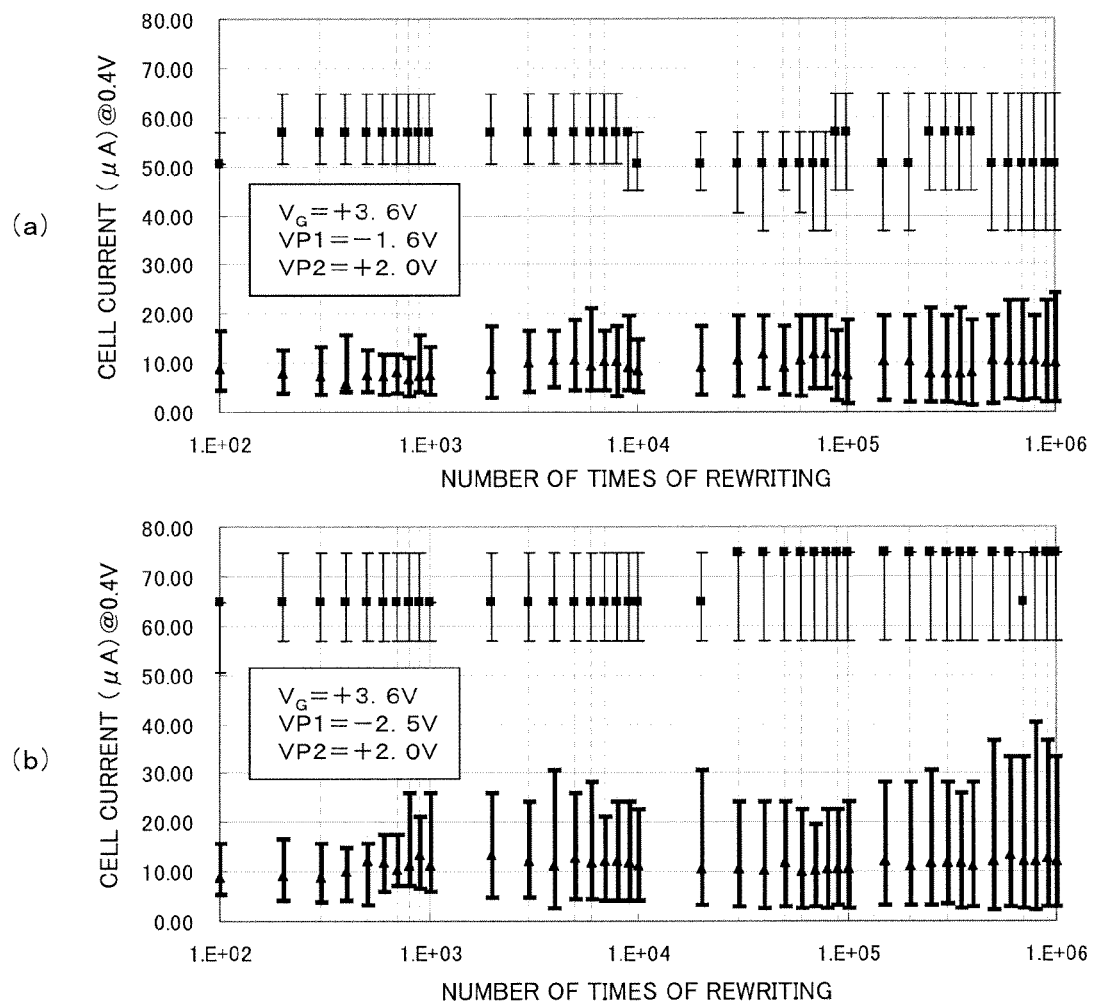
FIG. 55 is a view showing a difference in write endurance in a case where the gate voltage $V_G$ of the select transistor 112 is +3.6V, VP2 is +2.0V and VP1 is changed, in Experiment example 8.

However, with reference to FIG. 42(a) corresponding to the load curve (5), it can be seen that the minimum values of the current values corresponding to the low-resistance state are smaller when the number of times of rewriting exceeds about 50000, and the resistance values corresponding to the low-resistance state are higher. In other words, it may be said that VP1 is smaller with respect to an optimal voltage value for driving the memory cell. On the other hand, with reference to FIG. 43(c) corresponding to the load curve (8), maximum value and average value of the current values corresponding to the high-resistance state are larger as the number of times of rewriting increases and the resistance value corresponding to the high-resistance state is lower. In other words, it may be said that VP1 is larger with respect to an optimal voltage value for driving the memory cell. In the example of FIG. 42(b) corresponding to the load curve (6), the resistance values corresponding to the low-resistance state are temporarily higher when the number of times of rewriting exceeds 50000. For full understanding, FIG. 55 (a) shows the characteristic in a case where VP1 is 1.6V and lower than VP1 in the example of FIG. 42(a), while FIG. 55 (b) shows the characteristic in a case where VP1 is 2.5V and higher than VP1 in the example of FIG. 43(c). In each of the examples, it should be understood that data detection window (difference in cell current between the low-resistance state and the high-resistance state) is further smaller.

From the above study, in Experiment example 8, the optimal value of the low-resistance state attaining voltage VP1 is −2.2V corresponding to FIG. 43(*a*) and the load curve (7), a preferable range of the absolute value of VP1 is not lower than 1.8V and not higher than 2.4V (−18% of the optimal value to +9% of the optimal value), a more preferable range of the absolute value of VP1 is not lower than 2.0V and not higher than 2.31V (−9% of the optimal value to +5% of the optimal value), and a most preferable range of the absolute value of VP1 is not lower than 2.09V and not higher than 2.31V (±5% of the optimal value).

[Suitable Range in Embodiment 3]

Hereinafter, suitable operating conditions in a case where a MOS-FET transistor is used as the load resistor as shown by the application state A and the application state B of FIG. 35 will be described with reference to the result of Experiment example 8.

An optimal balance between VP1 and VP2 is the load curve (2) and the load curve (7) in FIG. 45. It can be seen that both of the load curve (2) and the load curve (7') depicted by making the load curve (7) symmetrical with respect to an origin pass through point B'.

From the foregoing description, it should be understood that the point B' in FIG. 43 is a point at which the interelectrode current is $I_{lim}$, and the interelectrode voltage is V3, and is uniquely determined by a structure (dimension, material, degree of oxidation, layered structure, electrode material, etc) of the resistance variable element included in the memory cell. Typically, a select transistor in a memory array is set to a minimum size of a semiconductor manufacture rule to ensure a maximum memory capacity, and a gate voltage of the transistor is set to a necessary and least value to reduce electric power consumption. Therefore, a driving voltage condition of the transistor which satisfies the above mentioned load resistance characteristic condition, (characteristic curve (load curve) in the case where the resistance variable element changes to the high-resistance state and curve obtained by rotating 180 degrees around an origin, characteristic curve (load curve) in the case where the resistance variable element changes to the low-resistance state, pass through the point B') is also uniquely determined.

Figure 46:
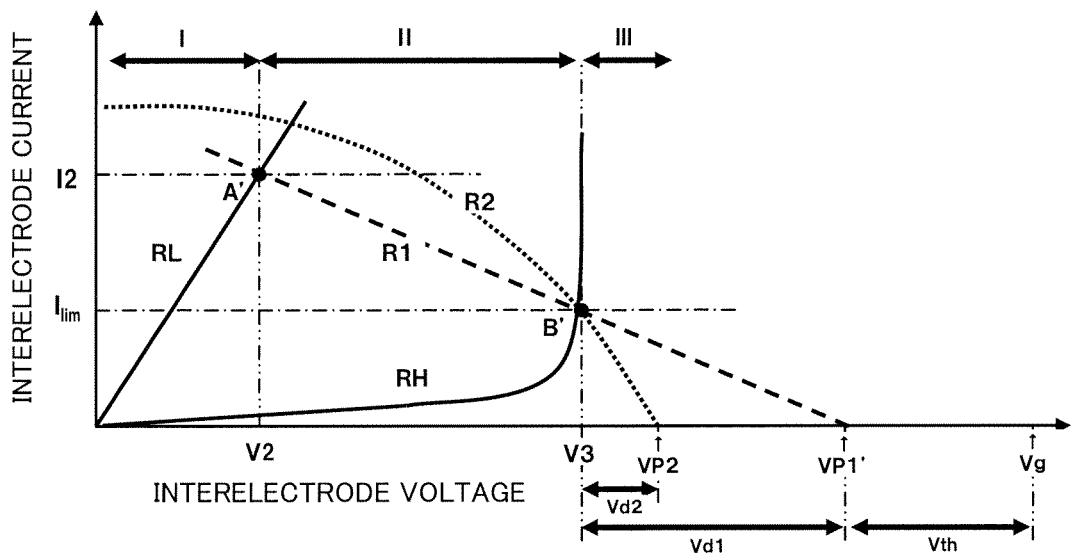
FIG. 46 is a view imaginarily showing a relationship between a load curve (2) and a load curve (7') of FIG. 45 to explain how driving condition of a transistor is derived, according to Embodiment 3.

FIG. 46 is a view imaginarily showing a relationship between the load curve (2) and the load curve (7') in FIG. 45 to explain how the driving condition of the transistor is derived, according to Embodiment 3. In FIG. 46, R1 corresponds to the load curve (7') in FIGS. 45 and R2 corresponds to the load curve (2) in FIG. 45.

Figure 47:
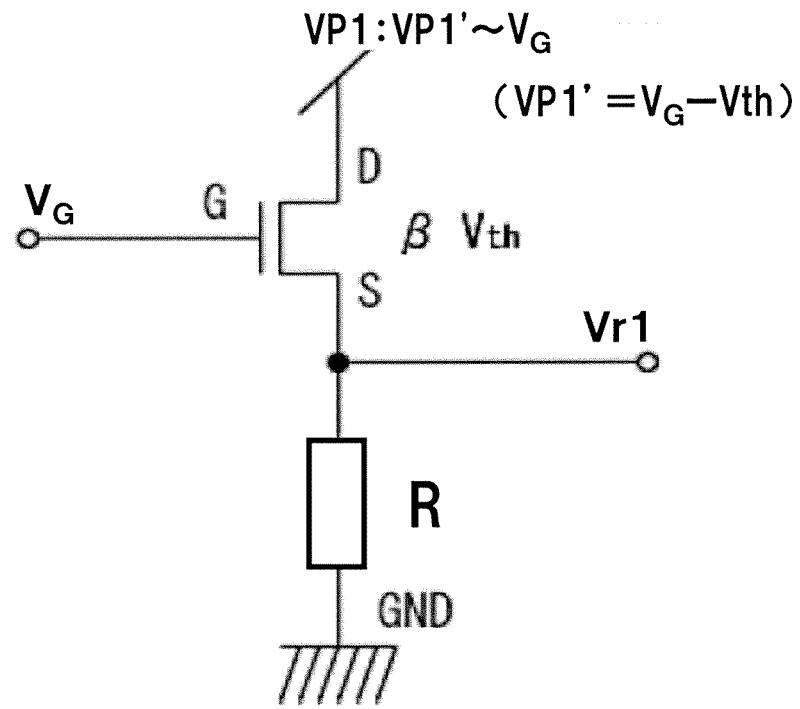
FIG. 47 is an enlarged view of a circuit shown in an application state A of FIG. 35.

FIG. 47 is an enlarged view of a circuit shown in the application state A of FIG. 35. As shown in FIG. 47, the resistance variable element R is connected to the source S of the transistor. As described above, the resistance variable element changes to the low-resistance state when VP is applied to the drain of the transistor in the application state A in FIG. 35. The load resistance characteristic of the transistor in the case where the resistance variable element changes to the low-resistance state is R1 in FIG. 46, and the transistor operates in a saturation range. Since point A' and point B' pass through R1, an intersection of a load curve passing through the point A' and the point B' and X-axis is VP1' (absolute value of a minimum voltage required to be applied to the drain of the transistor to flow a current through the circuit when the resistance variable element changes to the low-resistance state). A voltage (VP1'+Vth) which is obtained by adding the threshold voltage Vth of the transistor to VP1' is a minimum value of a voltage value selectable as the gate voltage $V_G$. In this case, a voltage |−VP1| actually applied to the drain of the transistor is restricted by the gate voltage $V_G$ if the voltage is not lower than VP1', and a maximum voltage (Vr1 in FIG. 47) applied to the resistance variable element is equal to VP1'.

In general, the transistor in a state of source follower is operative in a saturation range. A drain-source current $I_{DS}$ in the saturation range of the transistor is expressed as depending on a square of ($V_{GS}$−Vth) as represented by the following formula (5).

$$I_{DS} \approx K \times (V_{GS} - Vth)^2 \qquad (5)$$

However, as explained in non-patent literature 1, velocity saturation effect is noticeable in a MOSFET having a gate length less than sub-micrometer, and $I_{DS}$ in the saturation range of the transistor approximates to be proportional to ($V_{GS}$−Vth) as represented by the following formula (6). Since the gate length of all of the transistors used in this embodiment is 180 nm, the formula (6) is used to correct the velocity saturation effect.

$$I_{DS} \approx K_2 \times (V_{GS} - Vth) \qquad (6)$$

where $K_2$=Cox×W×Vsat, and Vsat is carrier saturation velocity.

$V_{GS}$ in the case where the resistance variable element changes to the low-resistance state has a relationship $V_{GS}$=$V_G$−V3 since the voltage of the source is equal to a voltage V3 applied to the resistance variable element. ($V_{GS}$−Vth) in the formula (6) is equal to $V_G$−V3−Vth and therefore is expressed as Vd1, and RH breakdown limit current $I_{lim}$ at pint B' is assigned to $I_{DS}$ in formula 6. This formula is solved for Vd1. Vd1 is given by the following formula (7).

$$Vd1 \approx (I_{lim}/K_2) \qquad (7)$$

Since $V_G$−V3−Vth=Vd1, a minimum gate voltage is given by a sum of RH breakdown voltage V3, Vd1 and Vth as expressed as the following formula (8).

$$V_G \approx V3 + (I_{lim}/K_2) + Vth \qquad (8)$$

When the gate voltage $V_G$ satisfies the formula (8), it is sufficient that VP1 which is a voltage applied to the drain when the resistance variable element changes to the low-resistance state is not lower than V3+($I_{lim}/K_2$).

When the gate voltage $V_G$ is determined according to the formula (8), VP2 can be determined under the condition in which R2 passes through the point B' in FIG. 46. The application state B in FIG. 35 corresponds to a case where the resistance variable element changes to the high-resistance state. When Vd2 (=VP2−V3) in FIG. 46 is small, the transistor is in a linear range of its current-voltage characteristic, and the drain-source current $I_{DS}$ is expressed as the formula (1) as described in Embodiment 2. If $V_{DS}$ in the formula (1) is small, term of $V_{DS}^2$ is negligible. In this case, $I_{DS}$ can approximate as a linear function including the drain-source voltage $V_{DS}$ as expressed as the following formula (9).

$$I_{DS} \approx 2 \times K \times (V_{GS} - Vth) \times V_{DS} \qquad (9)$$

$V_{DS}$ in the formula (9) is a voltage applied between the both ends of the transistor and therefore is equal to Vd2 as shown in FIG. 46. On the other hand, since the source is electrically grounded, $V_{GS}$ is equal to $V_G$. Using the above relationship, the RH breakdown limit current at the point B' is assigned to $I_{DS}$ in the formula (9), which is solved for Vd2, Vd2 is given by the following formula (10).

$$Vd2 \approx I_{lim}/\{2 \times K(V_G - Vth)\} \qquad (10)$$

That is, VP2 which is a voltage applied to change the resistance variable element to the high-resistance state is approximately as expressed as the following formula (11).

$$VP2 = V3 + Vd2 \approx V3 + I_{lim}/\{2 \times K(V_G - Vth)\} \quad (11)$$

As should be appreciated, according to Experiment example 8, the condition used for changing the resistance variable element to the low-resistance state is determined so that the load resistance characteristic in the case where the resistance variable element changes to the high-resistance state and the load resistance characteristic in the case where the resistance variable element changes to the low-resistance state are balanced, in addition to the condition used for changing the resistance variable element to the high-resistance state which has been described in Embodiment 1. This significantly improves write endurance of the resistance variable element.

From the result of Experiment example 8, the following suitable range is derived for $V_G$, VP1 and VP2. To be specific, when VP1'=$\alpha$(V3+($I_{lim}$/K)) in FIG. 46, 0.82≦$\alpha$≦1.09 is preferable, 0.91≦$\alpha$≦1.05 is more preferable, and 0.95≦$\alpha$≦1.05 is most preferable. $V_G$ and VP1 are expressed as VG=|−VP1|=$\alpha$(V3+($I_{lim}$/K))+Vth. When VP2=$\beta$(V3+$I_{lim}$/{2×K (V_G−Vth)}, 0.9≦$\beta$≦1.1 is preferable, 0.9≦$\beta$≦1.05 is more preferable, and 0.95≦$\beta$≦1.05 is most preferable.

In accordance with the writing method of this embodiment, an optimal balance of the load resistance characteristic is determined by the gate voltage $V_G$ of the transistor and the voltage (|−VP1| or VP2) applied between the both ends of the memory cell (circuit in FIG. 47). By configuring the write circuit in which $V_G$, VP1 and VP2 are set so that the above $\alpha$ and the above $\beta$ fall within the above mentioned suitable range on the basis of the formula (8) and the formula (11), it is possible to provide a nonvolatile memory device which has high write endurance and high reliability.

The formula (8) and the formula (11) are approximation formulae and most fundamental deriving formulae. In many cases, the formula of $I_{DS}$ is varied due to a process adapted for miniaturization, special doping, etc. Therefore, not to mention, to calculate $V_G$, VP1 and VP2 more correctly, a circuit simulation such as SPICE based on the deriving method of the present invention may be used. Even if simulation values of the SPICE are different from the values in the formula (8) and the formula (11), the requirements of the present invention are met so long as the condition of the load resistance characteristic in FIG. 46 is consequently satisfied, which is also not to mention.

In Experiment example 8, the voltage was set to 3.6V which was sufficiently high, to prevent the set voltage of VP1 from being restricted by the gate voltage. Nonetheless, to reduce electric power consumption in the nonvolatile memory device, it is desirable to control the gate voltage to a necessary and least one. Using the above formula (8) and the above formula (11), the lowest and optimal gate voltage and the corresponding VP1 and VP2 can be calculated. A specific example of this will be described below. A transistor unique value K2 in the velocity saturation range and a threshold voltage were measured preliminarily, and a result was K2=176 (μA/V) and Vth=0.32V. Based on the RH characteristic of FIG. 44, V3=1.6V and $I_{lim}$=200 μA and these are assigned to the formula (8), which results in $V_G$≈V3+($I_{lim}$/K2+Vth=3.06V. Approximately 3V is an optimal gate voltage. In this case, it is sufficient that VP1 is not lower than 2.73V obtained by subtracting Vth from 3.06V. Nonetheless, to simplify a control circuit, $V_G$ and the voltage are preferably set to identical one.

When the transistor unique value K in the linear range was measured preliminarily, K=92 (μA/V). V3=1.6V, $V_G$=3V, Vth=0.32V and $I_{lim}$=200 μA are assigned to the formula 11, which results in VP2≈V3+$I_{lim}$/{2×K($V_G$−Vth)}=2.01V. Approximately 2V is an optimal VP2.

In a case where $V_G$ and VP1 are derived using the formula (8), a source electric potential of the transistor is higher than GND level of a body electric potential, because connection of the resistance variable element and the transistor is source follower. For this reason, a body effect is generated and Vth increases as compared to the case that the source is connected to GND. If this is corrected, a more correct value can be calculated. In the above example, the difference was about 0.1~0.2V and description thereof will be omitted.

Embodiment 4

In Embodiment 3, in the writing method in the 1T1R nonvolatile memory device, write endurance of the resistance variable element is significantly improved by balancing the load resistance characteristic R2 in the case where the resistance variable element changes to the high-resistance state and the load characteristic R1 in the case where the resistance variable element changes to the low-resistance state as shown in FIG. 46. However, the actual resistance value of the resistance variable element in the low-resistance state is determined by VP1 and the characteristic of the load resistor, as described in Embodiment 1 (a current amount of the load resistor at a voltage obtained by subtracting −V1 from −VP1 is a current flowing through a circuit in the state where the resistance variable element is in the low-resistance state, and the resistance value of the resistance variable element in the low-resistance state is determined by this current amount and the voltage −V1 applied to the resistance variable element). Therefore, in Embodiment 3, the resistance value of the resistance variable element in the low-resistance state is higher as $V_G$ and |−VP1| are smaller. If the resistance value of the resistance variable element is higher, a current flowing when writing data is lessened, and reduction of electric power consumption in the nonvolatile memory device is achieved. As shown in FIGS. 40 to 43, when the number of times of rewriting is less, the resistance values corresponding to the respective resistance states have normal levels. The nonvolatile memory device of Embodiment 4 is directed to reducing electric power consumption in the nonvolatile memory device while ensuring high write endurance.

Figure 48:
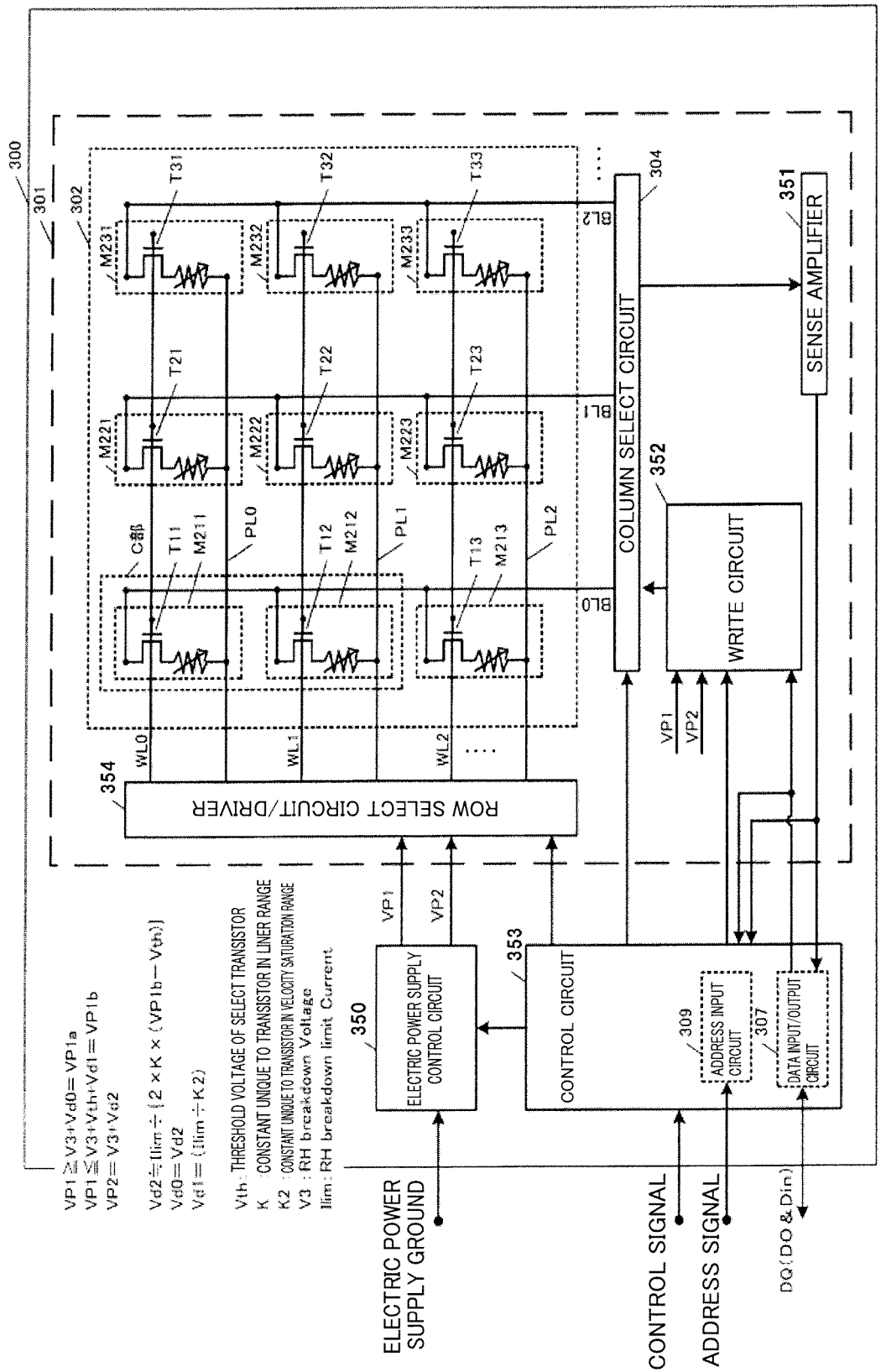
FIG. 48 is a block diagram showing an exemplary configuration of a nonvolatile memory device according to Embodiment 4 of the present invention.

FIG. 48 is a block diagram showing an exemplary schematic configuration of a nonvolatile memory device according to Embodiment 4 of the present invention. The same constituents as those in Embodiment 2 (FIG. 33) are designated by the same reference numerals and names and will not be described repetitively.

Referring to FIG. 48, an electric power supply control circuit 350 generates |−VP1| and VP2 from an electric power supply voltage fed thereto and outputs |−VP1| and VP2. A voltage value of |−VP1| is properly changed in accordance with a command from a control circuit 353. A sense amplifier 351 detects a resistance state of a memory cell, decodes information written in the memory cell, and outputs a digital value (hereinafter referred to as resistance level data) according to an actual resistance value of each memory cell. The control circuit 353 selects a specified memory cell from those in the memory array 302, according to information data, address signals and a control signal which have been received as inputs. According to a procedure in FIG. 35, a resistance variable element included in the specified memory cell is changed to the low-resistance state (information data 0 is written) or is changed to the high-resistance state (information data 1 is written). In this case, a row select circuit/driver 354 and a write circuit 352 are controlled to select |−VP1| as VP in FIG. 35 in the application state A (for attaining low-resistance state), while the row select circuit/driver 354 and the write circuit 352 are controlled to select VP2 as VP in FIG. 35 in the application state B (for attaining the high-resistance state). The control circuit 353 performs reading (verify reading) to confirm whether or not a written resistance level is normal and determines whether or not resistance level data output from the sense amplifier 351 falls within a predetermined range. If the resistance level data does not fall within the predetermined range, the control circuit 353 repeats a write operation with respect to a memory cell of the same address.

Figure 49:
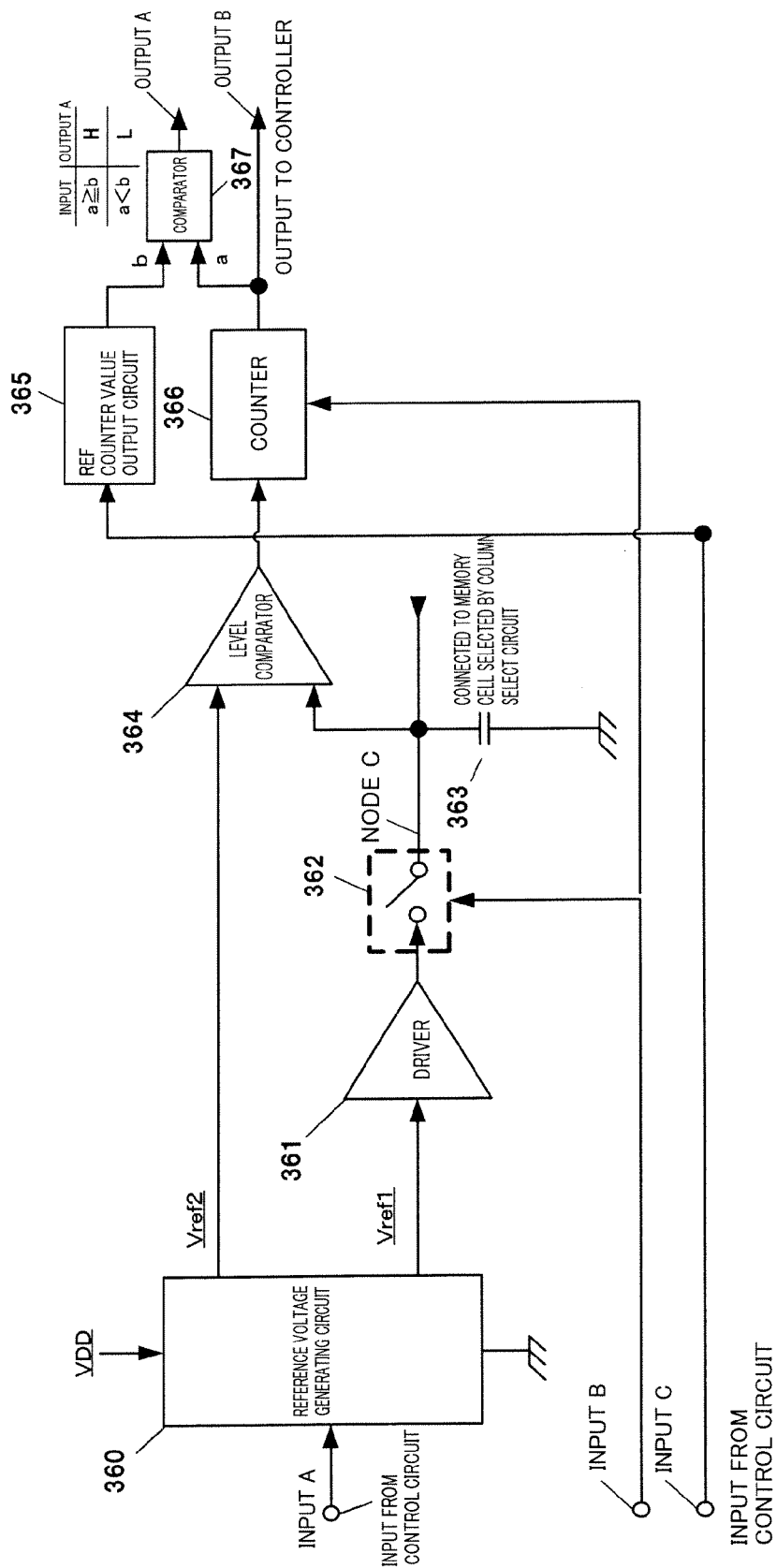
FIG. 49 is a block diagram showing an exemplary schematic configuration of a sense amplifier of the nonvolatile memory device according to Embodiment 4 of the present invention.
Figure 50:
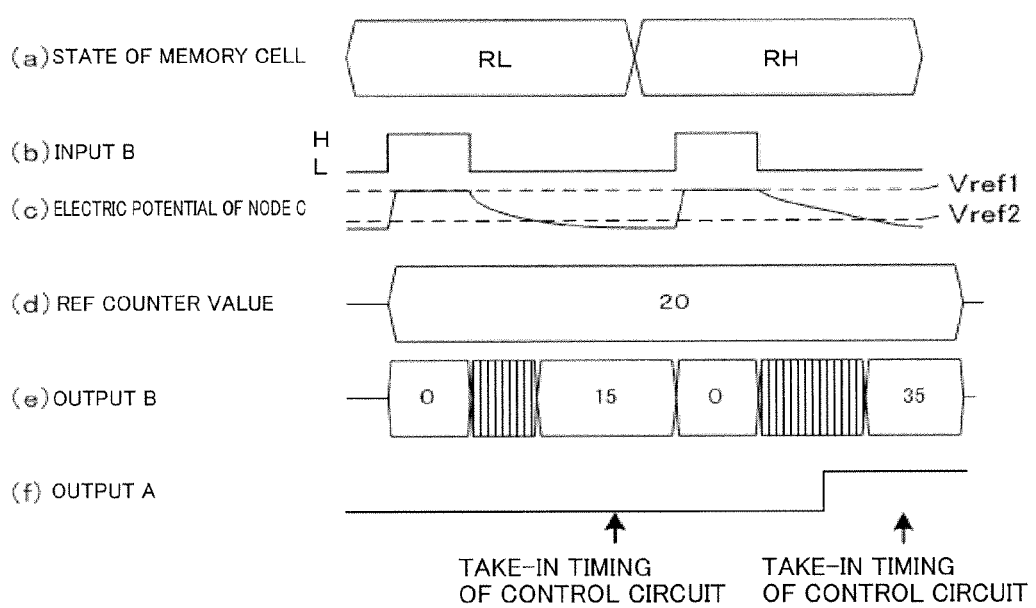
FIG. 50 is a timing chart showing an operation of the sense amplifier of the nonvolatile memory device according to Embodiment 4 of the present invention.

FIG. 49 is a block diagram showing an exemplary schematic configuration of a sense amplifier of the nonvolatile memory device according to Embodiment 4 of the present invention. FIG. 50 is a timing chart showing an operation of the sense amplifier of the nonvolatile memory device according to Embodiment 4 of the present invention. Hereinafter, an exemplary configuration and an exemplary operation of the sense amplifier 351 will be described with reference to FIGS. 49 and 50.

With reference to FIG. 49, a reference voltage generating circuit 360 creates a plurality of specified voltage levels using a ladder resistor or the like, based on an electric potential difference between the electric power supply voltage VDD and a ground level, in accordance with a command from the control circuit 353 input to the reference voltage generating circuit 360 through input A, selects one of the plurality of voltage levels by using a semiconductor switch, and outputs Vref1 and Vref2. Vref1 is larger than Vref2.

A switch control signal from the control circuit 353 is input to input B and input to a switch 362 and to a counter 366. The switch 362 is turned ON when the switch control signal is 'H' and turned OFF when the switch control signal is 'L.' When the switch control signal is 'H', a driver 361 outputs an electric potential of Vref1 to a node C (although input and output voltage values are actually somewhat different due to voltage drops of the transistors, wires and others constituting the driver 361 and other circuit, explanation will be given assuming that the voltage drops and the like are negligible, for the sake of simple explanation).

The node C is connected to a bit line of a selected memory cell through the column select circuit 304 shown in FIG. 48. As shown in FIG. 49, a capacitor 363 is connected in parallel with a memory cell between the node C and the ground. The capacitor may be implemented by a wiring capacitance, capacitances of transistor, etc, or may be provided separately.

When the switch control signal is 'H', an electric potential at the node C is Vref1. Thereafter, when the switch control signal switches to L', the switch 362 is turned OFF, and a portion of the node C which is connected to the switch 362 is placed in a high-impedance state, so that feeding of Vref is inhibited. Electric charge stored in the capacitor 363 is discharged by a time constant corresponding to a resistance value of a resistance variable element included in a memory cell connected to the capacitor 363, and the electric potential at the node C gradually decreases from Vref1. When the resistance value of the memory cell is low, the electric potential decreases quickly, while when the resistance value of the memory cell is high, the electric potential decreases slowly.

The above operation will be further described with reference to FIG. 50. As shown in FIG. 50(a), a resistance variable element included in a memory cell is in a low-resistance state in a former-half part and is in a high-resistance state in a latter-half part assuming that a time axis is set in a direction from left to right. In each state, the switching control signal of the input B changes to "H" at timing shown in FIG. 50(b). As shown in FIG. 50(c), during a period when the input B is 'H', Vref1 is applied to the node C. When the input B switches from 'H' to the switch 362 is turned OFF, and the node C becomes HiZ, so that the capacitor 363 gradually discharges. When the resistance variable element included in the memory cell is in the low-resistance state, the discharging progresses quickly, while when the resistance variable element included in the memory cell is in the high-resistance state, the discharging progresses slowly. For this reason, a time that lapses until Vref2 reaches a value smaller than a threshold is shorter in the low-resistance state than in the high-resistance state.

A level comparator 364 in FIG. 49 compares the electric potential at the node C to Vref2 received from the reference voltage generating circuit 360. The level comparator 364 outputs if the electric potential at the node C is higher than Vref, and outputs 'H' if the electric potential at the node C is lower than Vref. In other words, a timing at which the output of the level comparator 364 switches from to 'H' after the switching control signal has switched from 'H' to is earlier if the resistance variable element included in the memory cell is in the low-resistance state and is slower if the resistance variable element included in the memory cell is in the high-resistance state.

The counter 366 is reset to zero during a period while the switch control signal input through the input B is 'H'. When the switching control signal is and the input from the level comparator 364 is 'L', the counter 366 is counted up according to a cycle of a clock (not shown) input to the counter 366 until the input from the level comparator 364 to the counter 366 becomes 'H'. Not to mention, the counter 366 is designed so that a counted value does not exceed a predetermined upper limit value and overflow.

FIG. 50(e) shows the operation of the counter 366. As shown in FIG. 50(e), the counter 366 starts counting up just after the input B has changed to and finishes counting up when the electric potential at the node C becomes below Vref2. Counted values after the counter 366 finishes counting up are fixed to 15 in the case of the low-resistance state (RL) and fixed to 35 in the case of the high-resistance state (RH).

A Ref counter value output circuit 365 outputs a value (Ref counter value) which is a threshold used to determine whether the resistance variable element included in the memory cell is in the high-resistance state or in the low-resistance state in accordance with the control of the control circuit 353. The comparator 367 compares a counter value a output from the counter 366 to a Ref counter value b output from the Ref counter value output circuit 365. If a≧b, the comparator 367 determines that the resistance variable element is in the high-resistance state and outputs 'H' to the output A. On the other hand, if a<b, the comparator 367 determines that the resistance variable element is in the low-resistance state and outputs to the output A.

In the example of FIG. 50, the ref counter value b is 20. Therefore, the output to output A at a data take-in timing of the control circuit 351 is (indicating that 15 which is the counter value is smaller than 20 which is the ref counter value) when the resistance variable element is in the low-resistance state, while the output is 'H' (indicating that 35 which is the counter value is more than 20 which is the ref counter value) when the resistance variable element is in the high-resistance state.

Not to mention, specific values of the Ref counter value and the counter values are not limited to the above mentioned values but may be varied due to a count clock frequency of the counter 366, a capacitance of the capacitor 363, the set value of Vref1 or Vref2, the resistance values of the resistance variable elements, its variation, etc.

As described above, the sense amplifier 351 can properly read the resistance state of a resistance variable element included in the memory cell which is a read target by utilizing the fact that discharge time of the capacitor is different according to the resistance value of the resistance variable element. That is, the sense amplifier 351 outputs to the output A a binary digital logic value corresponding to a resistance state and to the output B the counter value increasing or decreasing little by little according to the resistance value of the resistance variable element.

The value of the output value B is input to the control circuit and used to perform data verification and rewriting. In this embodiment, the data verification and rewriting is performed to achieve reduction of electric power consumption and write endurance. Hereinafter, the data verification and rewriting will be described.

In general, when binary digital data stored in a memory cell is decoded, it is determined whether or not a physical amount (voltage or the like) detected by a sense amplifier is larger than a predetermined threshold. The sense amplifier illustrated in FIG. 49 determines whether data stored in a memory cell is 1 or 0 based on whether or not a specified time (counter value of the counter 366) taken for the capacitor to perform discharging via the memory cell after a voltage is applied to the memory cell is larger than 20 which is the threshold (ref counter value), as described above.

The data verification and rewriting is to control a resistance value to be written to ensure desired data detection allowance in such a manner that, for example, it is checked whether or not a counter value falls outside a range of threshold values and additional specified margin and a write operation is performed again if the counter value falls within the range.

Figure 51:
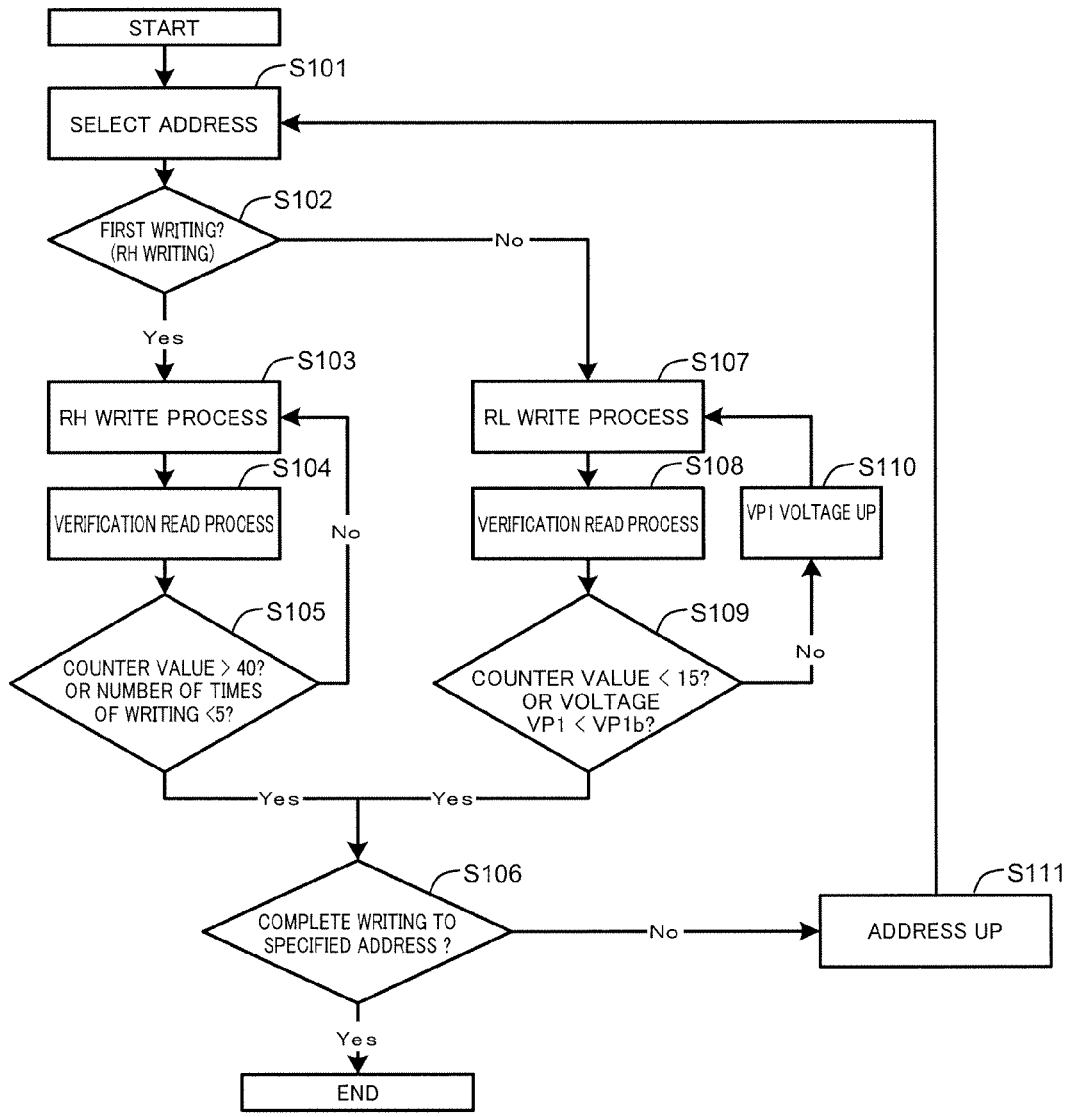
FIG. 51 is a flowchart showing exemplary data verification and rewriting according to Embodiment 4 of the present invention.

FIG. 51 is a flowchart showing exemplary data verification and rewriting according to Embodiment 4 of the present invention. Referring to FIG. 51, when data verification and rewriting starts (START), a memory cell of a first address in an address space to which data is to be written is selected (step S101). A specific selecting method may be similar to that of Embodiment 2.

Thereafter, it is determined whether data "1" or data "0" is to be written (step S102). If it is determined that data "1" is written, a write voltage for attaining a high-resistance state is applied (RH write process) (step S103), while if it is determined that data "0" is written, a write voltage for attaining a low-resistance state is applied (RL write process is executed) (step S107).

After that, the sense amplifier 351 is connected to a selected memory cell, and a read operation (verify read process) is executed to determine whether or not data verification and rewriting is necessary (steps S103, S108).

A counter value corresponding to a resistance value of a memory cell is taken into the control circuit 353, and a write operation is repeated until the counter value reaches 40 or more in RH write process (step S105), or until the counter value reaches 15 or less in RL write process (step 109).

In the RL write process, a voltage of an absolute value of VP1 in first RL write process is such that a voltage equal to VP2 derived from formula (11) is a lower limit value (=VP1$a$), and the absolute value of VP1 is increased up to an upper limit voltage (=VP1$b$) equal to $V_G$ derived from formula (8) with a predetermined step width every time the RL write process is performed again (step S110).

In the RH write process, the write operation could continue endlessly if a memory cell operates incorrectly, and therefore the upper limit of the number of times of data verification and rewriting may be set to, for example, five times (step S105, S109).

If the counted value satisfies the condition (Yes in step S105 and in step S109), it is determined whether or not writing has been completed for all of the addresses to which the write operation is to be performed (step S106). If it is determined that writing has not been completed and there are addresses to which the write operation is to be performed, a write process to a next address is performed (step S111~step S101). If it is determined that writing has been completed, then data verification and rewriting ends (END).

In accordance with the above described data verification and rewriting, it is ensured that the counter value falls outside a range of threshold values and additional specified margin (40 or more in the RH write process and 15 or less in RL write process).

Experiment Example 9

Figure 52:
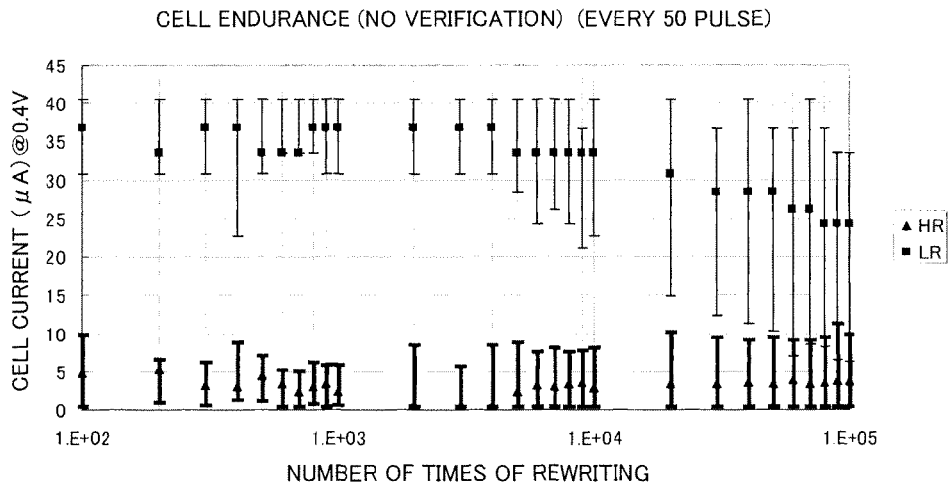
FIG. 52 is a view showing a relationship between the number of times of rewriting and a cell current in a case where a high-resistance state and a low-resistance state are attained 100000 times in repetition, without performing data verification and rewriting, in Experiment example 9.

FIG. 52 is a view showing a relationship between the number of times of rewriting and a cell current in a case where a high-resistance state and a low-resistance state were attained 100000 times repetitively without performing data verification and rewriting in Experiment example 9. A device configuration similar to that of Embodiment 2 shown in FIG. 33 was used. An optimal voltage 2V of VP2 as derived in Embodiment 3 was used, and the voltages in rewriting were $VP=V_G=VP2=|-VP1|=2V$. One rewriting in "the number of times of rewriting" refers to an operation in which the RH write process is performed once and the RL write process is performed once (operation consisting of two write processes).

As shown in FIG. 52, after rewriting was performed 100000 times, a difference in a cell current between a case where the resistance variable element is in a low-resistance state and a case where the resistance variable element is in a high-resistance state is lessened in terms of average value, and a minimum value of the current in the case where the resistance variable element is in the low-resistance state is smaller than a maximum value of the current in the case where the resistance variable element is in the high-resistance state. Such a phenomenon makes it difficult to distinguish between the low-resistance state and the high-resistance state. This happens because of the fact that VP2 is an optimal voltage but VP1 is not an optimal voltage as described in Embodiment 3.

Figure 53:
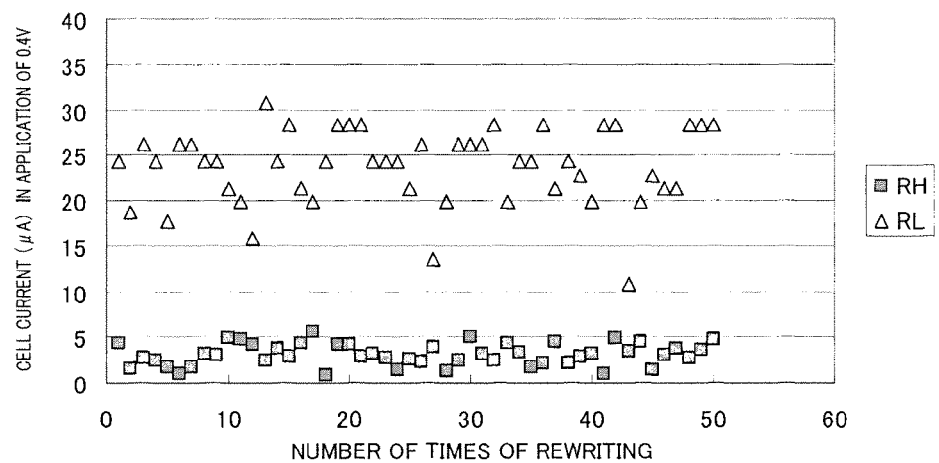
FIG. 53 is a view showing a result of rewriting performed with respect to memory cells after rewriting is repeated 100000 times with respect to the memory cells as shown in FIG. 52, without performing the data verification and rewriting with respect to memory cells, in Experiment example 9.
Figure 54:
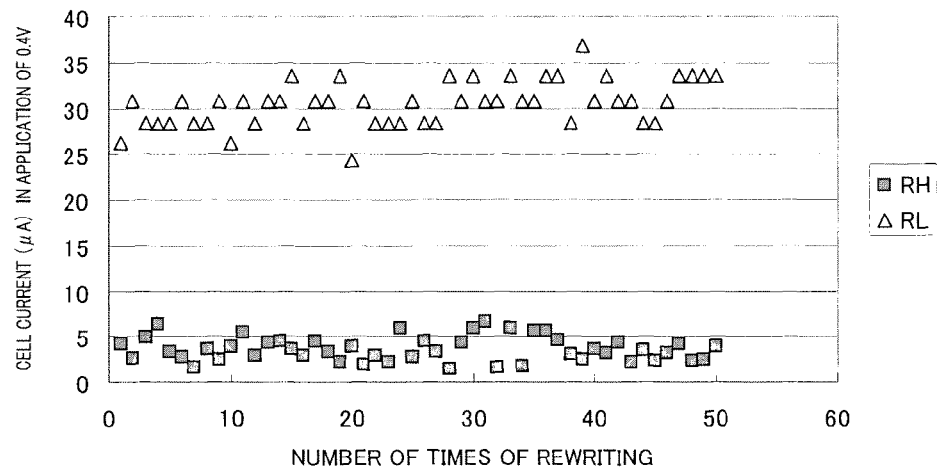
FIG. 54 is a view showing a result of rewriting performed with respect to the memory cells after the experiment of FIG. 53 is conducted with respect to the memory cells, while performing data verification and rewriting with respect to the memory cells, in Experiment example 9.

FIG. 53 is a view showing a result of rewriting performed with respect to the memory cells after rewriting repeated with respect to the memory cells 100000 times as shown in FIG. 52, without performing data verification and rewriting, in Experiment example 9. FIG. 54 is a view showing a result of rewriting performed with respect to the memory cells for which the experiment in FIG. 53 was conducted, while performing the data verification and rewriting, in Experiment example 9. In the experiment of FIG. 54, a device configuration similar to that of FIG. 48 was used and data verification and rewriting was performed according to a flow of FIG. 51. In this case, VP1$a$ which was the lower limit voltage of VP1 and VP1$b$ which was the upper limit voltage of VP1 were 2V and 3V, respectively, as calculated in Embodiment 3. In data verification and rewriting of FIG. 54, an absolute value of a write voltage and a gate voltage in the RL write process were set to 2V in first RL write process (VP1$a$), 2.4V in second RL write process, 2.6V in third RL write process, 2.8V in fourth RL write process, and 3.0V in fifth RL write process (VP1$b$). A write voltage VP2 in the RH write process was set to 2V.

The number of times of verification and rewriting was 5 at maximum in both of the RL write process and the RH write process.

Although the gate voltage in the RH write process was fixed as 3.0V which was equal to VP1b, the gate voltage may be increased like 2V, 2.4V, 2.6V, 2.8V and 3.0V by utilizing a variable voltage level of VP1 according to the number of times of data verification and rewriting if the configuration circuit of this embodiment is used. Such a process restricts a current from flowing unnecessarily during a transient period when the resistance variable element is changing from RL to RH. This achieves further reduction of electric power consumption.

As shown in FIG. 53, in a case where data verification and rewriting was not performed, a case where a cell current corresponding to the low-resistance state was low (resistance value of the resistance variable element in the low-resistance state is higher than a desired one) frequently occurred. On the other hand, as shown in FIG. 54, in a case where data verification and rewriting was performed, a case where a cell current corresponding to the low-resistance state was low did not occur, and there was a sufficient difference (window) between the cell current corresponding to the low-resistance state and the cell current corresponding to the high-resistance state. From this, it was found out that by performing data verification and rewriting, data writing with high reliability can be implemented even if the number of times of repeated writing increases.

In accordance with data verification and rewriting using the sense amplifier of this embodiment, the write voltage in the RL write process is controlled to a minimum amount during a period in which the number of times of writing is less, and the write voltage can be set higher only for memory cells to which the write process has been performed many times. This makes it possible to drive the nonvolatile memory device by an optimal balance given by the formula (8) and the formula (11). By using the writing control of this embodiment, write endurance can be improved while minimizing electric power consumption, and it is possible to provide a nonvolatile memory device which can achieve low electric power consumption and high reliability.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory device of the present invention is useful as a nonvolatile memory device which can significantly increase a resistance changing magnitude, improve stability and reliability of a resistance changing operation while maintaining a resistance value corresponding to a high-resistance state at a large value, and significantly improve a data detection allowance to increase a yield and a design margin of the device and reduce a product cost, in a nonvolatile memory device having a memory cell array including a plurality of resistance variable elements which change their resistance states among a plurality of resistance states using electric pulses with different polarities. A method of writing data to the nonvolatile memory device of the present invention is useful as a method of writing data to a nonvolatile memory device which can improve stability and reliability of an operation in a method of writing data to the nonvolatile memory device having a memory cell array including a plurality of resistance variable elements which change their resistance states among the plurality of resistance states using electric pulses with different polarities.

REFERENCE CITATION LISTS 100 nonvolatile memory device
102 electric pulse application device
104 gate voltage switch
110 transistor
112 control terminal
114 first main terminal
116 second main terminal
120 resistance variable element
122 substrate
124 lower electrode
126 resistance variable layer
128 upper electrode
130 series path
210 load resistor circuit
211 diode
212 first main terminal
214 second main terminal
216 control terminal
218 transistor
220 resistance variable element
221 substrate
222 oxide layer
223 first electrode layer
224 first tantalum-containing layer
225 second tantalum-containing layer
226 resistance variable layer
227 second electrode layer
300 nonvolatile memory device
301 memory main section
302 memory array
303 row-select circuit/driver
304 column select circuit
305 write circuit
306 sense amplifier
307 data input/output circuit
308 cell plate electric power supply (VCP electric power supply)
309 address input circuit
310 control circuit
BL bit line
$I_{lim}$ first current value
PL plate line
M memory cell
V1 first voltage
V2 second voltage
V3 third voltage
VP1 first application voltage
VP2 second application voltage
VP3 third application voltage
WL word line
RH first resistance state
RL second resistance state

The invention claimed is:

1. A nonvolatile memory device comprising:
a series path including a resistance variable element and a load resistor connected in series with the resistance variable element; and
an electric pulse application device configured to selectively apply to the series path either an electric pulse of a first application voltage with a first polarity or an electric pulse of a second application voltage with a second polarity which is different from the first polarity;

the resistance variable element including:
a first electrode;
a second electrode; and
a resistance variable layer provided between the first electrode and the second electrode;

the resistance variable layer having a characteristic in which:

when a voltage generated between the first electrode and the second electrode is an interelectrode voltage and a current flowing between the first electrode and the second electrode is an interelectrode current, the resistance variable layer changes from a first resistance state to a second resistance state in which a resistance value of the resistance variable layer is lower than a resistance value of the resistance variable layer in the first resistance state, in response to the electric pulse of the first application voltage which is applied from the electric pulse application device to the series path;

the resistance variable layer changes from the second resistance state to the first resistance state, in response to the electric pulse of the second application voltage which is applied from the electric pulse application device to the series path;

the resistance variable layer generates the interelectrode voltage with the first polarity based on the first application voltage which is applied from the electric pulse application device to the series path;

the resistance variable layer generates the interelectrode voltage with the second polarity based on the second application voltage which is applied from the electric pulse application device to the series path;

the resistance variable layer changes from the first resistance state to the second resistance state in such a manner that its resistance value stops decreasing when the interelectrode voltage decreases in absolute value and reaches a first voltage according to a resistance ratio relationship between the series path and the resistance variable element;

the resistance variable layer changes from the second resistance state to the first resistance state in such a manner that:

its resistance value starts increasing when the interelectrode voltage reaches a second voltage which is equal in absolute value to the first voltage and is different in polarity from the first voltage; and the resistance variable layer flows the interelectrode current such that the interelectrode voltage is maintained at a third voltage when the interelectrode voltage increases in absolute value and reaches the third voltage according to the resistance ratio relationship between the series path and the resistance variable element, the third voltage being higher in absolute value than the second voltage and being identical in polarity to the second voltage;

the load resistor having a characteristic in which:

when the interelectrode current in a state in which the resistance variable layer is in the second resistance state and the interelectrode voltage is equal to the first voltage is I1, and when the electric pulse application device outputs the electric pulse of the second application voltage, a current flowing by applying to the load resistor a voltage obtained by subtracting the second voltage from the second application voltage, is not lower in absolute value than the absolute value of I1, and a current flowing by applying to the load resistor a voltage obtained by subtracting the third voltage from the second application voltage, is not higher in absolute value than a predetermined threshold.

2. The nonvolatile memory device according to claim 1, wherein the predetermined threshold is an absolute value of I1.

3. The nonvolatile memory device according to claim 2, further comprising:
a load resistance switch configured to switch a characteristic of the load resistor between a case where the electric pulse application device outputs the electric pulse of the first application voltage and a case where the electric pulse application device outputs the electric pulse of the second application voltage.

4. The nonvolatile memory device according to claim 3, wherein the load resistor is a transistor including two main terminals and one control terminal; and
wherein the load resistance switch is configured to switch a voltage applied to the control terminal to switch the characteristic of the load resistor.

5. The nonvolatile memory device according to claim 4, comprising:
a plurality of first wires formed to extend in parallel with each other in a first direction within a first plane;
a plurality of second wires formed to extend in parallel with each other in a second direction within a second plane parallel to the first plane and three-dimensionally cross the first wires, respectively; and
memory cells provided to respectively correspond to three-dimensional cross-points of the first wires and the second wires;
each of the memory cells includes the series path;
each of the first wires is connected to the control terminal of the transistor included in associated one of the memory cells; and
each of the second wires is connected to one end of the series path included in associated one of the memory cells.

6. The nonvolatile memory device according to claim 1, wherein the load resistor includes a transistor and a diode which are connected in parallel.

7. The nonvolatile memory device according to claim 1, wherein the resistance variable layer is a resistance variable element including at least a layered structure in which a first tantalum-containing layer having a composition expressed as $TaO_x$ ($0<x<2.5$) and a second tantalum-containing layer having a composition expressed as $TaO_y$ ($x<y<2.5$) are stacked together.

8. The nonvolatile memory device according to claim 7, wherein the $TaO_x$ satisfies $0.8 \leq x \leq 1.9$.

9. The nonvolatile memory device according to claim 7, wherein the $TaO_y$ satisfies $2.1 \leq y < 2.5$.

10. The nonvolatile memory device according to claim 7, wherein the second tantalum-containing layer has a thickness which is not less than 1 nm and not more than 8 nm.

11. A method of writing data to a nonvolatile memory device including:
a series path including a resistance variable element and a load resistor connected in series with the resistance variable element;
the resistance variable element including:
a first electrode;
a second electrode; and a resistance variable layer provided between the first electrode and the second electrode;

the resistance variable layer having a characteristic in which:

when a voltage generated between the first electrode and the second electrode is an interelectrode voltage and a current flowing between the first electrode and the second electrode is an interelectrode current, the resistance variable layer changes from a first resistance state to a second resistance state in which a resistance value of the resistance variable layer is lower than a resistance value of the resistance variable layer in the first resistance state, in response to an electric pulse of a first application voltage with a first polarity which is applied to the series path;

the resistance variable layer changes from the second resistance state to the first resistance state, in response to an electric pulse of a second application voltage with a second polarity different from the polarity of the first application voltage, the second application voltage being applied to the series path;

the resistance variable layer generates the interelectrode voltage with the first polarity based on the first application voltage which is applied to the series path;

the resistance variable layer generates the interelectrode voltage with the second polarity based on the second application voltage which is applied to the series path;

the resistance variable layer changes from the first resistance state to the second resistance state in such a manner that its resistance value stops decreasing when the interelectrode voltage decreases in absolute value and reaches a first voltage according to a resistance ratio relationship between the series path and the resistance variable element;

the resistance variable layer changes from the second resistance state to the first resistance state in such a manner that:

its resistance value starts increasing when the interelectrode voltage reaches a second voltage which is equal in absolute value to the first voltage and is different in polarity from the first voltage; and the resistance variable layer flows the interelectrode current such that the interelectrode voltage is maintained at a third voltage when the interelectrode voltage increases in absolute value and reaches the third voltage according to the resistance ratio relationship between the series path and the resistance variable element, the third voltage being higher in absolute value than the second voltage and being identical in polarity to the second voltage;

the method comprising:

when the interelectrode current in a state in which the resistance variable layer is in the second resistance state and the interelectrode voltage is equal to the first voltage is $I1$, and controlling a characteristic of the load resistor such that, when the electric pulse of the second application voltage is fed to the series path, a current flowing by applying to the load resistor a voltage obtained by subtracting the second voltage from the second application voltage, is not lower in absolute value than the absolute value of $I1$, and a current flowing by applying to the load resistor a voltage obtained by subtracting the third voltage from the second application voltage, is not higher in absolute value than a predetermined threshold.

* * * * *